United States Patent
Howe et al.

(10) Patent No.: US 12,120,956 B2
(45) Date of Patent: Oct. 15, 2024

(54) ION-ENHANCED THERMOELECTRIC GENERATOR

(71) Applicant: HOWE INDUSTRIES LLC, Scottsdale, AZ (US)

(72) Inventors: Troy Michael Howe, Tempe, AZ (US); Steven Daniel Howe, Mesa, AZ (US)

(73) Assignee: HOWE INDUSTRIES LLC, Scottsdale, AZ (US)

( * ) Notice: Subject to any disclaimer, the term of this patent is extended or adjusted under 35 U.S.C. 154(b) by 0 days.

(21) Appl. No.: 18/483,085

(22) Filed: Oct. 9, 2023

(65) Prior Publication Data

US 2024/0049599 A1 Feb. 8, 2024

Related U.S. Application Data

(63) Continuation of application No. 17/198,040, filed on Mar. 10, 2021, now Pat. No. 11,793,076.

(60) Provisional application No. 63/150,525, filed on Feb. 17, 2021, provisional application No. 63/076,187, filed on Sep. 9, 2020.

(51) Int. Cl.
*H10N 10/13* (2023.01)
*H10N 10/17* (2023.01)
*H10N 10/855* (2023.01)

(52) U.S. Cl.
CPC ............ *H10N 10/13* (2023.02); *H10N 10/17* (2023.02); *H10N 10/855* (2023.02)

(58) Field of Classification Search
CPC ....... H10N 10/13; H10N 10/17; H10N 10/855
See application file for complete search history.

(56) References Cited

U.S. PATENT DOCUMENTS

| | | | |
|---|---|---|---|
| 3,244,914 | A | 4/1966 | Forman |
| 3,738,873 | A | 6/1973 | Cathey |
| 2010/0206349 | A1 | 8/2010 | Lee et al. |
| 2011/0056531 | A1 | 3/2011 | Meisner et al. |
| 2016/0315243 | A1 | 10/2016 | Wu et al. |

*Primary Examiner* — Lindsey A Buck
(74) *Attorney, Agent, or Firm* — PIERSON FERDINAND LLP; Keats Quinalty

(57) ABSTRACT

A thermoelectric converter including a thermoelectric generator and a radiation source. The thermoelectric generator includes a hot source, a cold source, n-type material, and p-type material. The radiation source emits ionizing radiation that increases electrical conductivity. Also detailed is a method of using radiation to reach high efficiency with a thermoelectric converter that includes providing a thermoelectric generator and a radiation source, with the thermoelectric generator including a hot source, a cold source, n-type material, and p-type material, and emitting ionizing radiation with the radiation source to increase the electrical conductivity which strips electrons in the n-type material, the p-type material, or both the n-type material and p-type material from their nuclei with the electrons then free to move within the material.

6 Claims, 38 Drawing Sheets

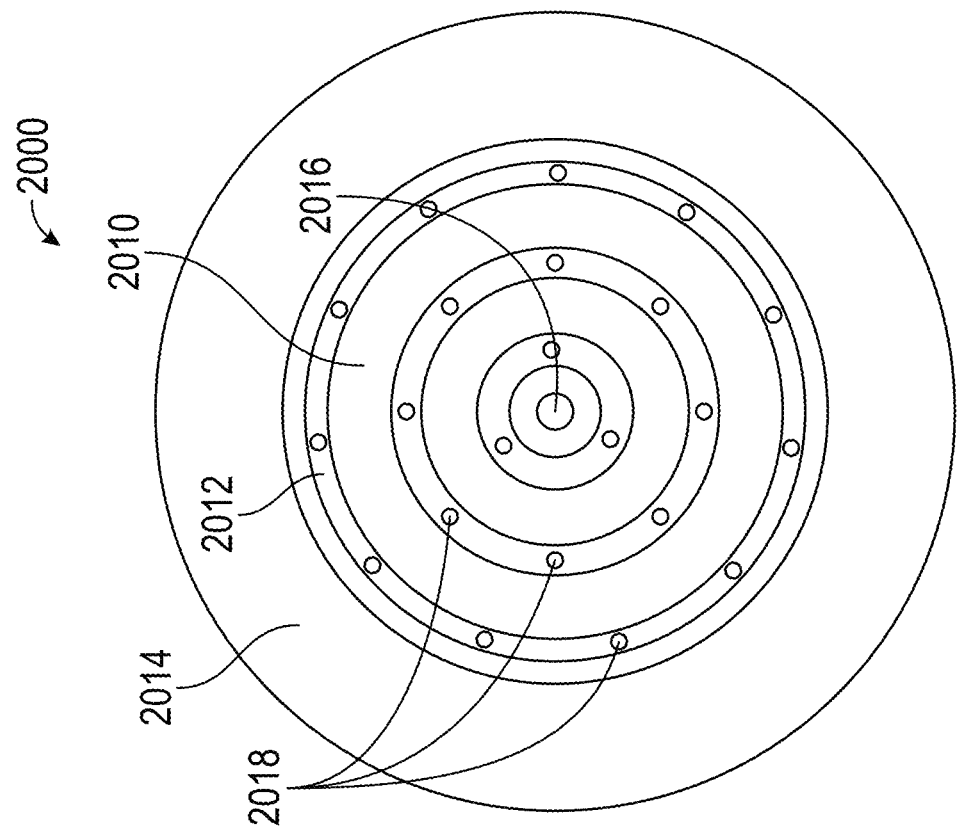
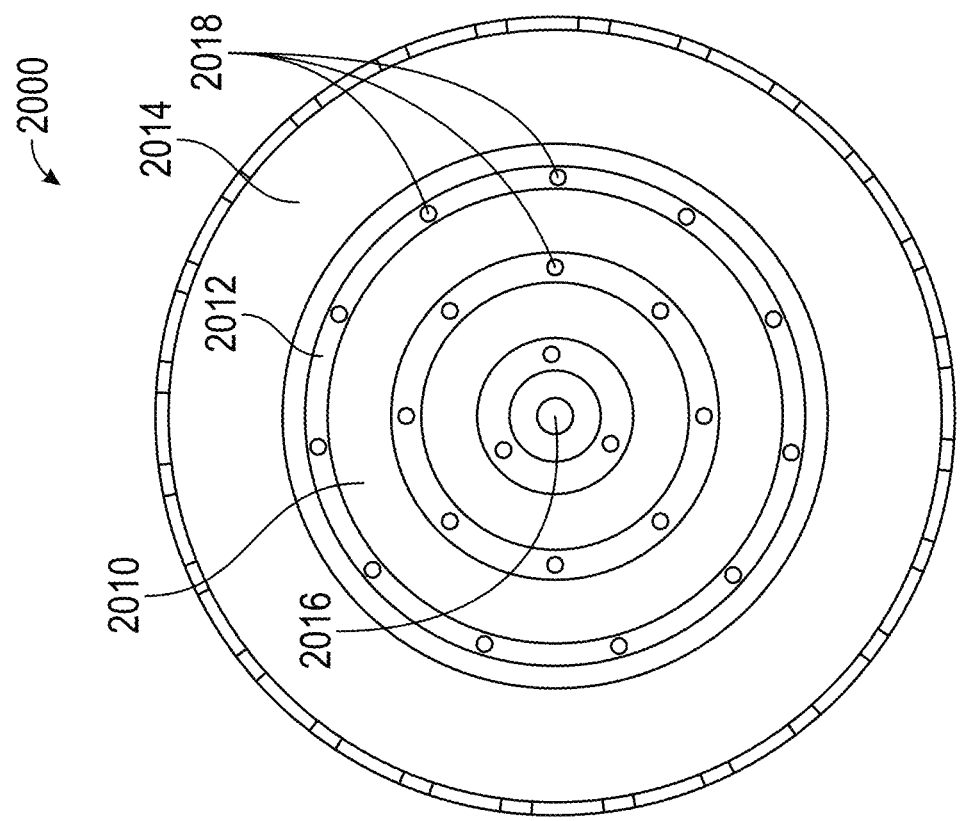
FIG. 20B

ION-ENHANCED THERMOELECTRIC GENERATOR

CROSS-REFERENCE TO RELATED APPLICATIONS

The present application is a continuation of U.S. patent application Ser. No. 17/198,040, filed Mar. 10, 2021, which claims the benefit of priority to U.S. Provisional Application No. 63/076,187, filed Sep. 9, 2020, and to U.S. Provisional Application No. 63/150,525, filed Feb. 17, 2021, each of which is incorporated herein by reference in their entirety.

GOVERNMENT STATEMENT

The present application was made by an agency of the United States Government or under a contract with an agency of the United States Government. The name of the U.S. Government agency and Government contact number are: NASA (Shared Services Center, NSSC), Contact No. 80NSSC19K0962.

TECHNICAL FIELD

The present disclosure relates generally to electric generation and specifically to systems and methods of augmented thermoelectric generation.

BACKGROUND

Thermoelectric generators may be useful for applications requiring no moving parts or particularly long lifetimes. NASA's multi-mission radioisotope thermoelectric generator (MMRTG) and their enhanced MMRTG (eMMRTG) have efficiency levels between 5.5%-7.4% at the beginning of their life. A dynamic cycle may achieve efficiencies approaching 20-25% but rely on working fluids and moving machinery. While increasing the temperature gradient would also increase efficiency, this option is limited in its ability to change the efficiency due to limitations of materials and heat rejection systems. Although thermoelectric generation has been used for space exploration, waste heat conversion, and instrument cooling, the low conversation efficiency prevents more widespread applications.

SUMMARY

Aspects and applications presented herein are described below in the drawings and detailed description of the exemplary embodiments shown. Unless specifically noted, it is intended that the words and phrases in the specification and the claims be given their plain, ordinary, and accustomed meaning to those of ordinary skill in the applicable arts.

In the following description, and for the purposes of explanation, numerous specific details are set forth in order to provide a thorough understanding of the various aspects of the exemplary embodiments shown. It may be understood, however, by those skilled in the relevant arts, that the presented exemplary embodiments may be practiced without these specific details. In other instances, known structures and devices are shown or discussed more generally in order to avoid obscuring the exemplary embodiments shown. In many cases, a description of the operation is sufficient to enable one to implement the various forms of the exemplary embodiments shown, particularly when the operation is to be implemented in software. It should be noted that there are many different and alternative configurations, devices and technologies to which the disclosed exemplary embodiments shown may be applied. The full scope of the exemplary embodiments shown are not limited to the examples that are described below.

BRIEF DESCRIPTION OF THE DRAWINGS

FIG. 20B illustrates layout of SPEAR reactor.

DETAILED DESCRIPTION

In one aspect, the embodiments detailed herewithin, apply to any thermoelectric converter or Peltier cooler which utilizes ionizing radiation to increase performance. The exemplary devices as described herein can be made of any material that allows them to function as power conversion systems, and may include a variety of different radiation sources.

Figure 1:
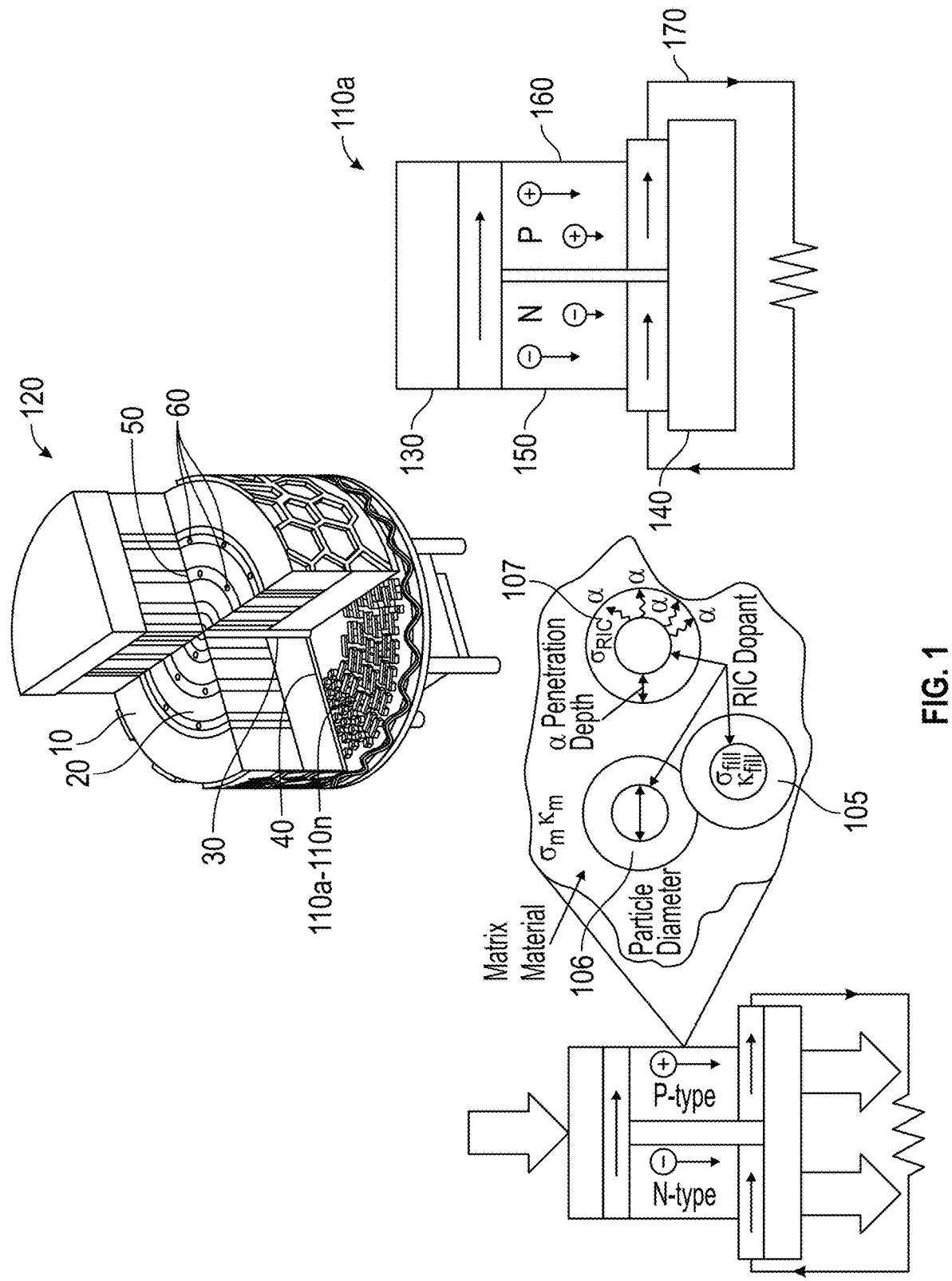
FIG. 1 shows a system with augmented thermoelectric generators coupled with a radiation source.

FIG. 1 illustrates system 100 comprising augmented thermoelectric generators (ATEGs) 110a-110n coupled with radiation source 120, in accordance with a first embodiment.

ATEGs 110a-110n comprise hot side 130, cold side 140, n-type material 150, and p-type material 160. In one aspect, radiation source 120 emits ionizing radiation (e.g. alpha, beta, gamma, or neutrons), which increases the electrical conductivity (including, e.g., n-type material 150 and p-type material 160) as particle interactions strip electrons in the material from their nuclei, and the affected electrons are free to move within the material. Additionally, FIG. 1 shows a beryllium reflector lithium hydride moderator material 20, boron carbide control rod 30, heat pipe contact area 40, uranium fuel 50, heat pipe locations 60 (shown as holes in FIG. 1), and Ion Enhanced Thermoelectric Generator array 110a-110n.

Thermoelectric conversion may be used for space exploration, waste heat conversion, and a method to cool instruments. The advanced thermoelectric generator (ATEG) increases current thermoelectric generator (TEG) efficiencies by two to three times. As described in further detail herewithin, ATEGs may be used to produce power for deep space probes without the need for large solar panels or costly radioisotope thermoelectric generator (RTG) power sources. Additionally, or optionally, exemplary embodiments further detail mobile power generators coupling ATEGs to neutron power sources.

TEGs function by utilizing the Seebeck effect to change the distribution of electrons within a material due to a heat source applied at one end. This heat source pushes electrons away and towards the cold side, where they build up and create a voltage. By using two different materials in parallel, two different voltages can be achieved, and the difference between these voltages forms a potential that can be used to create an electric circuit, and thus electric power. In addition, if the electrical power is applied to leads of ATEGs 110a-110n, a temperature differential is formed on the plates, and the exemplary device can instead provide cooling. This arrangement creates a type of cooler, called a "Peltier cooler", which can also benefit from the augmentation disclosed in exemplary embodiments detailed herein.

Figure 2:
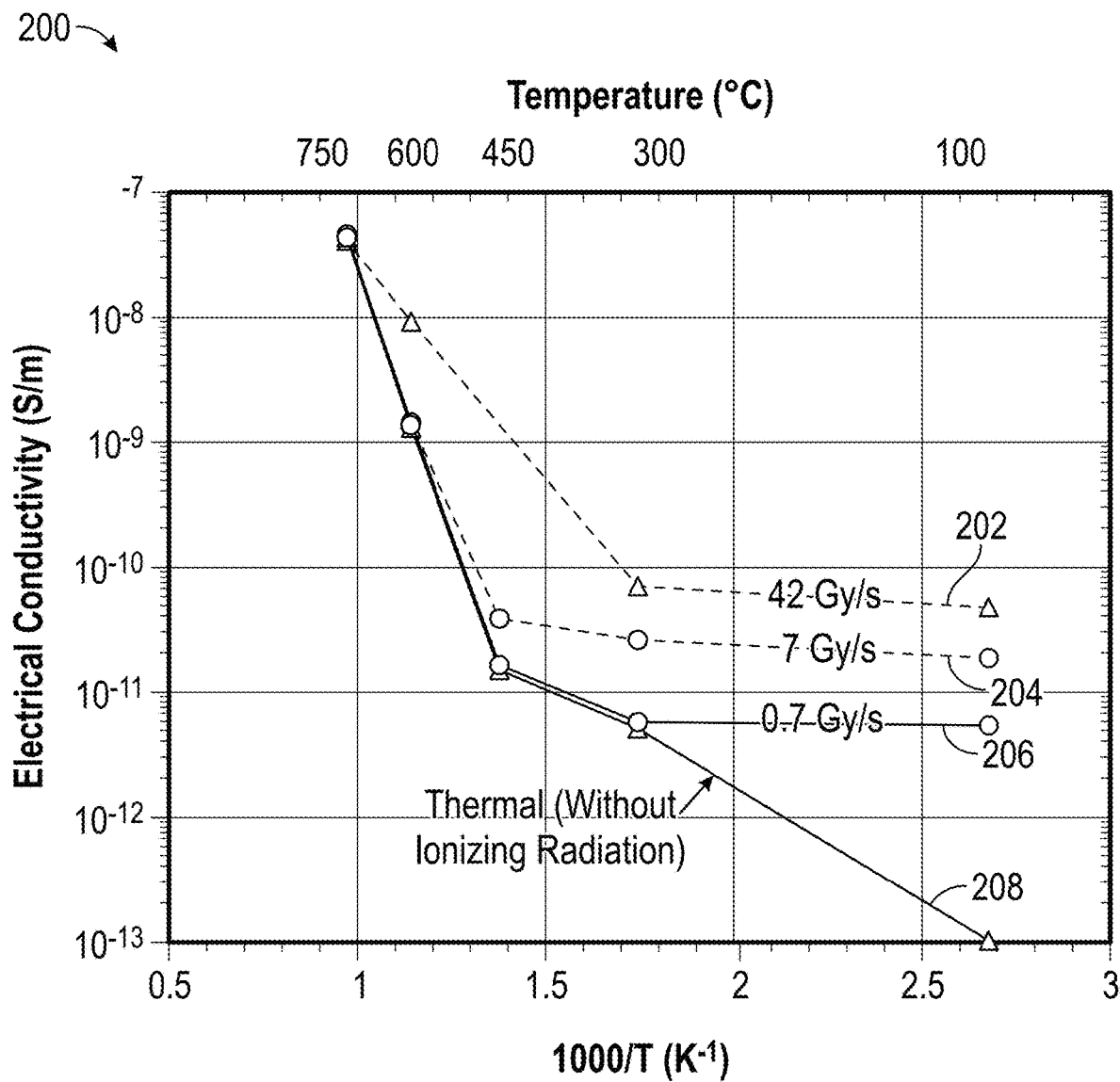
FIG. 2 illustrates a chart showing effects of radiation on electrical conductivity.

FIG. 2 illustrates chart 200 showing effects of radiation on electrical conductivity, according to measurements of the conductivity change in materials exposed to radiation fields in a study by Oak Ridge National Laboratory (additional details available at Shikama, T., et. al. "Electrical properties of ceramics during reactor irradiation," Journal of Nuclear Materials 258-263 (1998), https://www.sciencedirect.com/science/article/abs/pii/S0022311598003006). FIG. 2 shows electrical conductivity components in fine-grained 99.99% purity alumina cable ("CR125"). In FIG. 2, electrical conductivity values as a function of temperature for the sample when irradiated with a dose of 42 Gy/s is shown at 202, electrical conductivity values as a function of temperature for the sample when irradiated with a dose of 7 Gy/s is shown at 204, electrical conductivity values as a function of temperature for the sample when irradiated with a dose of 0.7 Gy/s is shown at 206, and electrical conductivity values as a function of temperature for the sample when not irradiated at all is shown at 208. The major change in conductivity can be seen to occur at relatively low temperatures (100-200° C.) and at radiation levels of 0.7 Gy/s or above as shown at 206. The produced radiation level varies based on the material used, but for strontium the radiation level translates roughly to 0.14 grams of radioisotope per 100 grams of thermoelectric material, or 0.14% of the total mass.

A ZT value is used as the performance metric to characterize the properties of a thermoelectric material. The ZT value of a single thermoelectric material is given by Equation 1:

$$zT = \frac{S^2 T}{\frac{\kappa}{\sigma}} \tag{1}$$

wherein, $\sigma$ is the electrical conductivity, S is the Seebeck Coefficient, and $\kappa$ is the thermal conductivity of a material at temperature T. A larger value of ZT indicates a higher performing thermoelectric material. From this equation, for a constant value of the Seebeck Coefficient, the ZT value increases proportionately for (1) increases in electrical conductivity, (2) increases in temperature, or (3) decreases in thermal conductivity.

A thermoelectric generator may comprise two materials, such as, for example, a first material comprising a p-type semiconductor and a second material comprising an n-type semiconductor. The performance of TEGs depends heavily on the ZT value. For a thermoelectric generator comprising a p-type semiconductor and an n-type semiconductor, is given by Equation 2:

$$Z\overline{T} = \frac{(S_p - S_n)^2 \overline{T}}{\left[\left(\frac{\kappa_p}{\sigma_p}\right)^{\frac{1}{2}} + \left(\frac{\kappa_n}{\sigma_n}\right)^{\frac{1}{2}}\right]^2} \tag{2}$$

wherein, $\sigma$ is the electrical conductivity, S is the Seebeck Coefficient, and $\kappa$ is the thermal conductivity of a p-type semiconductor and $\sigma$ is the electrical conductivity, S is the Seebeck Coefficient, and $\kappa$ is the thermal conductivity of an n-type semiconductor and the temperature, is the average temperature between hot side 130 and cold side 140.

The figure of merit increases in response to increasing one or more of the electrical conductivity, average temperature, and the Seebeck coefficient and/or decreasing the thermal conductivity. The maximum theoretical conversion efficiency of the thermoelectric generator may be calculated according to Equation 3:

$$\eta = \frac{\Delta T}{T_h} \frac{\sqrt{1 + Z\overline{T}} - 1}{\sqrt{1 + Z\overline{T}} + \frac{T_c}{T_h}} \tag{3}$$

wherein, the conversion efficiency η is dependent on hot side temperature Tb and the cold side temperature $T_c$. As ZT approaches infinity, the conversion efficiency approaches the Carnot limit, $$\frac{\Delta T}{T_h},$$

which is the theoretical maximum.

Figure 3:
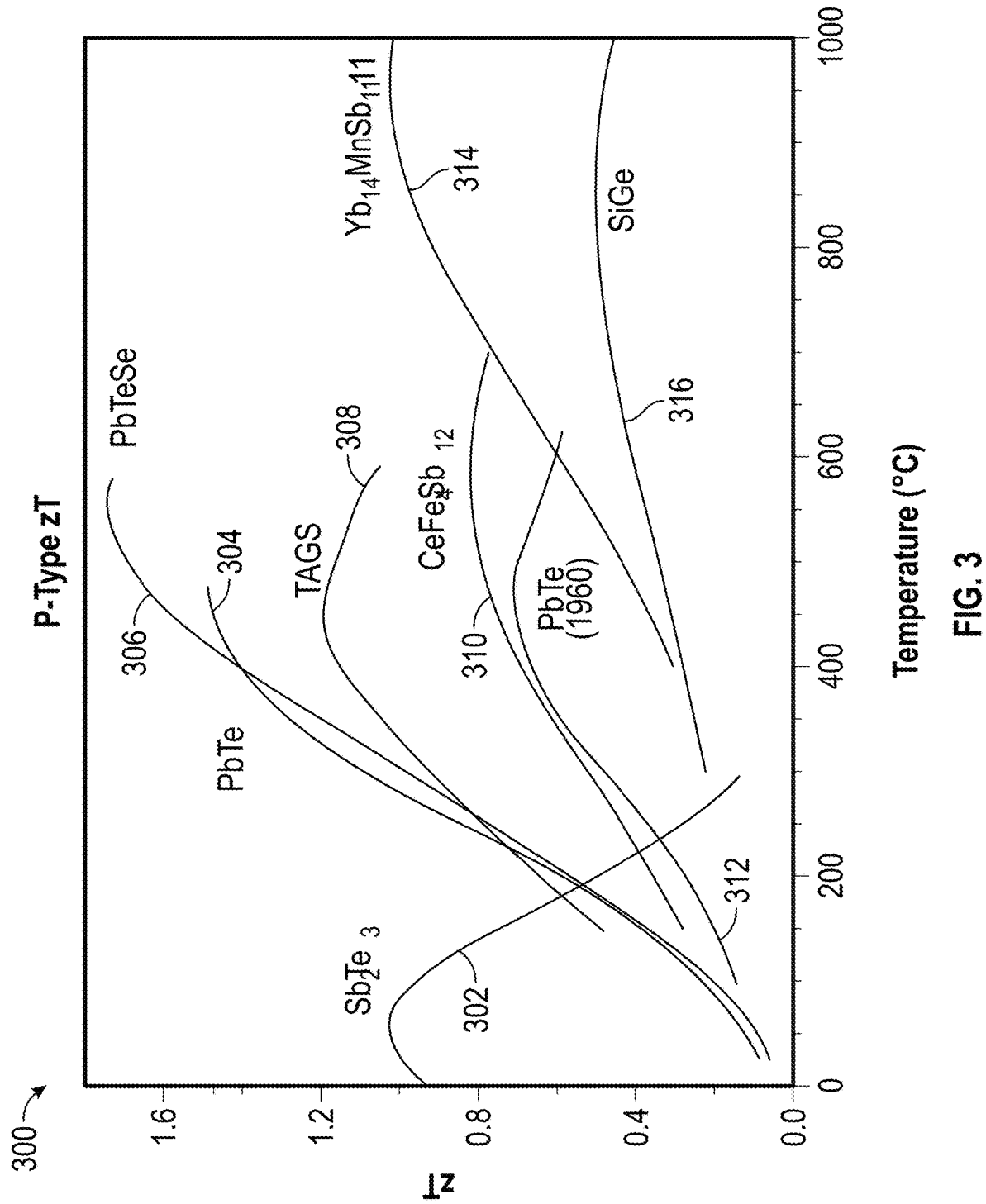
FIG. 3 illustrates ZT values of various thermoelectric materials at various temperatures.

Many TEGs have a ZT value around 1, as seen in FIG. 3. A ZT value around 1 usually translates to a relatively poor efficiency, as current TEGs have efficiencies around 6-8%.

FIG. 3 illustrates ZT values of various thermoelectric materials at various temperatures. Using increases in electrical conductivity modeled as 30× due to a 0.7 Gy/s dose, a model was generated to calculate efficiency using a TEG material with a ZT of 0.5, a hot side temperature of 200° C., a cold side temperature of 25° C. From this exemplary embodiment, the ratio of efficiencies could be found between the unmodified TEG and the enhanced TEG. The increase in efficiency was over 535%, increasing from 4.4% to 23.7% with the modification.

In one embodiment, a TEG having a mass of 48 g, with dimensions 56 mm×56 mm under the stated conditions provides a power level of 9 Watts. Applying the calculated efficiency increase, the 48 g TEG unit instead provides 48.15 Watts of power with 34 mg of strontium dopant.

The inclusion of a small amount of alpha or beta producing radioisotope housed safely within the feet of the P-N junction of the TEG emits radiation that improves the performance of the TEG. However, outside radiation sources, such as, for example, accelerators or existing radiation fields, may be used to introduce the ionizing particles. The ionizing radiation emitted by the radiation source excites and ionizes electrons in the material, which increases the electron mobility within the P-N junction feet, which increases the performance of the ATEGs. The performance is particularly significant at lower temperatures where efficiency would have been relatively lower.

Although in at least one exemplary embodiment detailed herein a thermoelectric generator is described as comprising a first material comprising a p-type semiconductor and a second material comprising an n-type semiconductor, alternative embodiments include a variety of materials capable of meeting the parameters detailed herein and could include additional p-type semiconductors or n-type semiconductors.

Advanced Thermoelectric Generators

In order to increase the figure of merit of thermoelectric generators to outpace the performance of current deep space and terrestrial power generation systems, in at least one aspect, the presented exemplary embodiments utilize the phenomena known as radiation induced conductivity (RIC). In this process, ionizing radiation causes atoms in the target material to ionize and free electrons, which increases the electrical conductivity of the material. These electrons eventually return to their host nucleus, returning the electrical conductivity of the material to its original state. Radiation can be continuously applied to re-ionize the atom and maintain a constant state of elevated electrical conductivity.

The ATEG units function by irradiating the feet of a thermoelectric generator and modifying the material properties of the feet. A source of ionization must be present for the ATEGs to function, which can be accomplished through two different methods: a radioisotope source or neutron interactions. Both methods result in ATEG units having the potential to reach comparable efficiency and power production as a traditional dynamic power cycle, but without utilizing moving parts.

Radioisotope Source

A common source of ionizing radiation is from radioisotopes, which continuously emit ionizing radiation. Often this is in the form of an alpha particle, which has two protons and two neutrons, and is positively charged. Common radioisotopes include, plutonium-238, americium-241, and polonium-210. The energy of the alpha particle depends on the source and may typically exceed 5 Mega Electron Volt (MeV). Depending on the ionization energy of the foot material, these alpha particles can ionize hundreds of thousands of atoms, and each radioisotope particle can produce billions of alpha particles per second depending on its mass. With a properly designed radioisotope dopant, a continuous supply of ionized atoms and free electrons may be available within the ATEG to maintain the elevated electrical conductivity for the lifetime of the radioisotope.

Hot pressing or spark plasma sintering (SPS) are used to embed the alpha source particles within the ATEG materials. The hot press process comprises heating and compressing powders of the ATEG material and the alpha source particles until they are densified into a solid object. The SPS process is similar but additionally comprises introduction of an electric current. Depending on the material, either hot pressing or SPS may be used. Radioisotope particles would simply be mixed into the powder and pressed down into a usable ATEG foot.

This type of radiation source would provide a stand-alone ATEG that would operate with higher efficiencies in accordance with its half-life. Alpha particles require little in the way of shielding, making it suitable for most applications that require solid state power production from a heat source. ATEGs could be paired with traditional heat-to-electric systems to increase their power density and expand their mission capabilities with virtually no penalty.

Neutron Interaction

As disclosed herein, the radiation source may comprise a neutron source. When a neutron is captured by an atom, that atom undergoes transmutation and, if the resultant nuclide is unstable, it may decay. In this specific case, boron-10 ($10_B$) was used to produce alpha particles through neutron absorption. Boron is an abundant element in many thermoelectric materials and semi-conductor dopants which also advantageously possesses a large neutron capture cross section for thermal neutrons. Natural boron comprises approximately 80% $11_B$ and approximately 20% $10_B$. When a $10_B$ atom captures a neutron, it releases a 2.5 MeV alpha particle and decays into lithium-7. The released alpha particle penetrates into the ATEG foot, thus ionizing the material and freeing electrons to increase the electrical conductivity, similar to the dopant radioisotope sources disclosed herein.

A $10_B$ atom has many advantages over radioisotopes, including that: it is not inherently radioactive, it is safer to handle, and it is not regulated by the Nuclear Regulatory Commission (NRC). This allows for testing and validation of the ATEG without the need to obtain radioisotopes. Boron loaded materials were tested at the Kansas State TRIGA reactor to investigate the RIC of a potential thermoelectric material. Results showed a drastic increase in conductivity as predicted (see FIG. 15 and/or additional information can be found at: T. M. Howe, S. D. Howe, J. Miller Novel Deep Space Nuclear Electric Propulsion Spacecraft Nuclear and Emerging Technologies for Space (NETS), 2020).

ATEG Modeling

Investigation into the ATEG was performed to predict the performance of the ATEG with a large variety of inputs. As stated hereinabove, the most effective method to increase the efficiency of TEGs is to change the electrical conductivity of the sample. Modification of the Seebeck coefficient and thermal conductivity due to radiation exposure showed positive results as well. However, these factors would not pose as significant changes to the ATEGs efficiency as altering the material's electrical conductivity. Previous studies have shown several orders of magnitude difference in electrical conductivity, while changes in thermal conductivity and Seebeck coefficient are limited to only a few factors difference.

Augmented thermoelectric generators (ATEGs) thermocouple may be embedded with RIC dopant particles. The RIC particles have their own thermal conductivity and electrical conductivity separate from the matrix. The matrix also has its own thermal and electrical conductivity separate from the RIC particles. The area at 105, 106, and 107 in FIG. 1 is the RIC influenced area which may see localized increases in electrical conductivity greater than the surrounding matrix. FIG. 1 also illustrates how RIC influence areas can overlap forming a pathway through the material with greater electrical conductivity.

A key component of the model was to predict the amount of RIC dopant (radioisotope, or neutron interaction) that needed to be added to the thermoelectric material to increase its electrical conductivity to adequate levels. The volume percentage (vol %) and particle size of the RIC dopant directly impacts the electrical conductivity of the sample. Alpha particles are emitted and penetrate into the matrix which causes localized regions of increased conductivity shown at 105, 106, and 107 in FIG. 1. These regions of localized conductivity can overlap, increasing the amount of ionizations these areas. This further increases the electrical conductivity in that area as well. Multiple areas of overlapping RIC influenced areas connect forming a highly conductive pathway through the TEG foot. Addition of RIC dopant particles may affect the thermal conductivity, Seebeck coefficient, and electrical conductivity. A primary concern with more thermally conductivity particles, is to avoid forming a pathway through the ATEG foot of high thermally conductive particles, which would reduce the ATEGs efficiency. However, because of the volume of material under RIC influence is greater than the particle vol % this may be unlikely to occur. Areas under the influence of the ionizing radiation are also expected to experience decreases in thermal conductivity and increases in Seebeck coefficient. However, these changes were overshadowed by the more dominating change in electrical conductivity.

TABLE 1

| Material | NiO (6.67 g/cc) | SiGe (3.01 g/cc) | $Bi_2Te_3$ (7.7 g/cc) | PbTe (8.16 g/cc) |
|---|---|---|---|---|
| $^{238}$Pu (5.6 MeV) | 12.4 | 26.2 | 20.3 | 19.7 |
| $^{241}$Am (5.5 MeV) | 12 | 25.5 | 19.7 | 19.2 |
| $^{10}$B (2.5 MeV) | 4.46 | 8.96 | 7.18 | 7.06 |

TABLE 1 shows alpha particle penetration depth in various thermoelectric generator materials. Penetration depth is directly related to volume of material effected by the radiation induced conductivity. The average alpha particle energy is taken from each source and all penetration depths are represented in microns. The first column in TABLE 1 is the radioisotope material that emits alpha particles with the energies in parenthesis. The next four columns are the matrix materials that the alphas travel through, and the values are how far they go.

FIG. 3 shows ZT values of some common TEG materials. In FIG. 3, ZT values of Sb2Te3 as a function of temperature are shown at 302, ZT values of PbTe as a function of operating temperature are shown at 304, ZT values of PbTeSe as a function of operating temperature as shown at 306, ZT values of TAGS as a function of operating temperature are shown at 308, ZT values of CeFe4Sb12 as a function of operating temperature are shown at 310, ZT values of PbTe as a function of operating temperature using data from designs in the 1960s are shown at 312, ZT values of Yb14MnSb11 as a function of operating temperature are shown at 314, and ZT values of SiGe as a function of operating temperature are shown at 316.

Figure 4B:
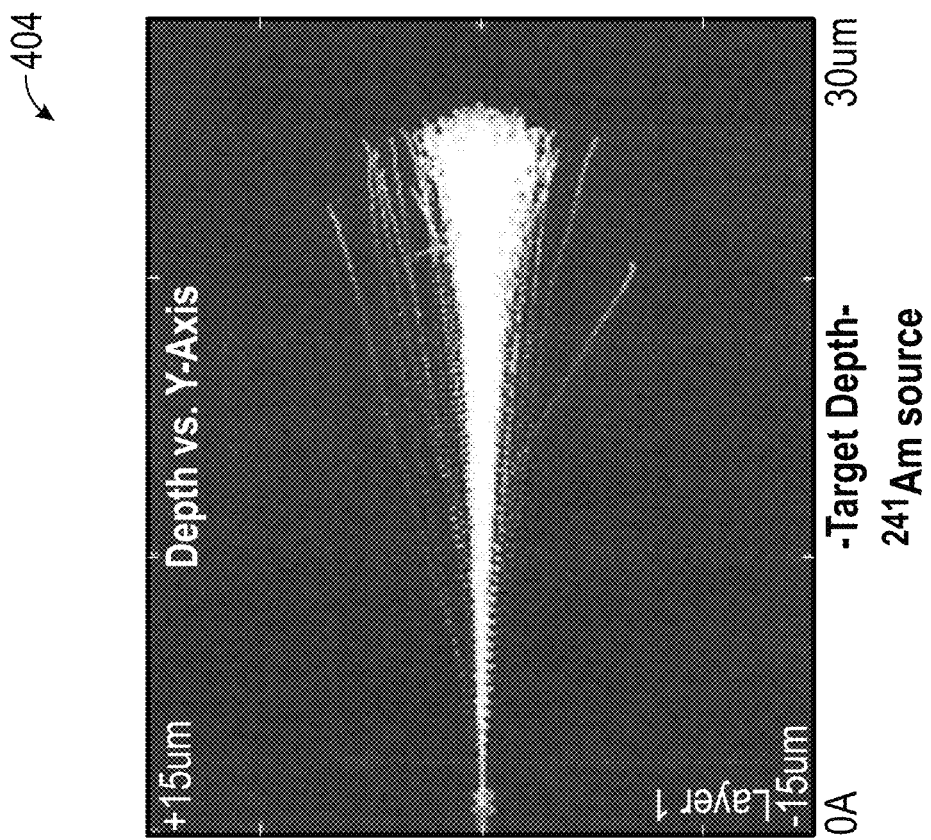
FIGS. 4A through 4F illustrate penetration depth and the ionization profile of different alpha particle sources within a SiGe TEG foot
Figure 4A:
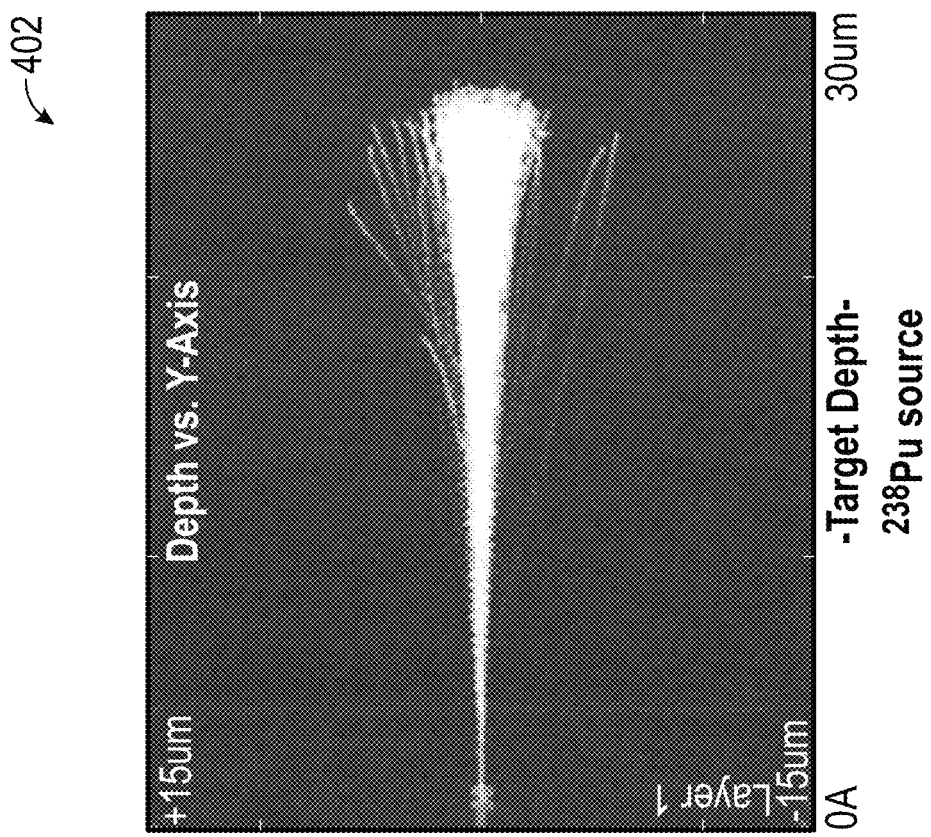
Figure 4D:
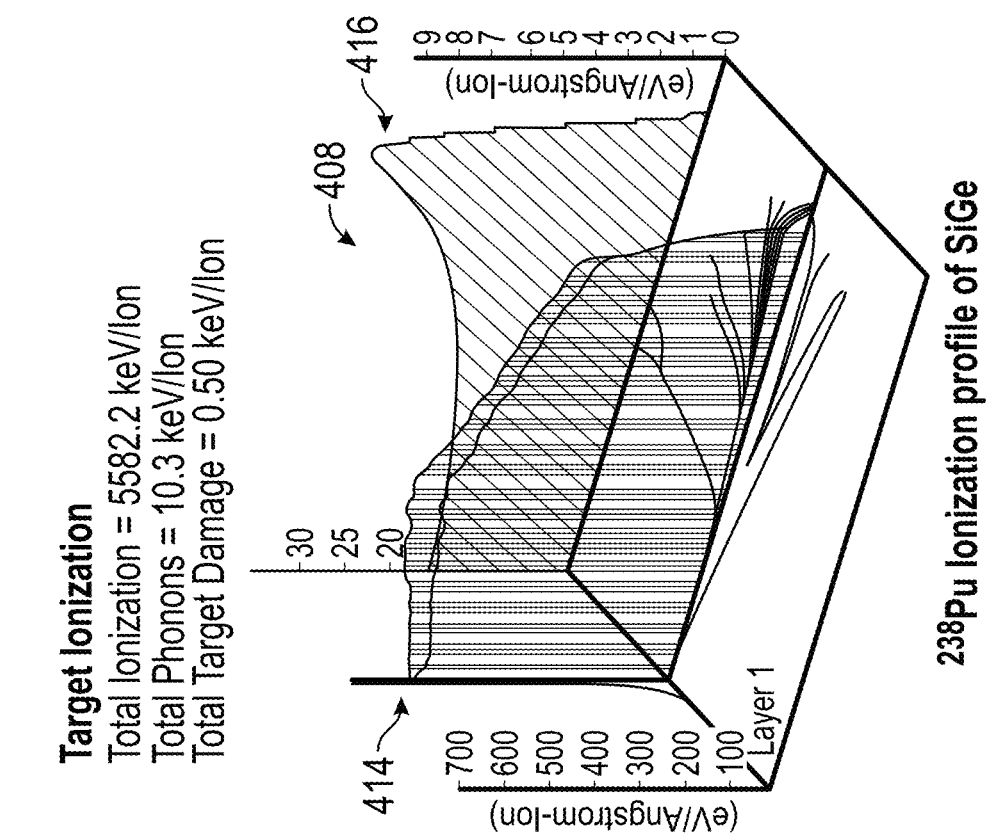
Figure 4C:
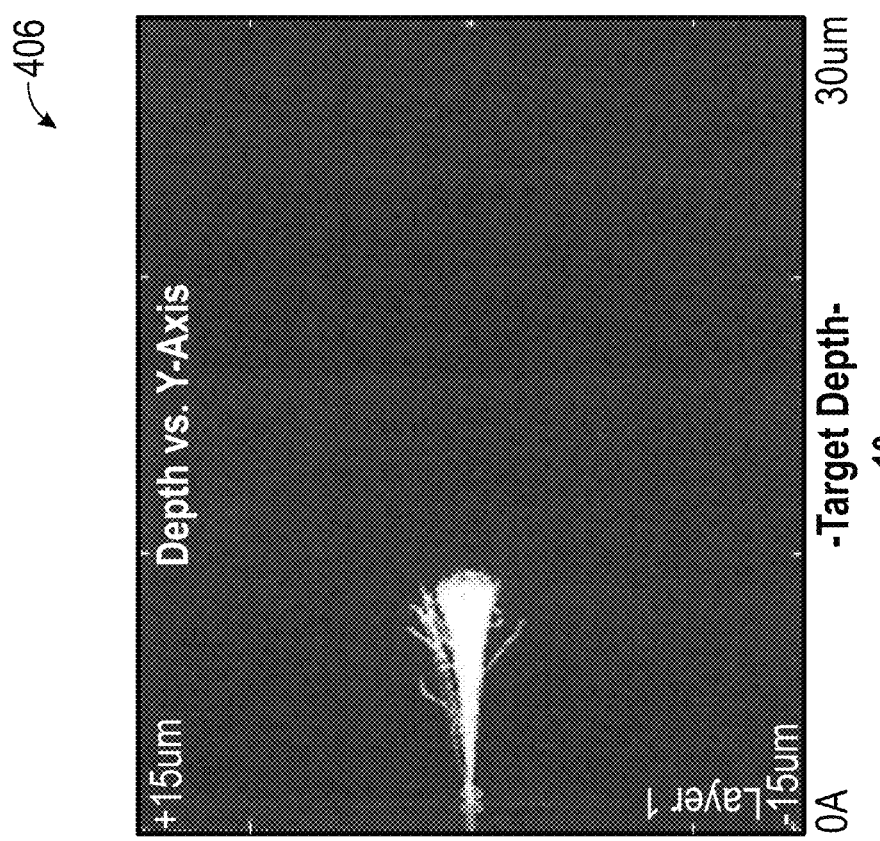
Figures 4E, 4F:
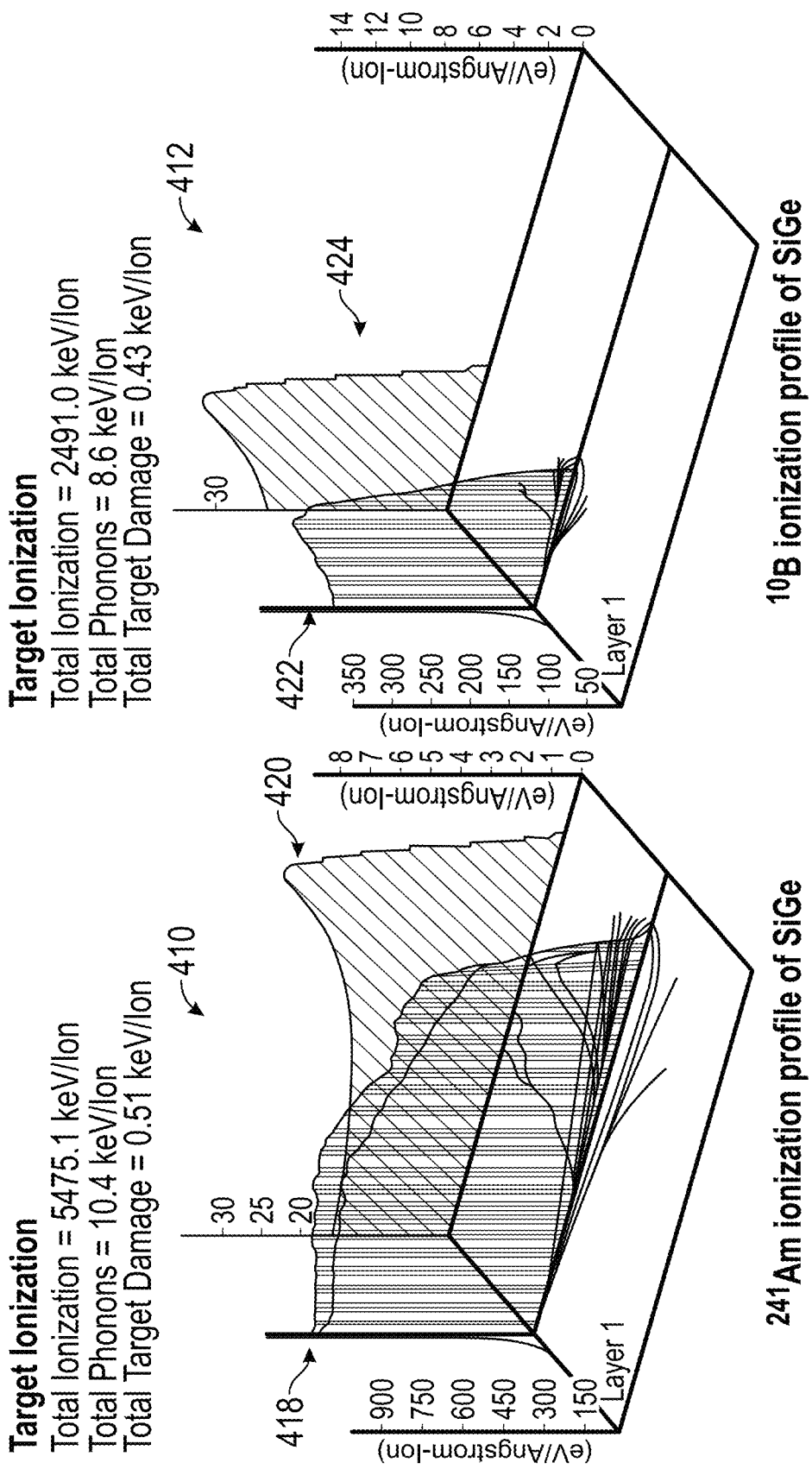

FIGS. 4A through 4F show a simulation of how alpha particles penetrate into materials. The images (402, 404, 406) of FIGS. 4A, 4B, 4C show alpha particles from plutonium, americium, and boron in silicon germanium. Plutonium and americium have deeper penetration depths due to the higher energy alpha particles emitted. The images (408, 410, 412) of FIGS. 4D, 4E, 4F track the number of ionizations in the matrix material (414, 418, 422) and energy lost per angstrom traveled (416, 420, 424) of the alpha particle. FIGS. 4A through 4F illustrates penetration depth and the ionization profile of different alpha particle sources within a SiGe TEG foot, according to an exemplary embodiment. Higher energy alpha particles penetrate further into the material, resulting in larger areas under RIC influence.

The radiation sources described previously all have different alpha particle energy levels, and therefore penetrate to different depths within the thermoelectric material. This behavior is visible in TABLE 1 for some common thermoelectric materials showing the numbers for penetration depth are different for each material/alpha emitter. Boron, with the smallest alpha particle energy, has roughly ⅓ the penetration depth of the two radioisotope sources studied, which would require it to have a higher RIC dopant vol % to reach the same change in electrical conductivity. FIGS. 4A through 4F show how the energy of the alpha particle effects the penetration depth and the number of ionizations within a SiGe matrix. A larger penetration depth can also aid in reducing the amount of radioisotope used per ATEG.

Figures 5A, 5B:
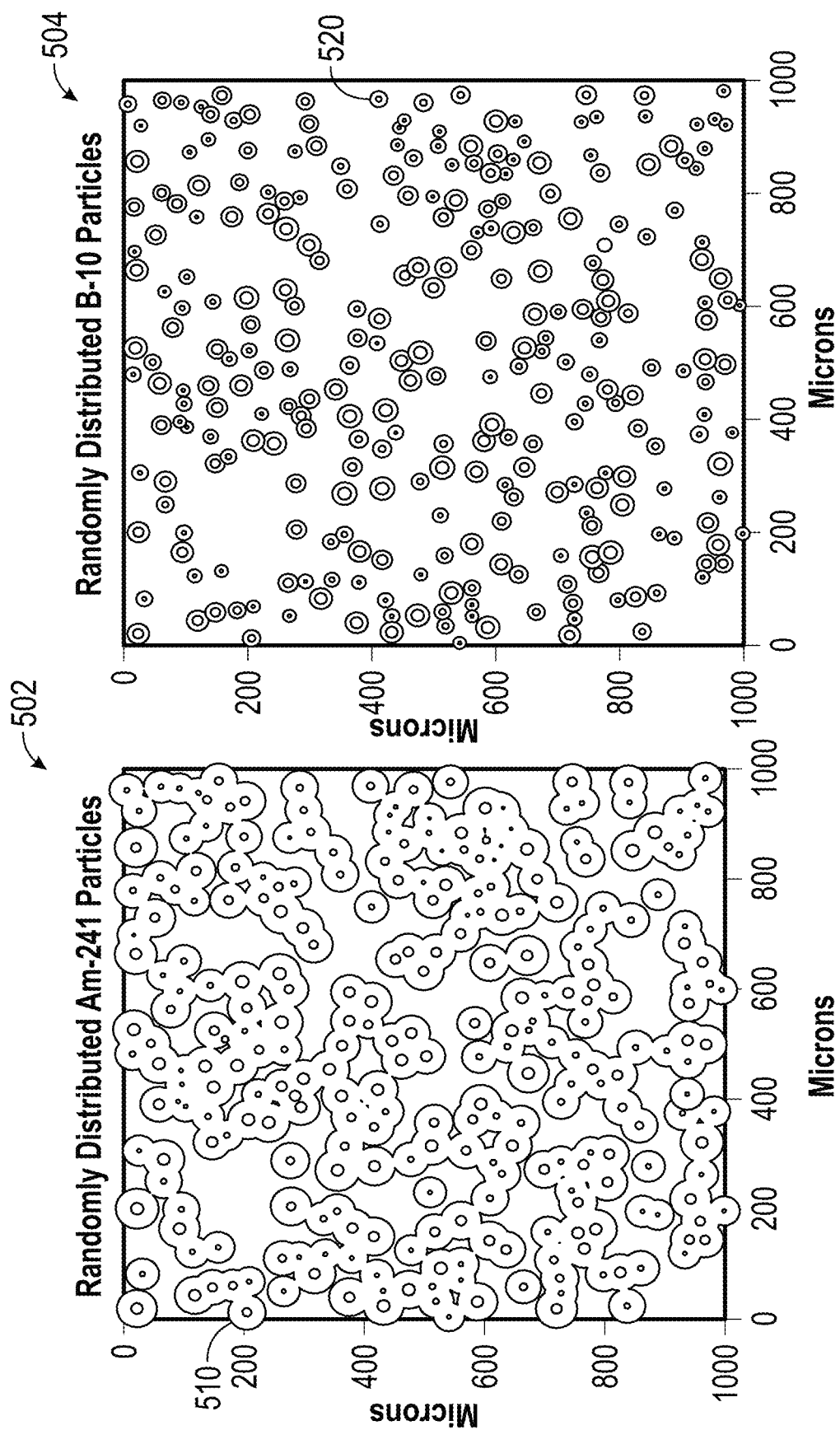
FIGS. 5A and 5B show the difference between a 241 Am source and a 10B(n,α) source and its corresponding change in the volume influenced by radiation induced conductivity (RIC).

FIGS. 5A and 5B show the difference between a 241 Am source and a source and its corresponding change in the volume influenced by RIC. FIG. 5A shows a 241 Am RIC dopant within a SiGe matrix and FIG. 5B shows 10B(n,α) particles within a SiGe matrix. In order to reach the same RIC influence vol % a larger amount of 10B must be used, as the goal is to completely encompass the material under RIC influence. Charts 502 and 504 showing particle distribution and RIC penetration, according to an exemplary embodiment.

Particles 510 of randomly distributed Am-241 of chart 502 and particles 520 of randomly distributed B-10 of chart 504 penetrate to depths due to 5.49 MeV alpha particles and 2.5 MeV particles. In order to cover the same vol % as the 241 Am, larger vol % of the 10B(n,α) may be required.

Decreasing the RIC dopant particle sizes also has a significant effect on the electrical conductivity of the samples. If small particle sizes are used, a larger volume of the ATEG foot may be under RIC influence for the same vol %. Larger particles may result in smaller vol % under RIC influence as the particles may not be as dispersed within the matrix. In samples that contain (n,α) particles this holds true as well, however, particles such as $10_B$ may already be atomistically distributed within the material because it is one of the elements that make up the compounds. This should yield much higher vol % under RIC influence as compared to materials made through sintering with RIC particles.

As shown in FIG. 5, areas within the matrix have overlapping areas of RIC influence. These areas may see increases in electrical conductivity compared to other areas depending on the RIC influence areas that are overlapping. This also means that for each vol % infill and particle size distribution there may be a statistical distribution of RIC coverage that can be expected. This provides valuable information in understanding how much radioisotope of (n,α) must be added to the ATEG foot to achieve the required change in electrical conductivity. These statistical distributions also aid in determining the performance of potential ATEG materials without the need to run countless simulations based on their material properties.

Figure 6:
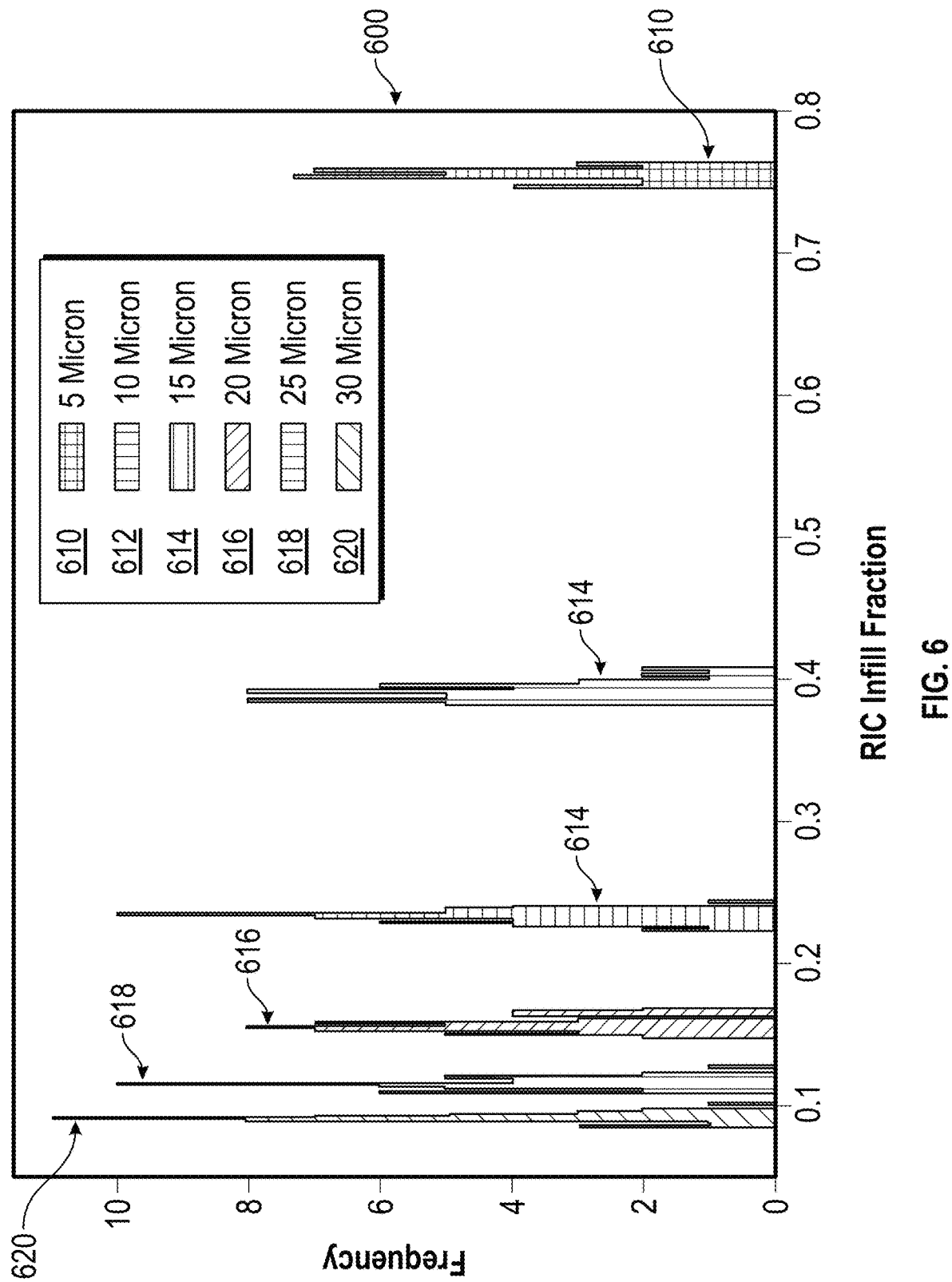
FIG. 6 illustrates a chart showing statistical distribution of RIC influence volume coverage within a PbTe matrix.

FIG. 6 illustrates chart 600 showing statistical distribution of RIC influence volume coverage within a PbTe matrix, according to an exemplary embodiment. Smaller particle sizes result in larger RIC vol % for the same infill vol %. Atomistically distributed particles should result in complete RIC vol % coverage. In FIG. 6, 610 shows fraction of volume affected to RIC generating particles in the host material as determined by running simulations of randomly generated distributed particles of 5 micron diameter, 612 shows fraction of volume affected to RIC generating particles in the host material as determined by running simulations of randomly generated distributed particles of 10 micron diameter, 614 shows fraction of volume affected to RIC generating particles in the host material as determined by running simulations of randomly generated distributed particles of 15 micron diameter, 616 shows fraction of volume affected to RIC generating particles in the host material as determined by running simulations of randomly generated distributed particles of 20 micron diameter, 618 shows fraction of volume affected to RIC generating particles in the host material as determined by running simulations of randomly generated distributed particles of 25 micron diameter, and 620 shows fraction of volume affected to RIC generating particles in the host material as determined by running simulations of randomly generated distributed particles of 30 micron diameter.

FIG. 6 shows statistical distributions for varying particle sizes at 4 vol % infill within a PbTe ATEG foot. As can be observed from this plot the particle size effects the RIC vol % infill fraction, with smaller particle sizes helping to distribute the RIC influenced areas throughout the material. As the particle size decreases, the RIC infill percent reaches its maximum value. With atomistic distribution, virtually the entire sample should be under RIC influence. This should be the case for the various borides and boron compounds that have been identified as potential ATEG materials.

Figure 7:
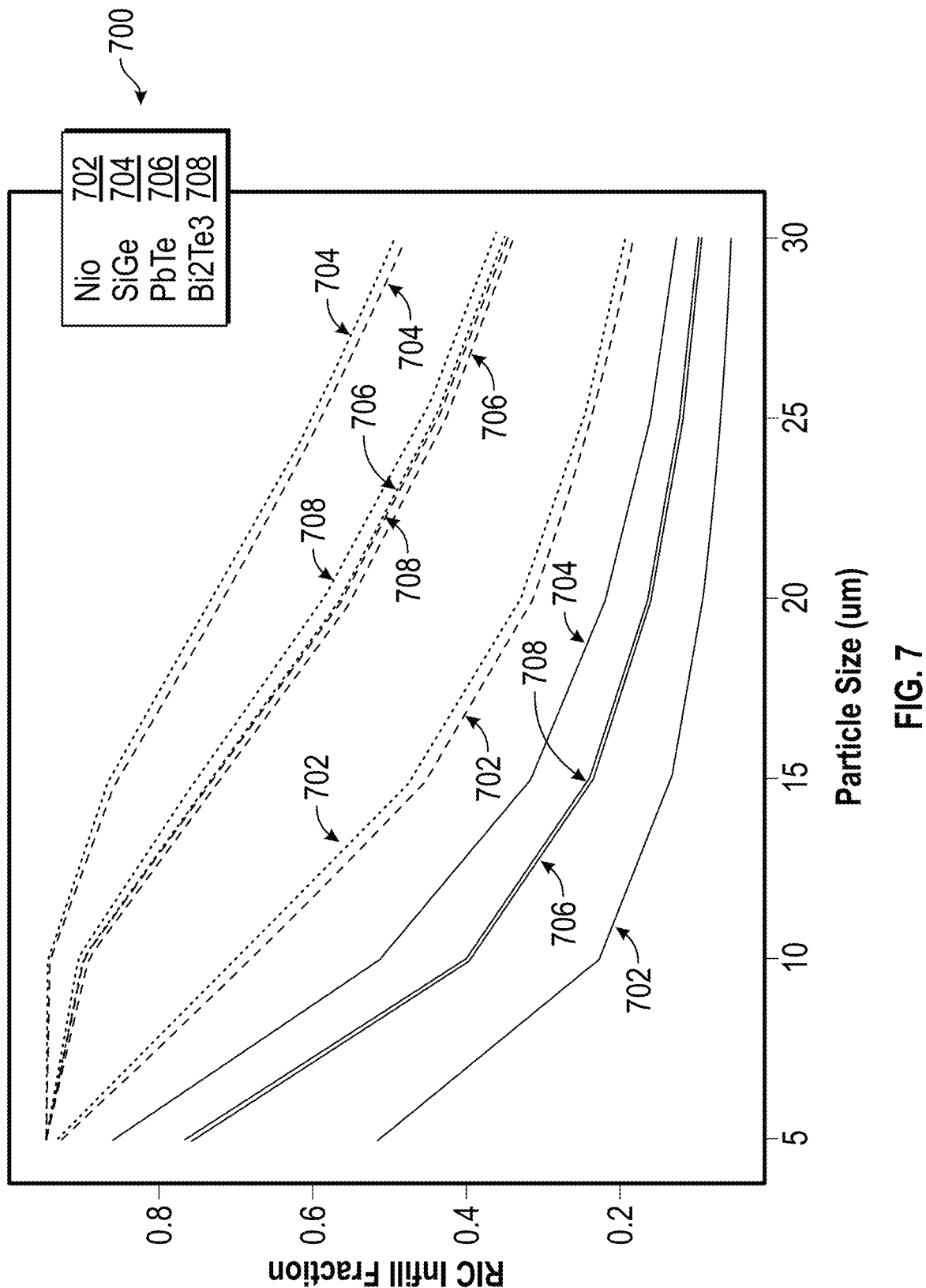
FIG. 7 illustrates a chart showing particle size, alpha source type, and ATEG foot type effect on RIC vol % infill fraction.

The same simulation was performed on various thermoelectric materials to study their behavior with various vol % infills, alpha sources, and particle sizes, which is visible in FIG. 7.

FIG. 7 illustrates chart 700 showing particle size, alpha source type, and ATEG foot type effect on RIC vol % infill fraction, according to various exemplary embodiments. Solid lines represent 10B(n,α) particles, dashed lines represent 241 Am particles, and dotted lines represent 238Pu particles. FIG. 7 shows how the actual ATEG foot material can affect the RIC coverage compared to others, which may be a factor in the decision to choose specific materials over one another to SPS with the alpha particle sources. The plot of FIG. 7 shows that 238Pu and 241 Am effect the material in a similar fashion, with the difference being the specific activity of each radioisotope. While this simulation was conducted on TEG materials at 4% infill, higher infill percentages see much larger RIC vol % infill fractions, particularly with 10B(n,α). In FIG. 7, 702 shows the fraction of volume affected by RIC generated particles in a NiO host material as a function of RIC generating particle size, 704 shows the fraction of volume affected by RIC generated particles in a SiGe host material as a function of RIC generating particle size, 706 shows the fraction of volume affected by RIC generated particles in a PbTe host material as a function of RIC generating particle size, and 708 shows the fraction of volume affected by RIC generated particles in a Bi2Te3 host material as a function of RIC generating particle size.

Determining the impact on the efficiency of the thermoelectric generator uses the RIC vol % infills determined from these simulations. When these particles are introduced to the ATEG matrix, they affect the electrical conductivity, Seebeck coefficient, and thermal conductivity. As discussed earlier, the electrical conductivity is affected the most by radiation, while the thermal conductivity and Seebeck coefficient increase but maintain the same magnitude. The particles introduced have their own electrical conductivity and thermal conductivity which can influence the new composite properties in potentially negative ways. Boron for example has a thermal conductivity of 27 W/mK, which is an order of magnitude higher than the ATEG materials shown in FIG. 7.

The addition of boron particles increases the overall thermal conductivity of the material which can negatively affect the performance of the ATEG. Pu and Am do not suffer as much from this issue as their thermal conductivities, while greater than most thermoelectric materials, are still the same order magnitude as the ATEG feet. The effects of adding the filler material were taken into consideration to determine any negative effects.

Figure 8:
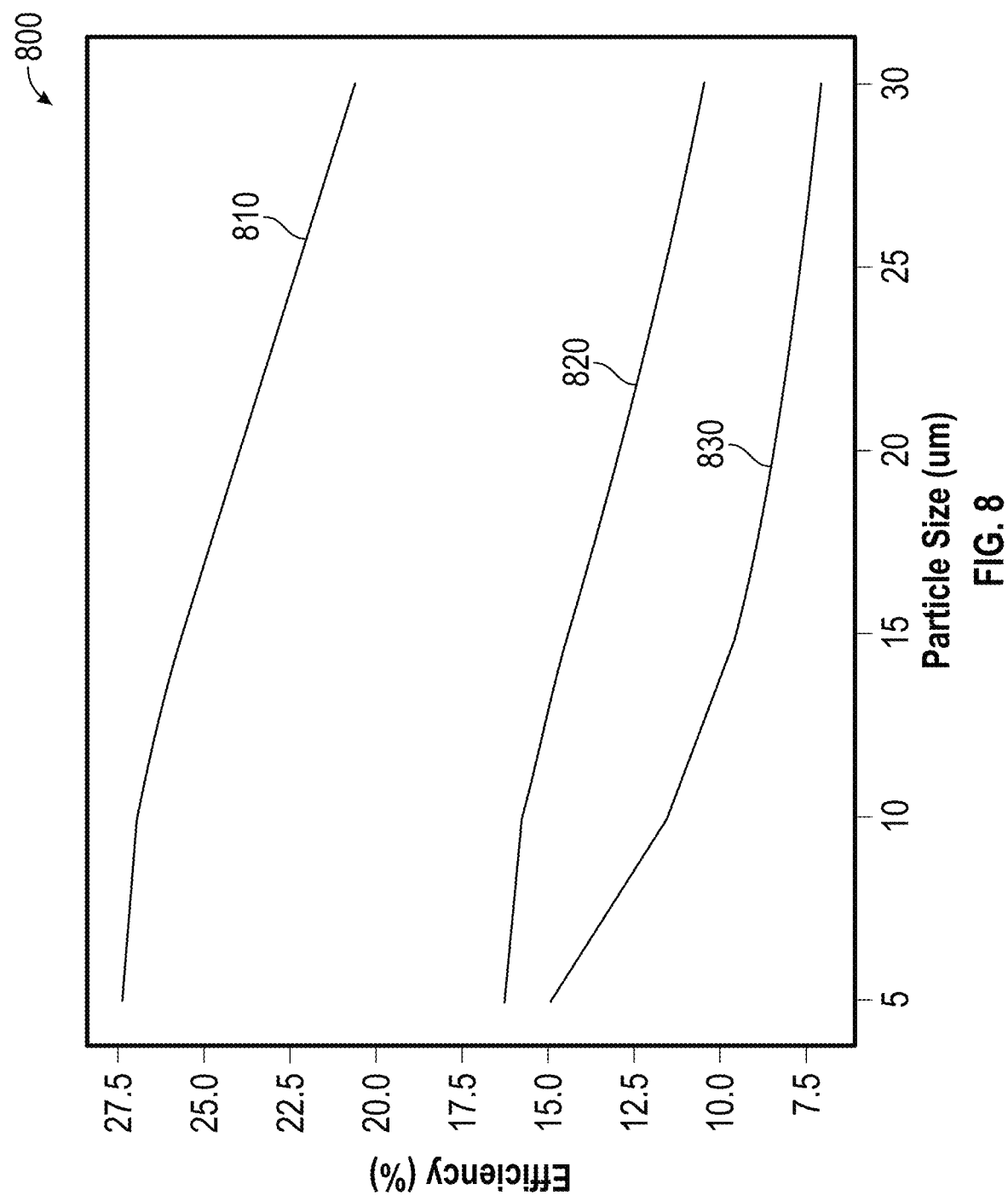
FIG. 8 illustrates a chart showing predicted PbTe enhanced efficiency due to alpha sources within its material matrix.

FIG. 8 illustrates chart 800 showing predicted PbTe enhanced efficiency due to alpha sources within its material matrix, according to an exemplary embodiment. Line 810 represents 238Pu, line 820 represents 241 Am, and line 830 represents 10B particles. In one example, plutonium has a higher activity level than the other sources therefore resulting in a greater change in conductivity in its influenced area.

The degree of conductivity changes is under investigation as significant information over a range of materials is not available. Because plutonium decays at a faster rate than americium, the plutonium makes more alpha particles per second, makes more ionizations, and explains why the Pu line has higher efficiency as shown. However, an experiment at Oak Ridge National Laboratory (ONRL) observed an increase of 400× in the electrical conductivity of alumina when exposed to ionizing radiation at temperatures within the operating range of exemplary embodiments detailed herewithin. Another experiment on ceramic materials observed over 10,000 times increase in electrical conductivity in a UV grade sapphire sample inside a reactor core (for additional information, see https://www.sciencedirect.com/science/article/abs/pii/S0022311598003006). In at least one exemplary embodiment detailed herein, boron nitride showed a 50× increase in electrical conductivity when subjected to a neutron flux in a TRIGA reactor. A conductivity multiplier factor can be applied to the material's electrical conductivity to simulate the expected change in properties during experimental determination of additional materials.

The efficiency and figure of merit of the ATEG is determined from equations 2 and 3 with modifications to the thermal and electrical conductivities due to the particles' effects. These results are visible in FIG. 8 for a lead telluride sample with the three alpha sources studied. Efficiencies were calculated for a standard temperature at 600 K for the hot side and 350 K for the cold side. As observed earlier smaller particles have a greater effect at increasing the electrical conductivity and therefore the efficiency. The activity of 238Pu is roughly five times greater than that of 241 Am for an equivalent mass. This means that the material around the 238Pu shows a higher dose, which is directly linked to the conductivity multiplier.

The activity of 10B is dependent on the neutron source flux, in this case the radioactivity matched that of 241 Am. FIG. 8 shows this relationship with 238Pu having a greater efficiency due to its higher electrical conductivity. In this case, a conductivity multiplier of 10 was used to simulate the effects of RIC. FIG. 8 shows that plutonium has a greater effect on increasing efficiency because of its increased reactivity, while the other two alpha sources show lower activity levels. Because of the lower RIC vol % infill, $10_B(n,\alpha)$ did not match that of 241 Am, which had a higher vol % coverage.

Figure 9:
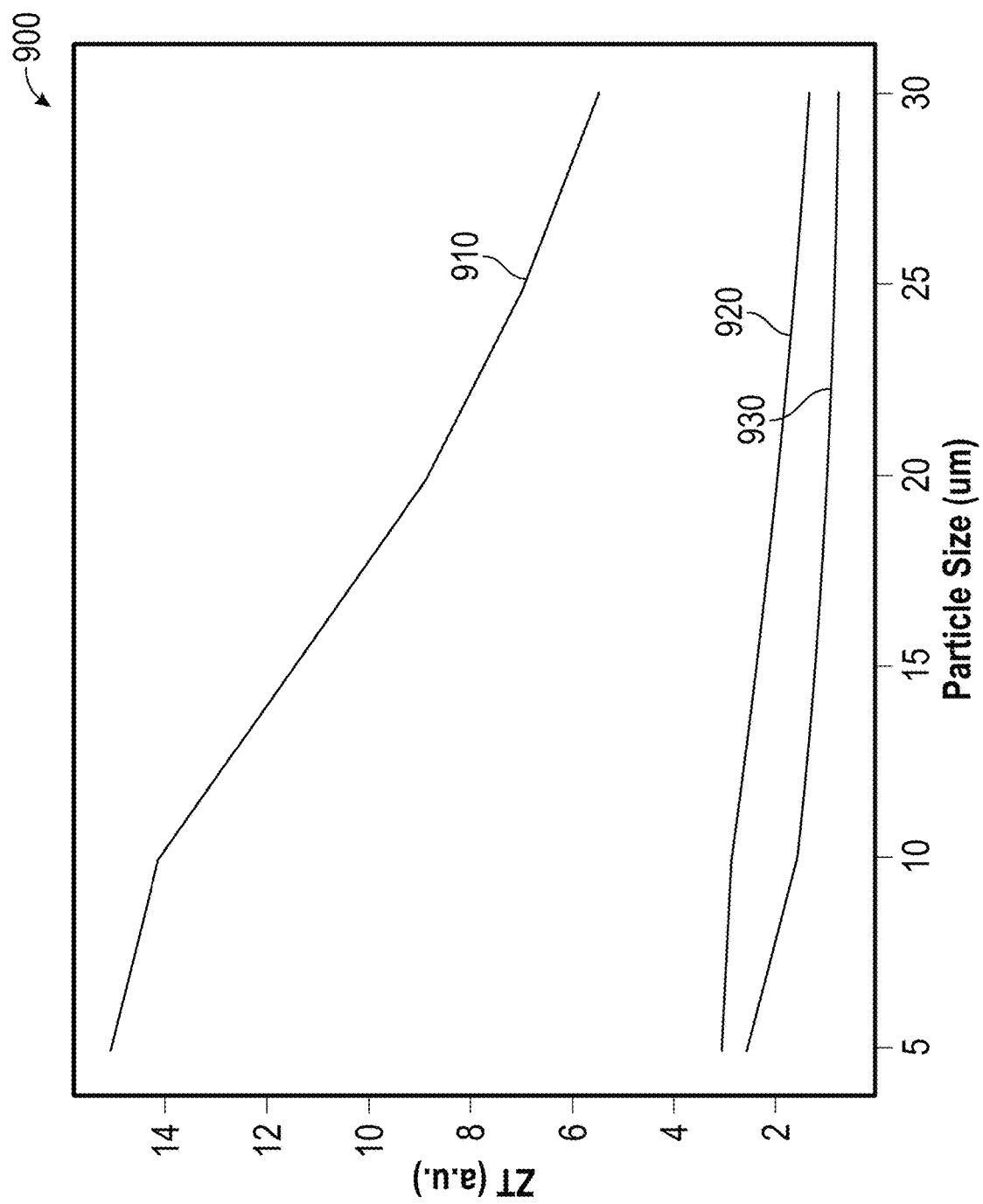
FIG. 9 illustrates a chart showing figures of merit associated with the ATEG created from PbTE materials with the alpha source particles.
Figure 10:
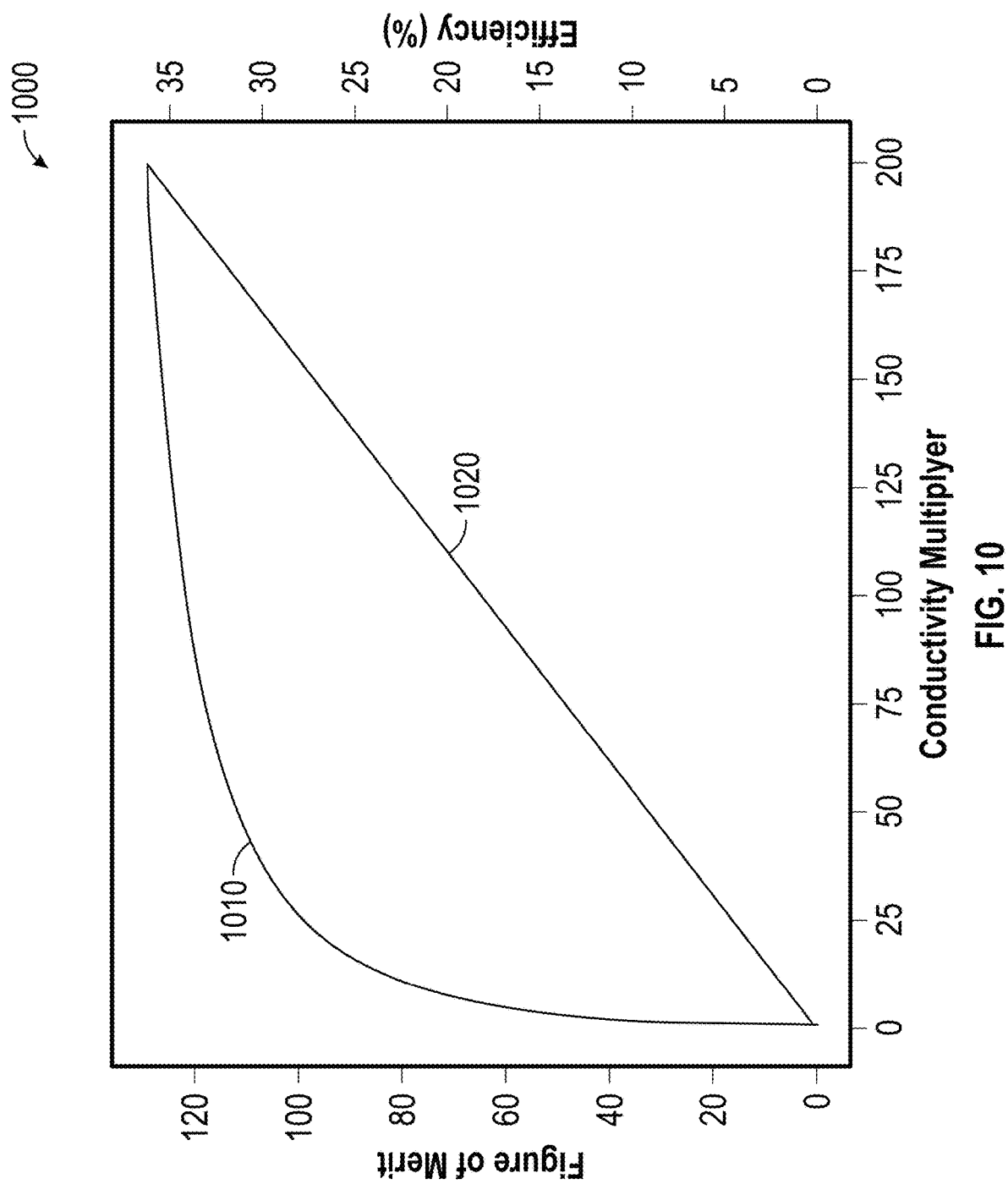
FIG. 10 shows conductivity multiplier plotted against change in figure of merit and the efficiency of a PbTe—PbTe ATEG.

FIG. 9 illustrates chart 900 showing figures of merit associated with the ATEG created from PbTE materials with the alpha source particles, according to an exemplary embodiment. Reaching higher levels of efficiency requires larger figures of merit. FIG. 10 illustrates chart 1000 showing increases in efficiency and figure of merit occur at relatively small changes in conductivity and shows expected PbTe TEG performance with magnitude cond. change. FIG. 9 shows the associated figures of merit for the ATEG couple showing that significantly larger figures of merits can be reached than previously possible through conventional TEG technologies, even though the conductivity multiplier used to simulate this ATEG was significantly lower than that of previous studies on other materials. Where the ZT references above for most materials show a ZT around 1 as the common standard, while the chart shows Pu doped ATEGs reaching ZT values of 14. As shown in FIG. 9, line 910 represents 238Pu, line 920 represents 241 Am, and 930 represents 10B particles. The ZT value is plotted in FIG. 9 versus the size of particles of those materials added to the TEG foot as a dopant. However, it has been observed that changes in conductivity on the level observed by ORNL are not necessary to raise the efficiency of the thermoelectric material above 20-25%. This is visible in FIG. 10 where the conductivity multiplier has been plotted against the change in figure of merit and the efficiency of a PbTe—PbTe ATEG. As shown in FIG. 10, changes of 25-50 times the normal conductivity can yield drastic changes in efficiency and figure of merit as shown along lines 1010 and 1020. For a increase, the efficiency is near 33% and the ZT is near 30. Line 1020 corresponds to the ATEG efficiency as a function of the conductivity multiplier. At changes in conductivity seen with ORNL, the efficiency would increase to 40.8%, which is roughly 98% that of Carnot efficiency.

This multiplication factor would coincide with a large dose of radiation. Radioisotope particles may have a continued dose rate that slowly decays over time in conjunction with their half-life. Meaning that they may never exceed the expected efficiency based on their conductivity multiplier and their RIC coverage area. With a (n,α) particle such as 10B, the dose rate can be increased and decreased depending on the desired efficiency. This is because the alpha particle dose is dependent on the neutron flux, which can be adjusted inside of the reactor. Simply increasing and decreasing the neutron flux may change the electrical conductivity of the ATEG which would not be possible with a constant radiation source such as radioisotopes.

Figure 11A:
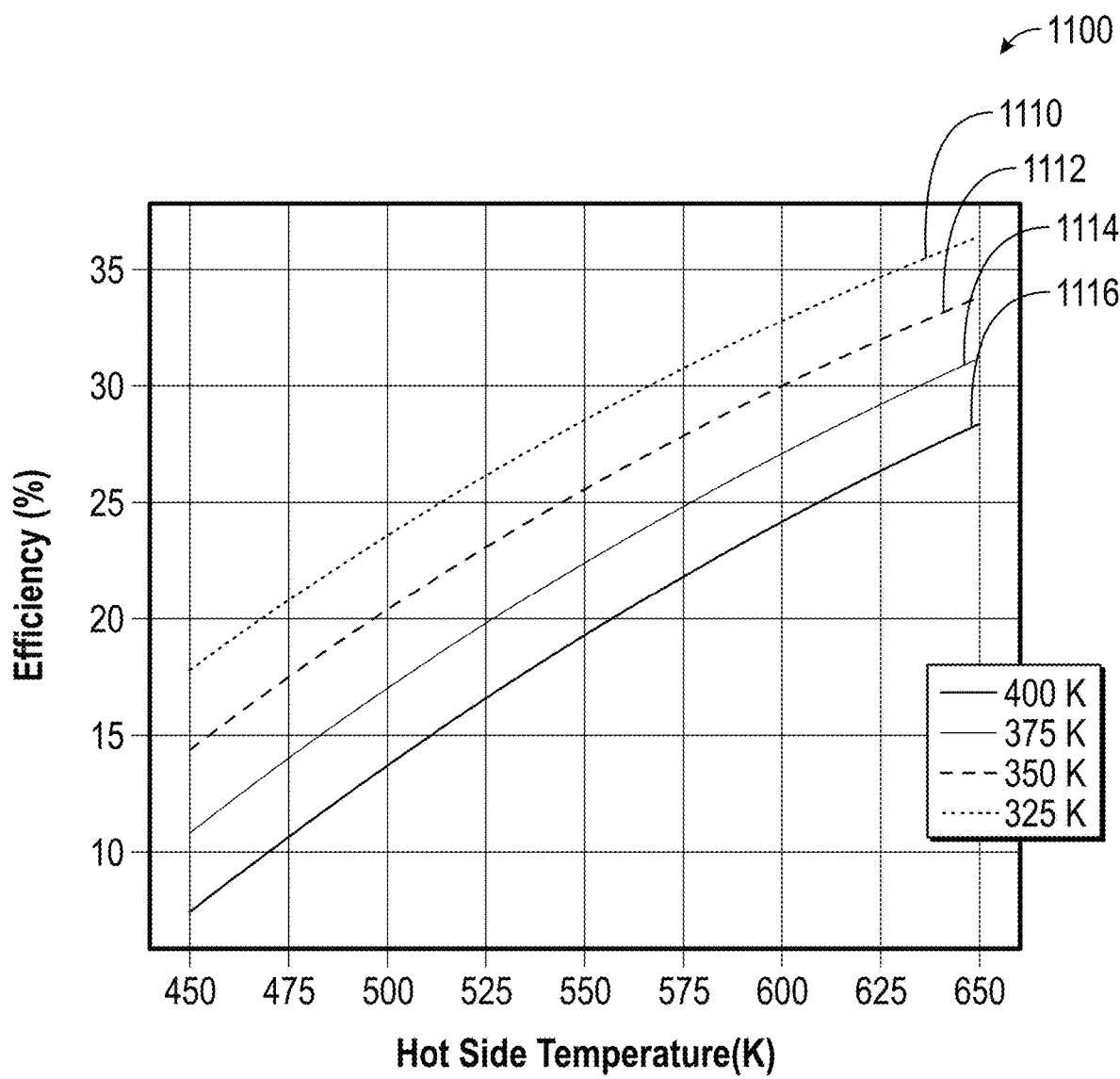
FIGS. 11A and 11B illustrate charts showing the performance of a PbTe ATEG under various temperature gradients.
Figure 11B:
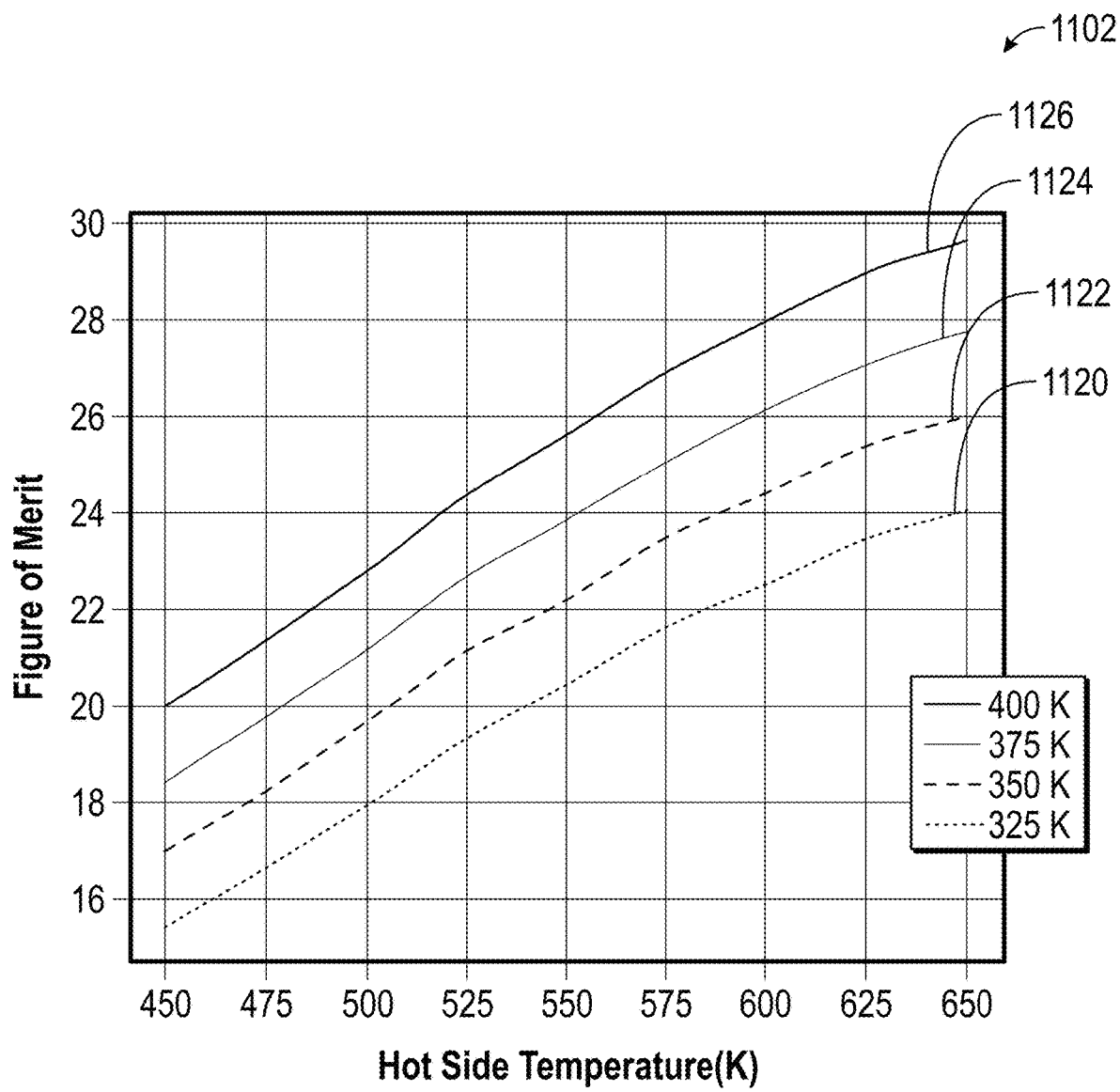
Figures 12A, 12B:
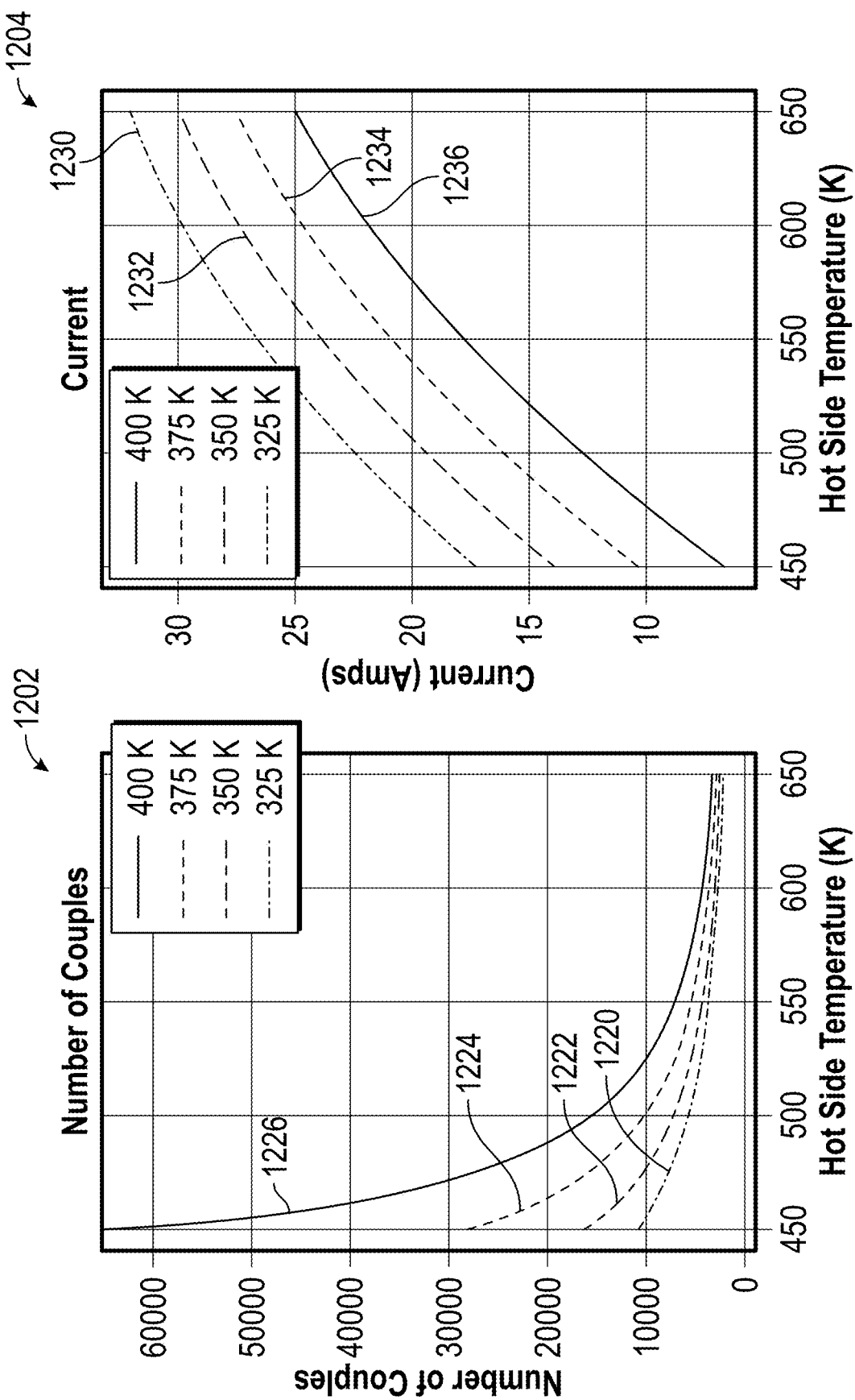
FIGS. 12A through 12F illustrate charts showing performance characteristics of an ATEG system that produces 3 kW of electrical power.
Figures 12C, 12D:
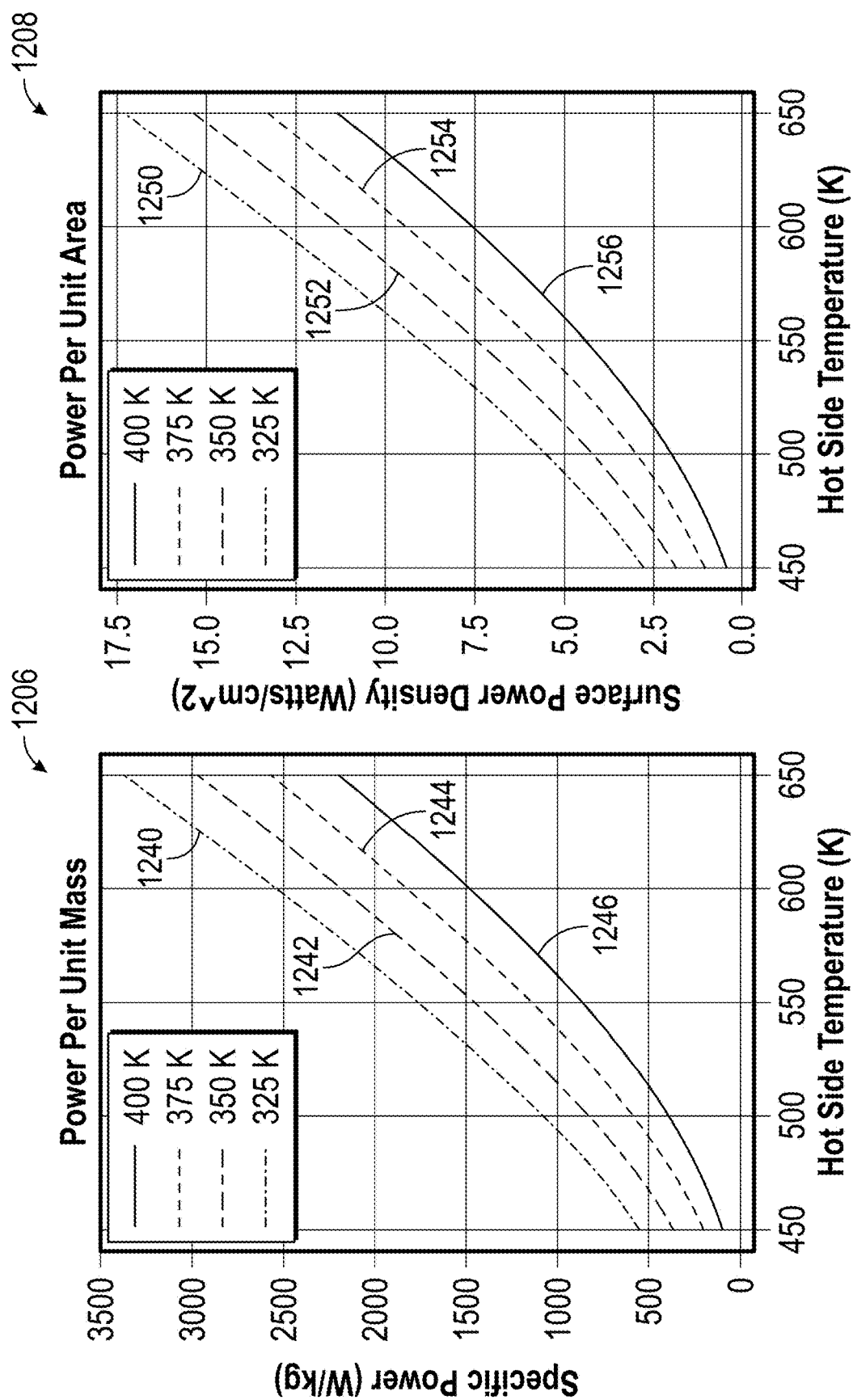
Figure 12F:
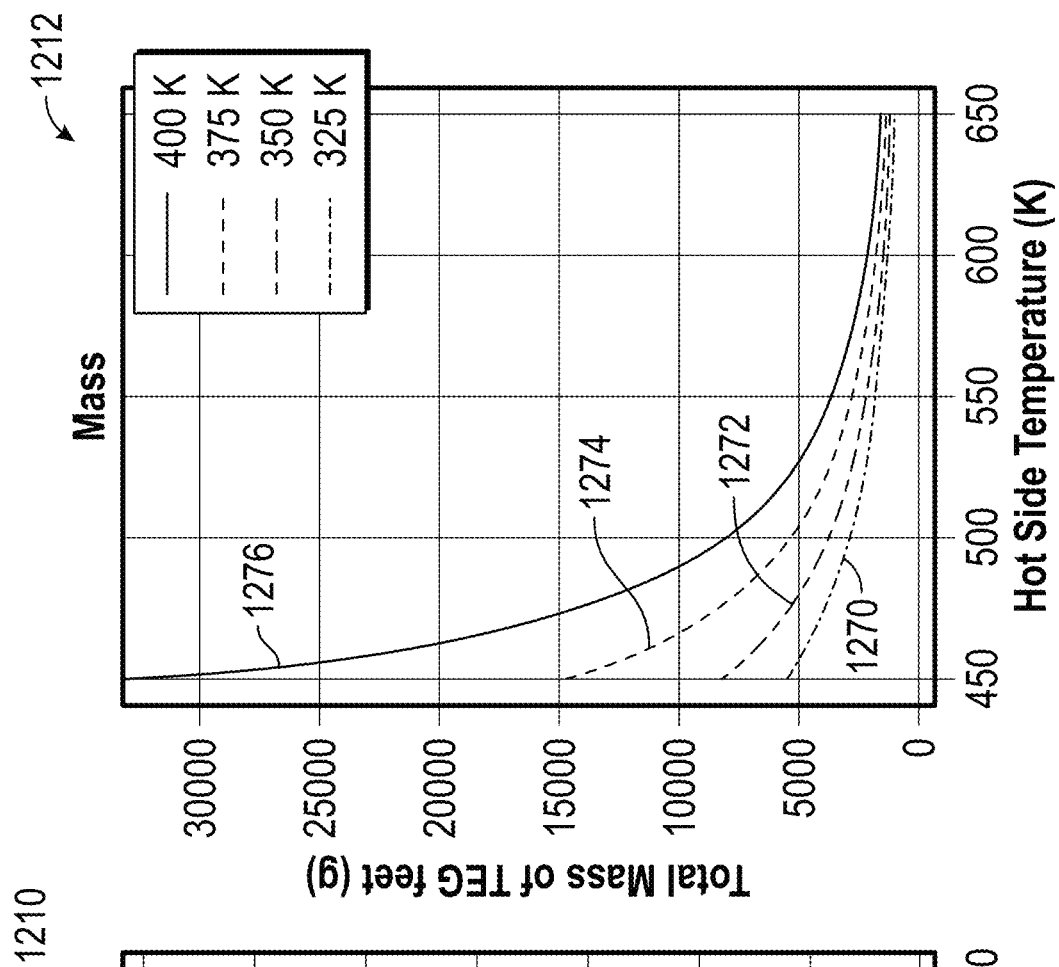
Figure 12E:
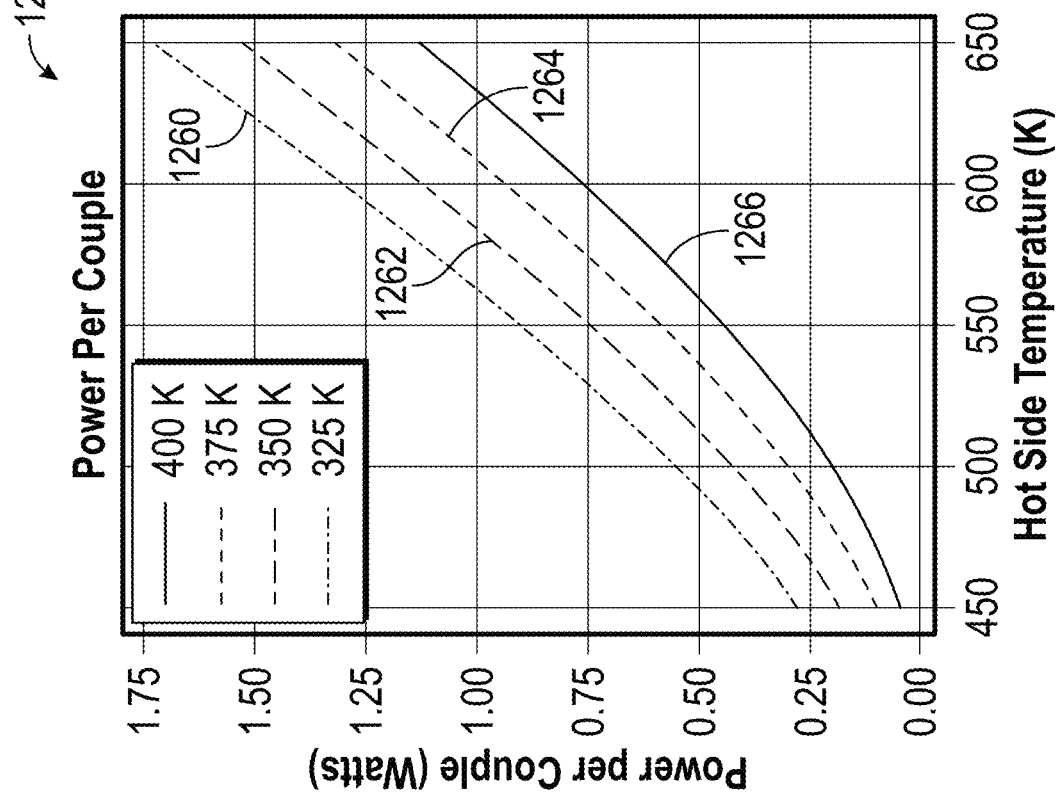

FIGS. 11A-11B illustrate charts 1100 and 1102 showing the performance of a PbTe ATEG under various temperature gradients. Variation in plot is due to temperature dependent material properties of PbTe. Chart 1100 shows PbTe ATEG with ~30% efficiency with mission temperature gradient. Chart 1100 shows the efficiency of a PbTe based ATEG as a function of hot side temperature with a cold side temperature of 325K at 1110, of 350K at 1112, of 375K at 1114, and of 400K at 1116. Chart 1102 shows the figure of merit of PbTe ATEG exceeding currently available ZT value. Chart 1102 shows figure of merit (ZT) of a PbTe based ATEG as a function of hot side temperature with a cold side temperature of 325K at 1120, of 350K at 1122, of 375K at 1124, and of 400K at 1126.

Utilizing the simulations and models derived above, a comprehensive ATEG tool was developed to determine performance characteristics and physical properties of the ATEGs. This tool has shown that these ATEGs have the capability of reaching extremely high efficiencies. Models have exceeded the expectation of reaching efficiency values of 20% with all three alpha sources. As shown in FIG. 11, one such ATEG with a PbTe as the p-type and n-type foot with a 10B(n,α) source with a conductivity multiplication factor of 50 and a 7% volume infill. At the temperature gradient for expected missions, an expected efficiency of 30% should be reachable for this ATEG. Variation in the figure of merit plot is due to the thermoelectric property dependence on temperature in PbTe. These results will enable space missions including future deep space exploration missions, that require high power density sources with no moving parts. The power derived from the ATEG can be determined from the following equations. The Seebeck coefficient is calculated according to Equation 4:

$$\alpha = \alpha_p - \alpha_n \quad (4)$$

wherein p and n denotes the p-type and n-type material and α represents the Seebeck coefficient. The total resistance of the thermoelectric couple is calculated according to Equation 5:

$$R = \frac{\rho_p L_p}{A_p} + \frac{\rho_n l_n}{A_n} \quad (5)$$

wherein ρ is the materials electrical resistance (note conductance is the reciprocal of this), L is the length of thermoelectric material, and A is the cross sectional area of the thermoelectric foot. The thermal conductivity of couple is calculated according to Equation 6:

$$\kappa = \frac{\kappa_p A_p}{L_p} + \frac{\kappa_n A_n}{L_n} \quad (6)$$

wherein κ is the thermal conductivity of the specific material. Voltage produced by the ATEG is a function of the Seebeck coefficient, ATEG resistance, load resistance and the number of couples in the ATEG. Current is dependent on the same parameters as the voltage as calculated according to Equations 7 and 8:

$$V = \frac{n\alpha(T_h - T_c)}{\frac{R_L}{R} + 1}\left(\frac{R_L}{R}\right) \quad (7)$$

$$I = \frac{\alpha(T_h - T_c)}{R_L + R} \quad (8)$$

wherein RL denotes the load resistance; maximum power is reached when the load resistance matches the ATEG internal resistance. Current, voltage and power are calculated according to Equations 9-11:

$$V = \frac{n\alpha(T_h - T_c)}{2} \quad (9)$$

$$I = \frac{\alpha(T_h - T_c)}{2R} \quad (10)$$

$$P = \frac{n\alpha^2(T_h - T_c)^2}{4R} \quad (11)$$

As shown in Equation 11, to increase power, the resistance of the system must be lowered, while Seebeck coefficient and temperature gradient must be increased. These equations can be used to determine several key parameters of the ATEG power system.

FIGS. 12A-12F illustrate charts 1202-1212 showing performance characteristics of an ATEG system that produces 3 kW of electrical power, noting that masses are of the ATEG only and do not represent overall power production system. ATEG feet used at n-type and p-type PbTe with 7 vol % infill and a 40 times conductivity multiplier. Chart 1202 shows the number of thermoelectric couples used to provide 3 kw of electric power as a function of hot side temperature. Four cold side temperatures were used to form the four different lines, with a cold side temperature of 325 K at 1220, of 350 K at 1222, of 375 K at 1224, of 400 K at 1226. For low temperature differences, more couples are needed. Chart 1204 shows the total current flowing through the ATEG as a function of hot side temperature for four different cold side temperatures, with a cold side temperature of 325 K at 1230, of 350 K at 1232, of 375 K at 1234, of 400 K at 1236. Chart 1206 shows specific power (i.e. how many watts of electrical power can be produced per kg of ATEG converter) of the system as a function of hot side temperatures for four different cold side temperatures, with a cold side temperature of 325 K at 1240, of 350 K at 1242, of 375 K at 1244, of 400 K at 1246. Chart 1208 shows power density (i.e. how many watts of electrical power can be produced per square centimeter of ATEGs laid out over the heat source) of the system as a function of hot side temperature for four different cold side temperatures, with a cold side temperature of 325 K at 1250, of 350 K at 1252, of 375 K at 1254, of 400 K at 1256. Chart 1210 shows power generated in each thermoelectric couple in the array as a function of hot side temperature for four different cold side temperatures, with a cold side temperature of 325 K at 1260, of 350 K at 1262, of 375 K at 1264, of 400 K at 1266. Chart 1212 shows total mass of the thermocouple feet, not counting mounting, housing, etc. necessary to generate 3 kW as a function of hot side temperature for four different cold side temperatures, with a cold side temperature of 325 K at 1270, of 350 K at 1272, of 375 K at 1274, of 400 K at 1276

In charts 1202-1212, the mass of the ATEG is determined through the physical properties of the ATEG feet materials and current ATEG technologies (primarily for the insulators, conducive connectors, and solder). This results in a high specific power as only the weight of the ATEGs are taken into consideration with this calculation. The ATEG conversion system mass is miniscule compared to the reactor mass and the ATEG collects a large amount of power for a given surface area. Calculations for the figure above only take into account ATEG couples connected in series. A more realistic system would see ATEGs connected in a system of series and parallel connections to introduce some redundancy within the system in case of failures in the ATEG coupler connections. This arrangement would increase system mass slightly, but does not appear to be a major system driver. In some of the ATEG materials, the addition of the RIC filler actually decreases the mass of the system slightly, specifically with 10B which is much lighter than most of its ATEG matrices.

These systems were also validated in the computer program COMSOL to show how an increase in conductivity may affect an assembled ATEG. The material conductivity values were changed in a similar manner to show the RIC particles would affect the thermoelectric generator.

Figure 13A:
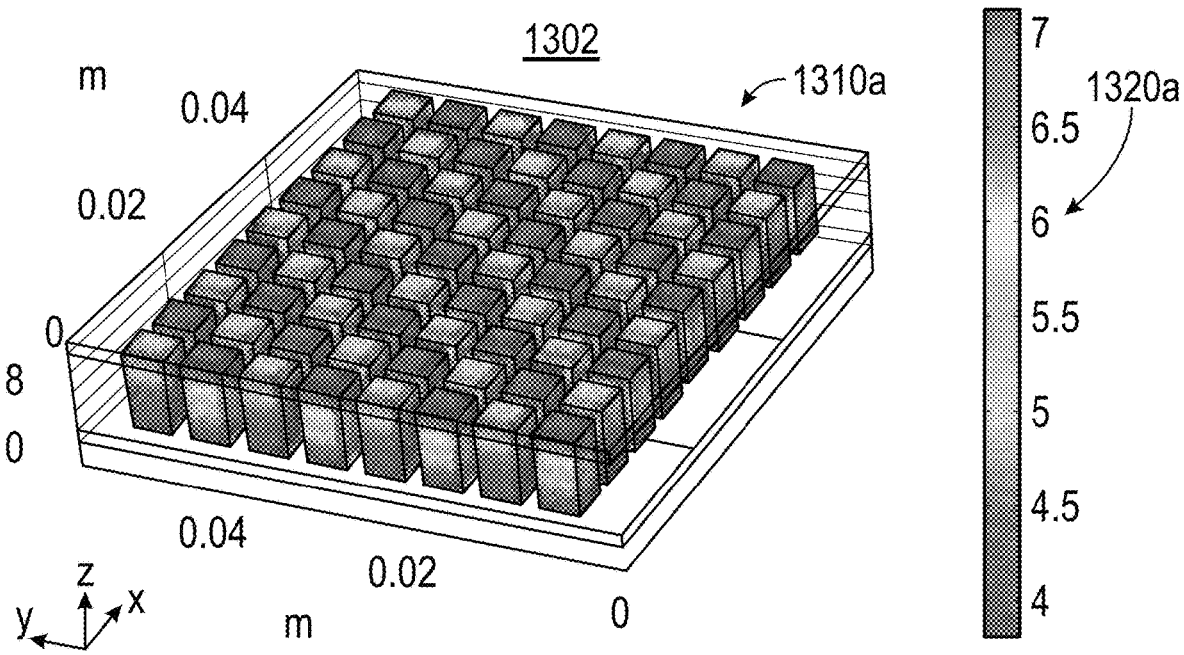
FIGS. 13A through 13F illustrate COMSOL simulations of a bismuth telluride (Bi2Te3) p-type and n-type ATEG with applied conductivity changes ranging from 5 to 100.
Figure 13B:
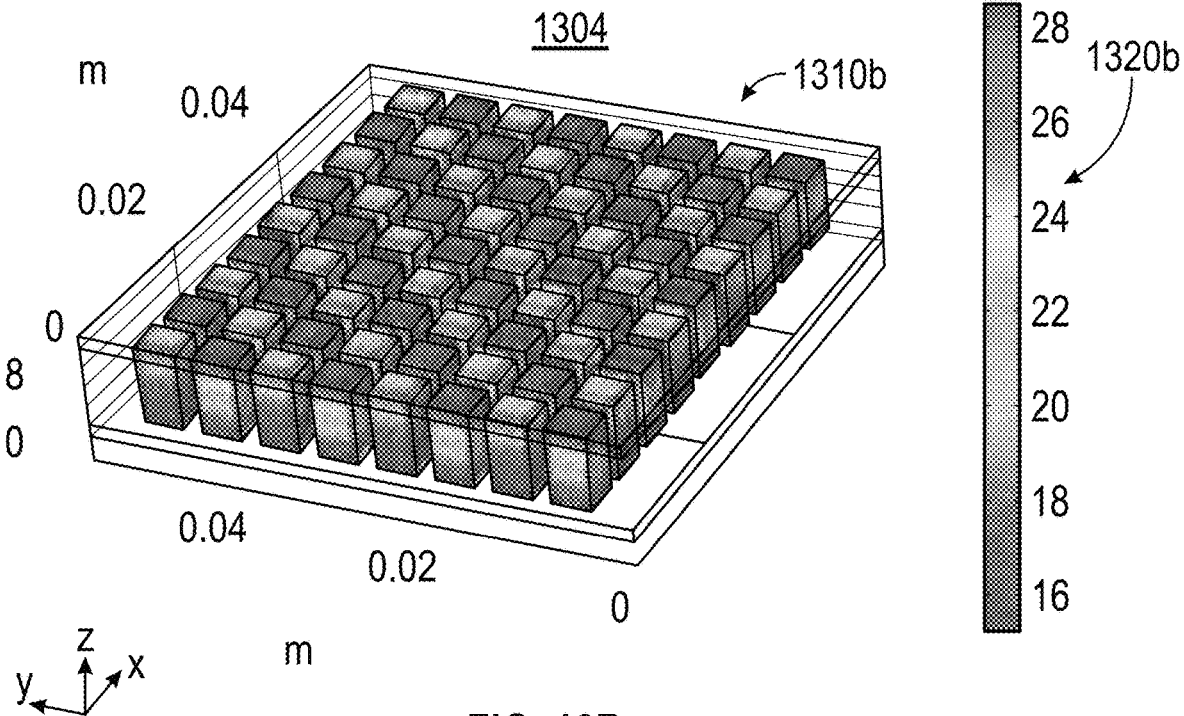
Figure 13C:
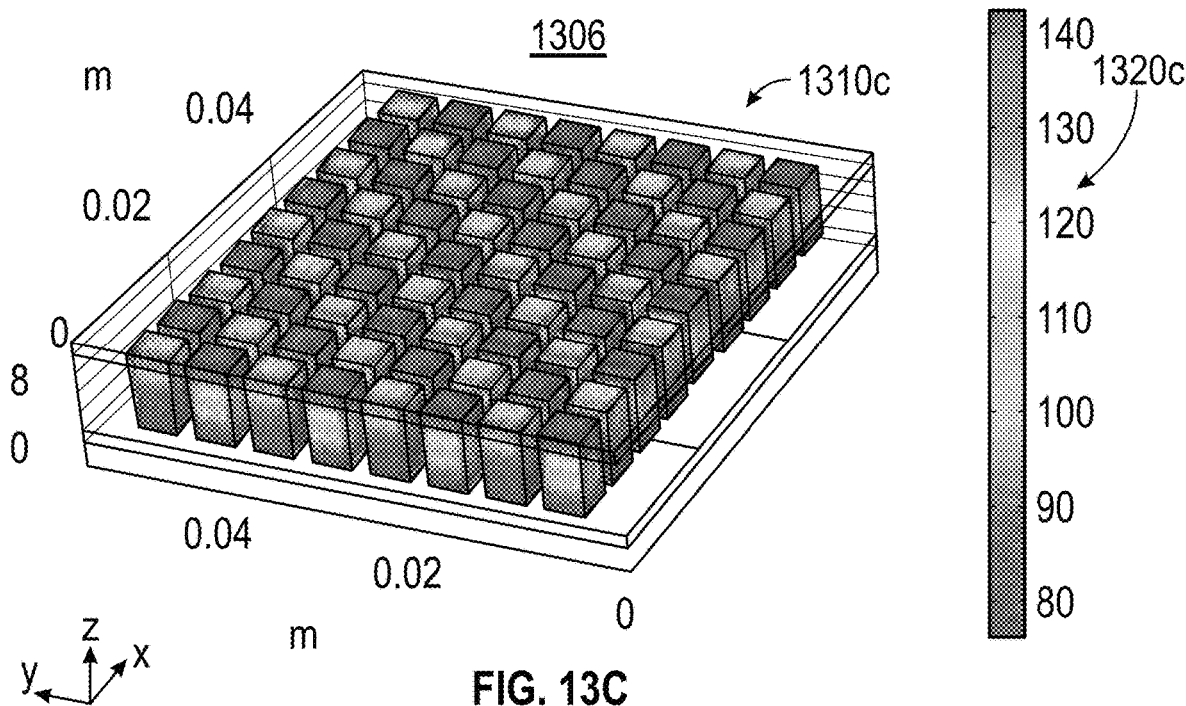
Figure 13D:
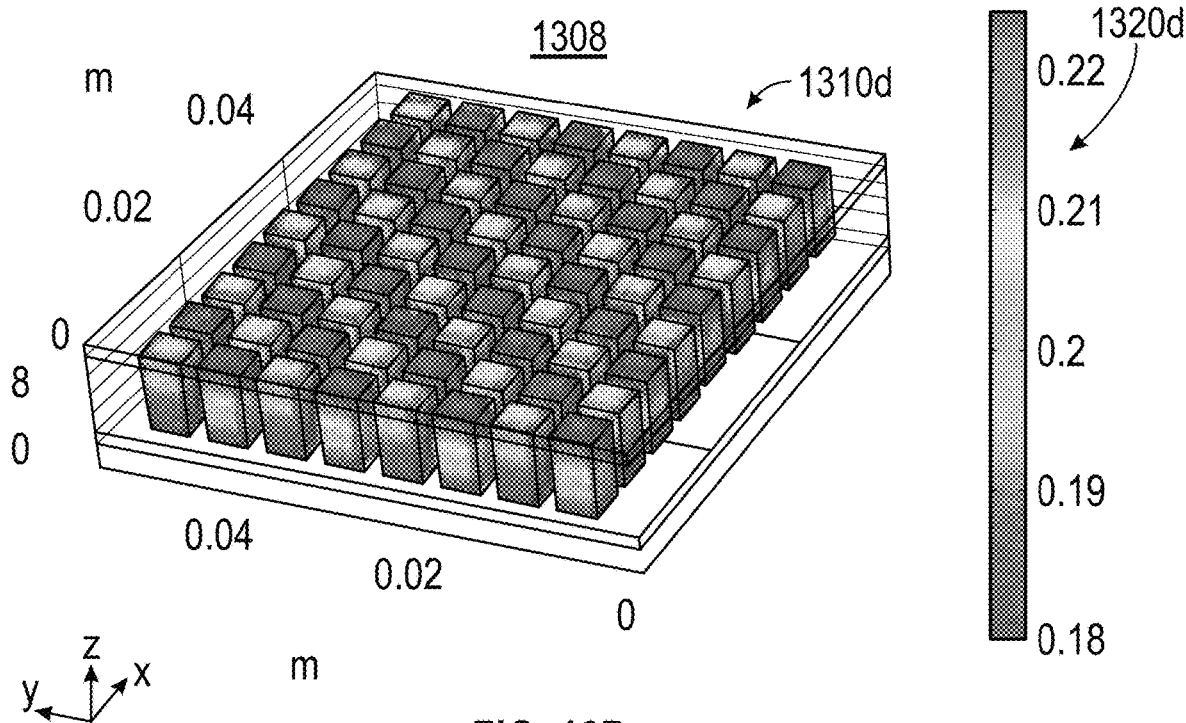
Figure 13E:
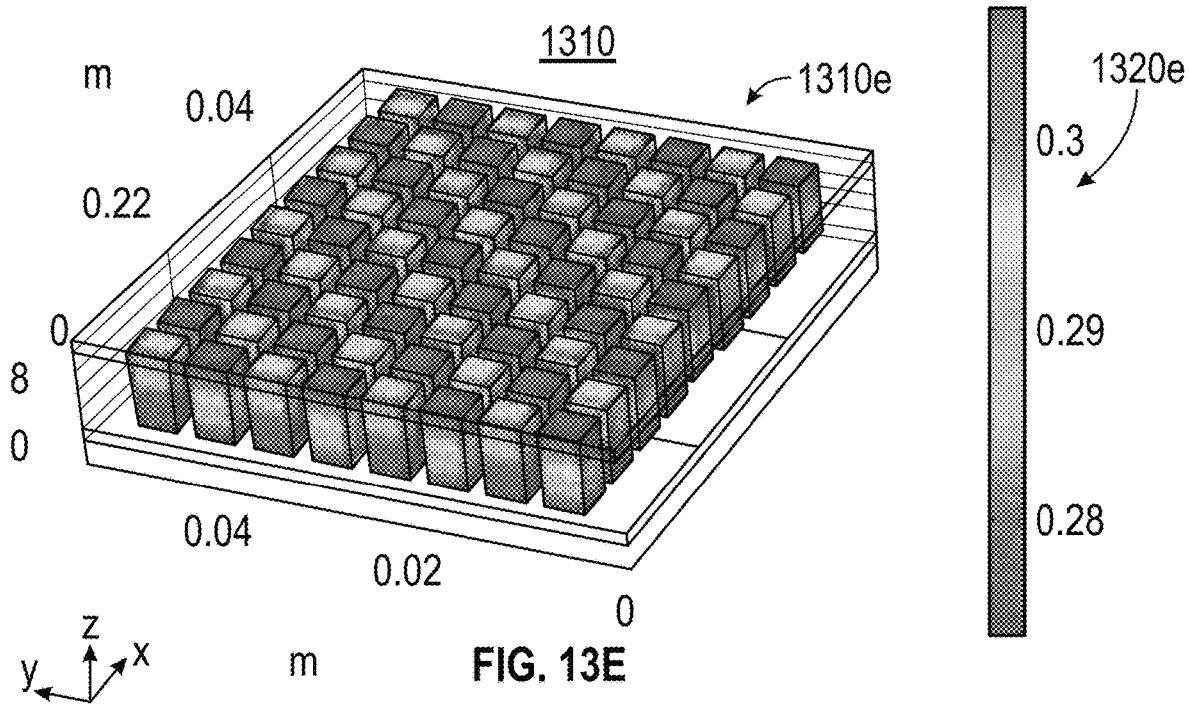
Figure 13F:
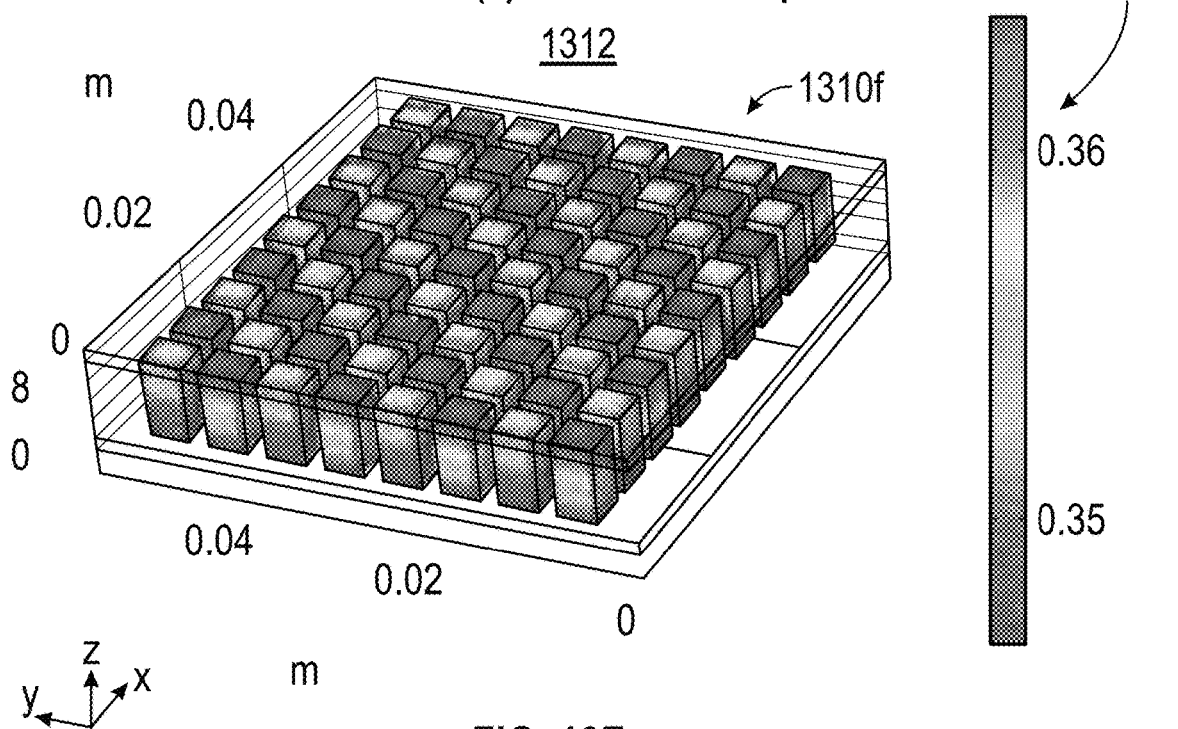

FIGS. 13A-F illustrate COMSOL simulations 1302-1312 of a bismuth telluride ($Bi_2Te_3$) p-type and n-type ATEG with applied conductivity changes ranging from 5 to 100. Large increases in figure of merit and the efficiency can be seen in the figure with the figure of merit (ZT) being shown on the top three images of FIGS. 13A-C. Figure of merit for a 5 times conductivity multiplier of the electrical conductivity of the material is shown at 1302 with scale 1320a showing values for various areas and showing maximum values of change of 7 in the image. Figure of merit for a 20 times conductivity multiplier of the electrical conductivity of the material is shown at 1304 with scale 1320b showing values for various areas and showing maximum values of change of 28 in the image. Figure of merit for a 100 times conductivity multiplier of the electrical conductivity of the material is shown at 1306 with scale 1320c showing values for various areas and showing maximum values of change of 140 in the image. The maximum values change from 7 to 28 to 140 in the three images. Thus, the ZT value for each multiplier increases well beyond the ZT values of any other material. The bottom three images of FIGS. 13D-F shown at 1308, 1310, and 1312 have the same electrical conductivity multipliers as above, but instead of modeling the ZT value efficiency (measured as the ratio of electrical power generated over the thermal power passing through the foot) is listed. Efficiency for a 5 times conductivity multiplier of the electrical conductivity of the material is shown at 1308 with the scale to the right (at 1320d) showing the maximum efficiency value reaching 0.22. Efficiency for a 20 times conductivity multiplier of the electrical conductivity of the material is shown at 1310 with the scale to the right at 1320e showing the maximum efficiency values reaching 0.3. Efficiency for a 100 times conductivity multiplier of the electrical conductivity of the material is shown at 1312 with the scale to the right at 1320f showing the maximum efficiency values reaching 0.36. These values of maximum efficiency are well beyond traditional TEG values. Original figures of merit and efficiency were between 0.8 and 1.4 and 8-11%. Here, the figure of merit and the efficiency changed as the degree of conductivity change was increased. It should be noted that the original figure of merit range was between 0.8 and 1.4 for this ATEG combination of bismuth telluride p-type and n-type while the efficiency varied between 8-11%. Even with a conductivity increase of only 5×, the figure of merit and efficiency increased to between 4-7 and 18-22%. Larger increases in efficiency and figure of merit are seen with modest increases well below literature values, including values reported from other studies or existing units. NASA MMRTG has an efficiency of 5-7%.

Experimental Results

Experiments were conducted to validate radiation induced conductivity in potential thermoelectric materials. While the most heavily documented RIC cases have involved aluminum oxide and other insulators, none of them contained 10B for an alpha source. Boron nitride (BN) was chosen as the material to be tested for its potential to demonstrate the key concept of the (n,α) source, and that it is considered a wide band gap insulator. Within the BN, 20% of the boron content would comprise 10B which should have a uniform distribution throughout the compound. A TRIGA Mark II Nuclear Research Reactor at Kansas State University (KSU) was used as a neutron source to generate the alpha particles. Leads were attached to the BN sample to take insitu conductivity measurements while the reactor was being operated. Contained within a polyethylene container, the BN sample was subjected to the neutron flux at various power levels to determine its resistive response.

Figure 14:
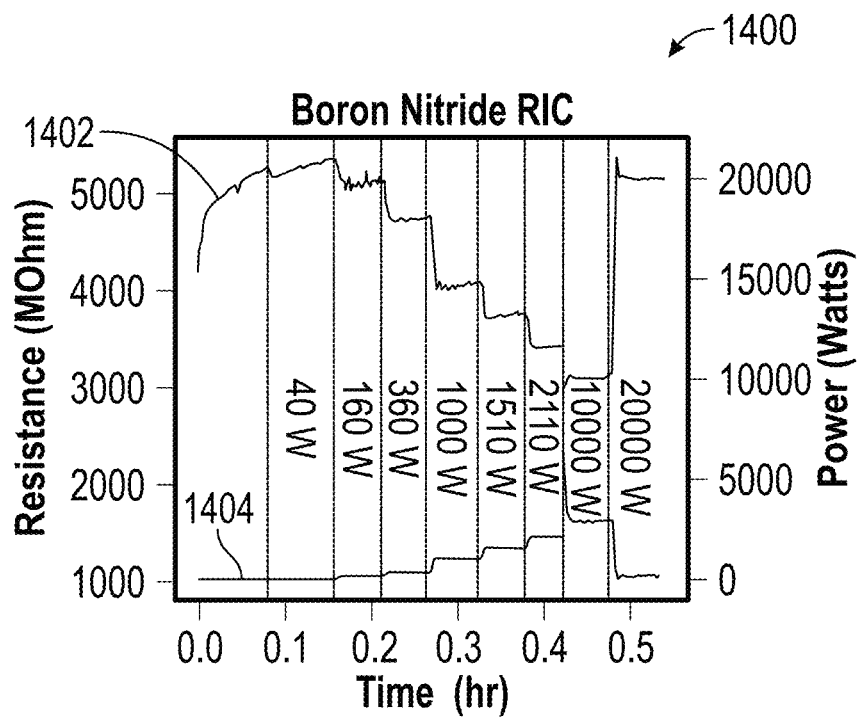
FIG. 14 illustrates a chart showing Boron Nitride resistance effects due to neutron flux from nuclear reactor.

FIG. 14 illustrates chart 1400 showing Boron Nitride resistance effects due to neutron flux from nuclear reactor. Clear dependence on neutron flux is shown as resistance decreases with increases in power. This is evidenced, for example, as the neutron flux in the reactor increases proportionately to the power of the reactor. As the reactor power increases, so does the neutron flux to which the sample is exposed. The chart shows the electrical conductivity decreasing every time the power of the reactor is increased. FIG. 14 shows the power between 0 W to 20 kW of thermal power. An insulation resistance meter was utilized to determine the resistance of the material. The initial resistance of the sample was just over 4 GΩ and slowly rose to above 5 GΩ before the RIC effects were visible. This effect is visible in FIG. 14 with power intervals marked between dashed lines. Insulators typically exhibit an increase in resistivity as they are measured from capacitive effects which was observed during this experiment and previous experiments observed without a neutron flux. An initial decrease in resistance is observed as the reactor is stepped up to 40 Watts. As the reactor power increases to 160 Watts, a more noticeable drop in resistance is visible. This trend continues as the power/neutron flux increases. Larger jumps in resistance appear to be more prevalent at lower increases in power. As shown in FIG. 14, 1402 shows resistance values of boron nitride as a function of time during a test that gradually increased reactor power and dose to the material and 1404 shows reactor power as a function of time.

Figure 15:
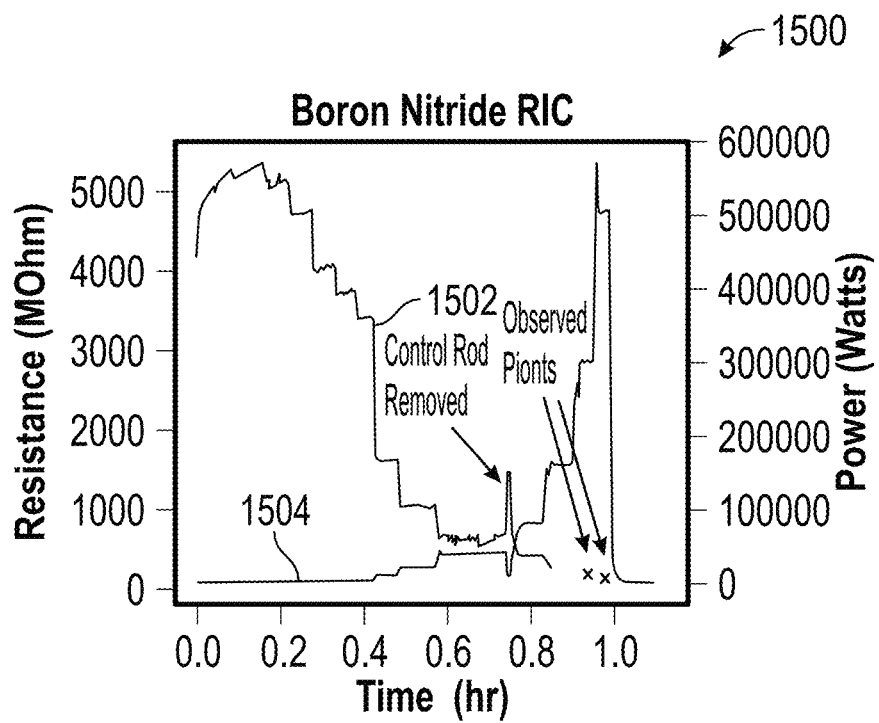
FIG. 15 illustrates a chart showing Boron Nitride complete test up to ½ Mega-Watt (MW) power level observing ~50 times conductivity multiplier.
Figure 16A:
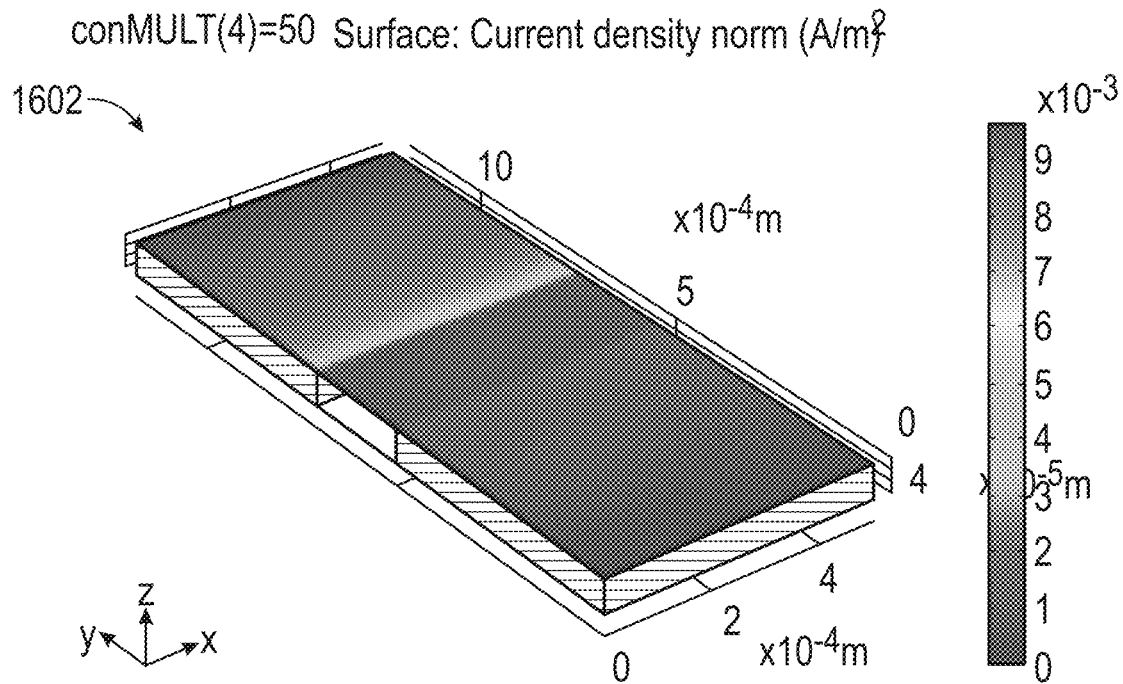
FIGS. 16A through 16I illustrate COMSOL modeling results for BN thermoelectric junction for conductivity multipliers of 1, 30, and 50×.
Figure 16B:
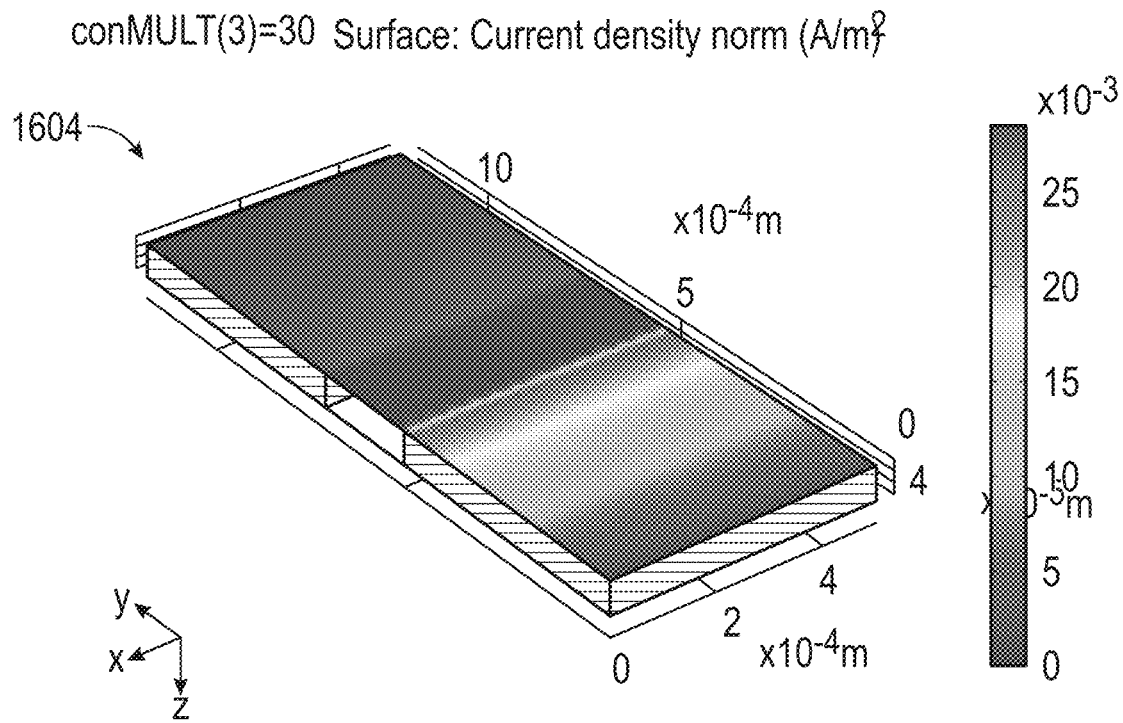
Figure 16C:
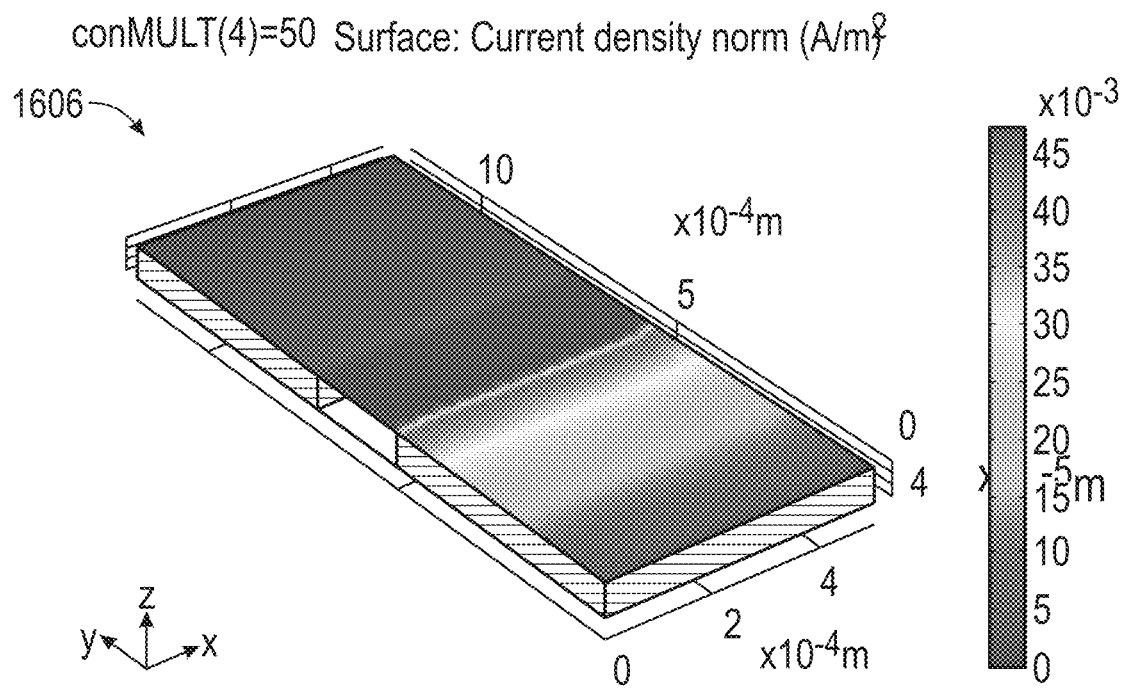
Figure 16D:
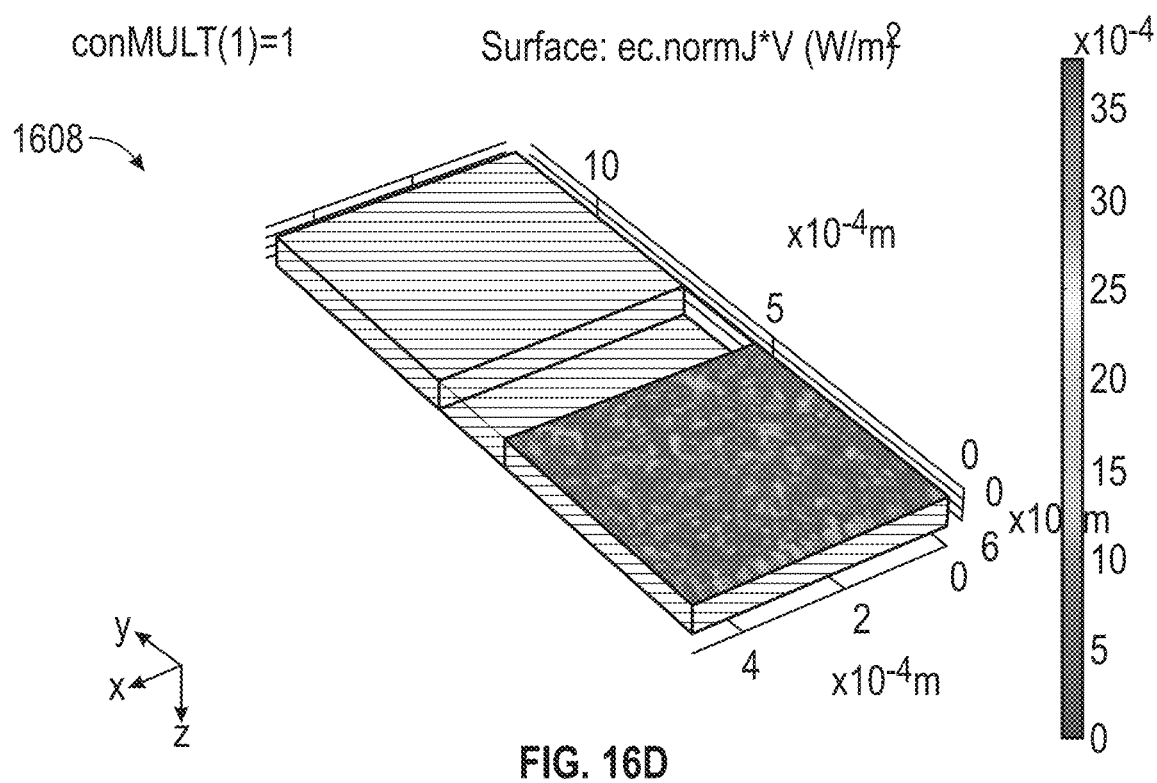
Figure 16E:
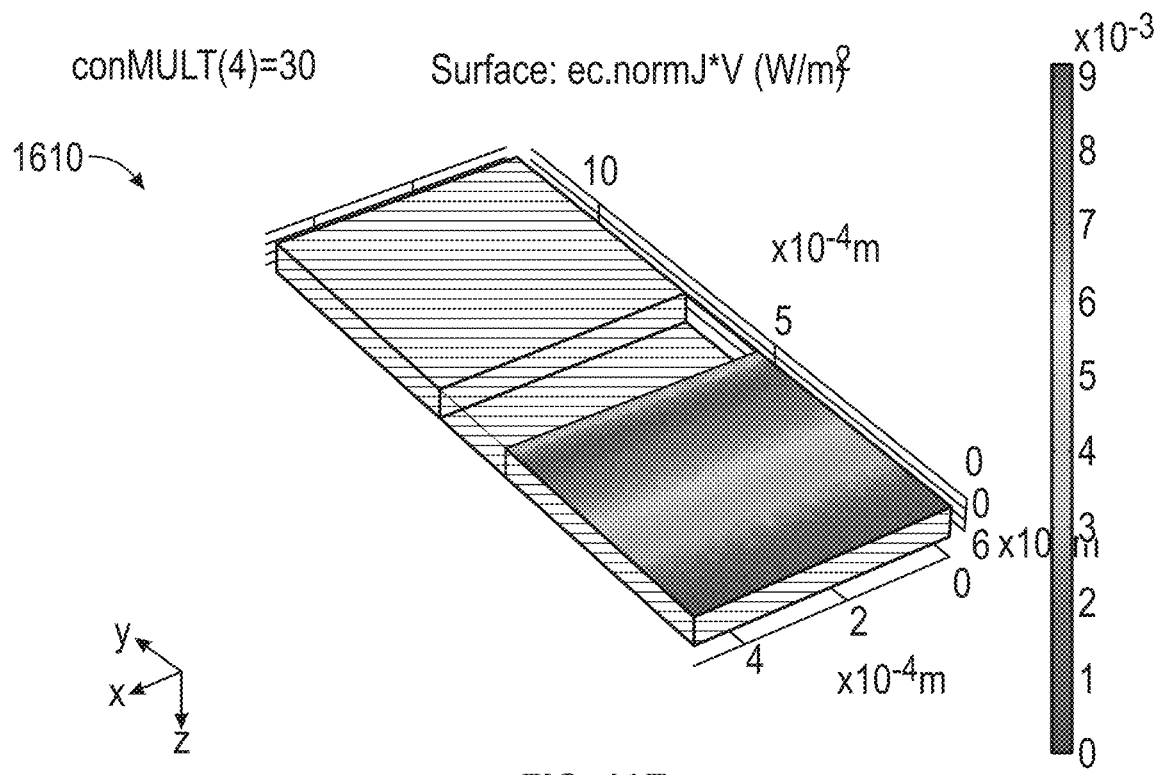
Figure 16F:
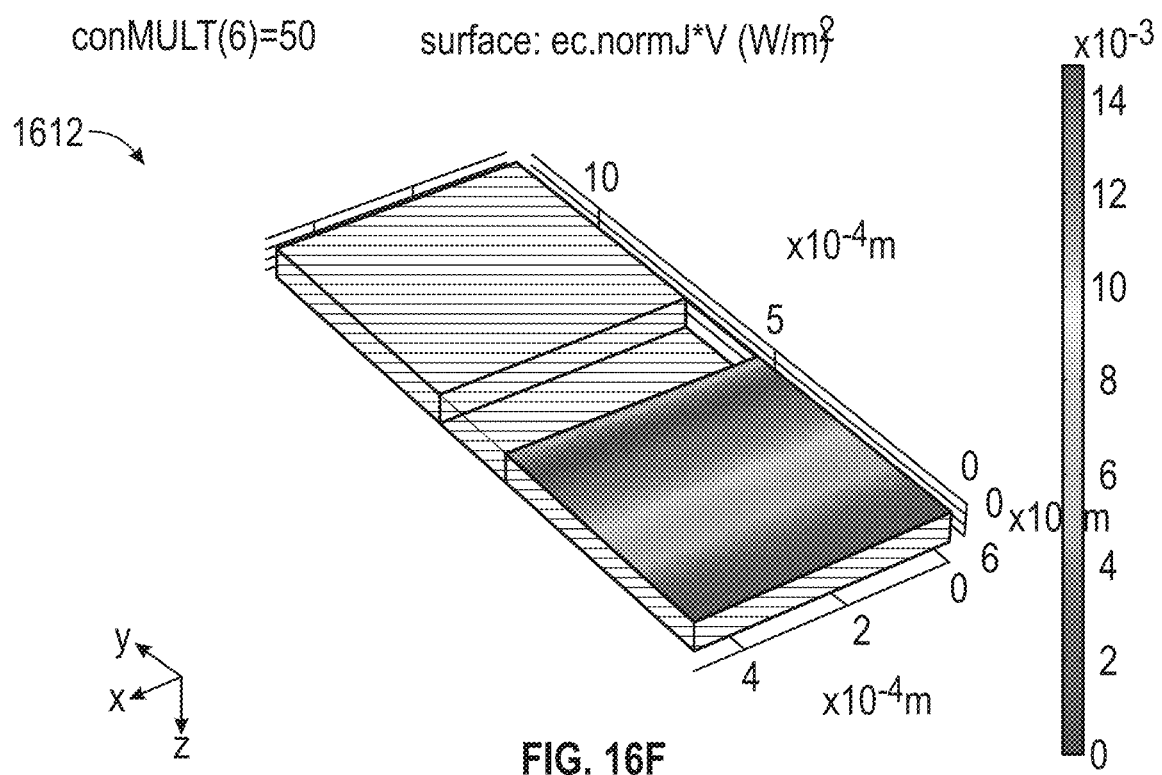
Figure 16G:
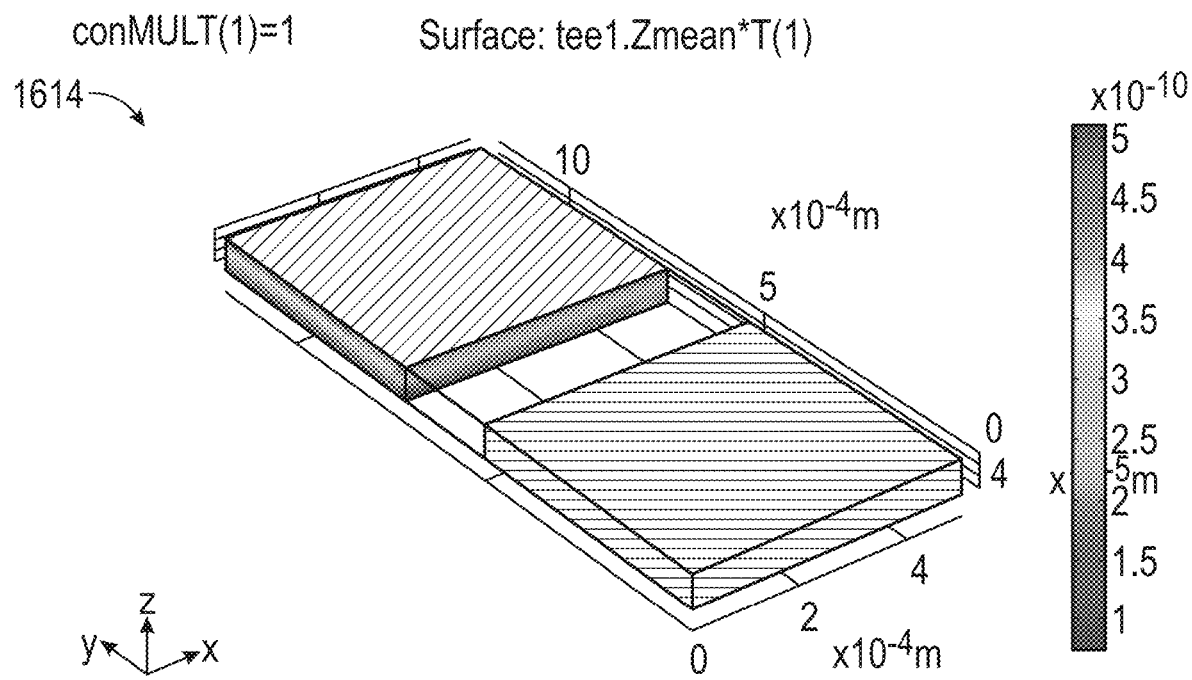
Figure 16H:
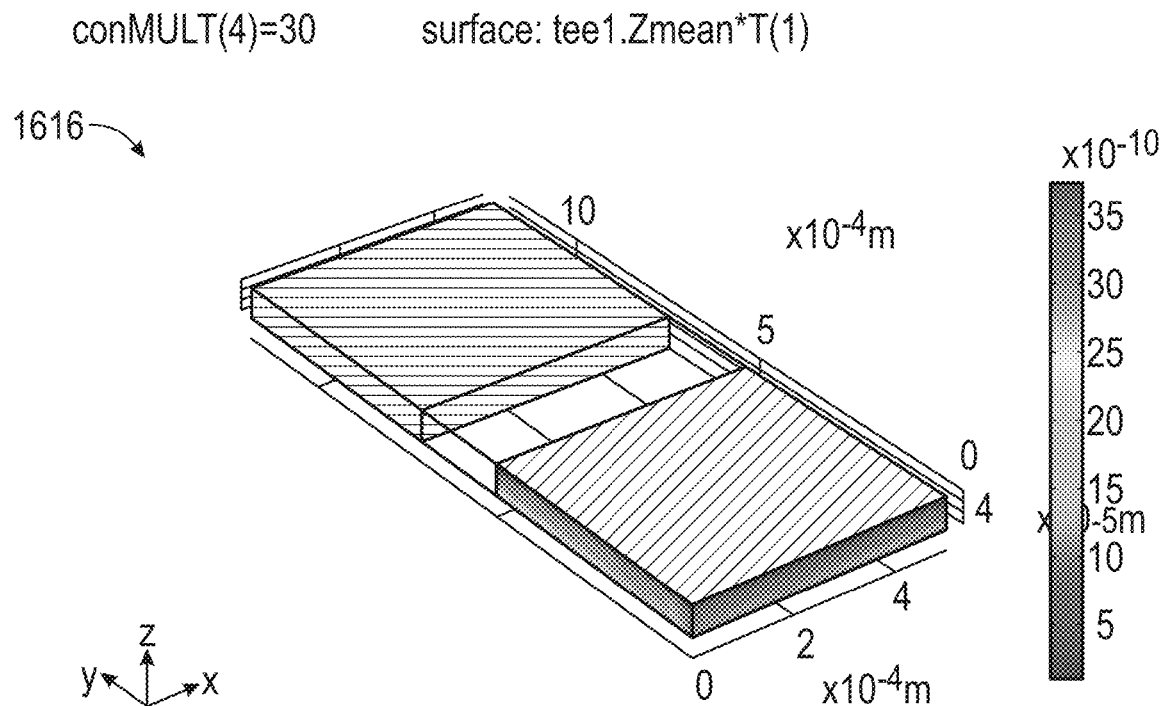
Figure 16I:
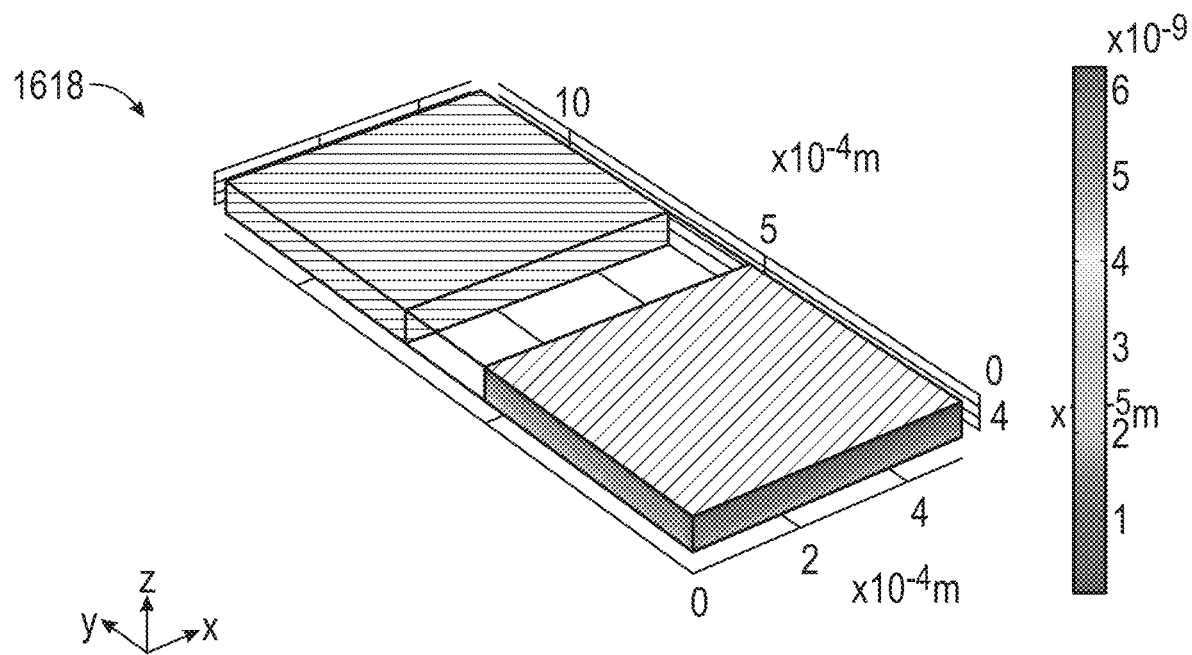

FIG. 15 illustrates chart 1500 showing Boron Nitride complete test up to ½ Mega-Watt (MW) power level observing ~50 times conductivity multiplier. Previous data shows that a 50 times conductivity multiplier is more than suitable to significantly change the performance of an ATEG. Boron Nitride was tested up to ½ MW to determine the ATEG's resistance response at this power/flux level. As shown in FIG. 15, at 1502 resistance values of boron nitride as a function of time during a test that gradually increased reactor power and dose to the material and at 1504 reactor power as a function of time. As shown in FIG. 15, the entire test was conducted over the course of one hour. After the reactor reached a level of 20 kW and was held for a short period of time, a control rod was removed as the reactor was ramped up to 40 kW. This caused a decrease in reactor power which also resulted in an increase in conductivity. This again shows an extremely responsive relationship to the reactors power level/neutron flux. Power levels were increased again to 80 kW, 160 kW, 300 kW and finally 540 kW. During this time the resistance meter stopped recording but continued to display resistance. Personnel, except the reactor supervisor, were stationed inside of the control room and away from the meter and were unable to manually restart it. However, the reactor supervisor relayed data points at 300 kW and 540 kW, which were 183 MOhm and 140 MOhm respectively. These points have been marked on FIG. 15 to show their respective position at that power level. It is clear from these plots that the increase in conductivity is not linear with the increase in power. At smaller activity levels within the reactor, there were larger gains in conductivity observed. This shows that large changes in conductivity are likely especially at power/flux levels that the SPEAR reactor may produce. While BN is not typically used as a thermoelectric material, there have been several studies that show its potential.

Although the 400-10,000× increase in electrical conductivity was not observed by the BN in this experiment, there was at least a ~50× increase in electrical conductivity observed. Referencing FIG. 15, this slight increase in conductivity could be enough to reach efficiency values greater than 20% depending on other material properties.

FIGS. 16A through 16I illustrate COMSOL modeling results 1602-1612 for BN thermoelectric junction for conductivity multipliers of 1, 30, and 50×. Current density, power levels, and ZT values all improve drastically with the increased conductivity values measured at the KSU reactor. With a highly resistive material, the efficiency of the thermoelectric generator is small. However, there should be a slight but noticeable change in voltage/power/current from the ATEG couple. While Seebeck coefficients for most thermoelectric and semiconductors are known, Seebeck coefficients for insulators are less studied, therefore Seebeck coefficients for BN were estimated from literature values. COMSOL was used to simulate an ATEG couple that could produce power on the micro-Watt scale based on known and estimated thermoelectric properties of BN. The results of this brief study are visible in FIGS. 16A through 16I. Voltage is not shown, as this is dependent on the Seebeck coefficient and maintained a consistent 0.4V drop. All simulations were conducted with a 600 K hot side and a 350 K cold side. From this model, it can be seen that there are noticeable changes to current, power levels, and ZT values with increases in conductivity. BN, pending further investigation into Seebeck coefficient, is considered the p-type foot, while the ntype foot was modeled as SiGe. As shown in FIGS. 16A through 16I, the top, middle, and bottom rows are measuring the electrical current, power generated, and ZT values, respectively. The left, middle, and right columns change the electrical conductivity by a factor of 1, 30, and 50 times the original value. The material in question is boron nitride. The simulation shows that the current, power, and ZT all increase greatly with the changes measured from the experiment. As shown in FIGS. 16A through 16I, 1614 indicates ZT values of the junction for a conductivity multiplier of 1, 1616 indicates ZT values of the junction for a conductivity multiplier of 30, and 1618 indicates ZT values of the junction for a conductivity multiplier of 50.

ATEG Materials

Many of the thermoelectric materials described in the sections above must be created via spark plasma sintering (SPS) if they are to be created with the radioisotope or the (n,α) if not already embedded within the material. However, several thermoelectric materials with 10B(n,α) have already been studied and can be obtained for future experiments. A few thermoelectric materials containing BN in the form of quantum dots, thin films, and nano-ribbons/tubes have been studied. This is advantageous as our BN based system takes bulk BN material and increases its electrical conductivity significantly.

Figure 17:
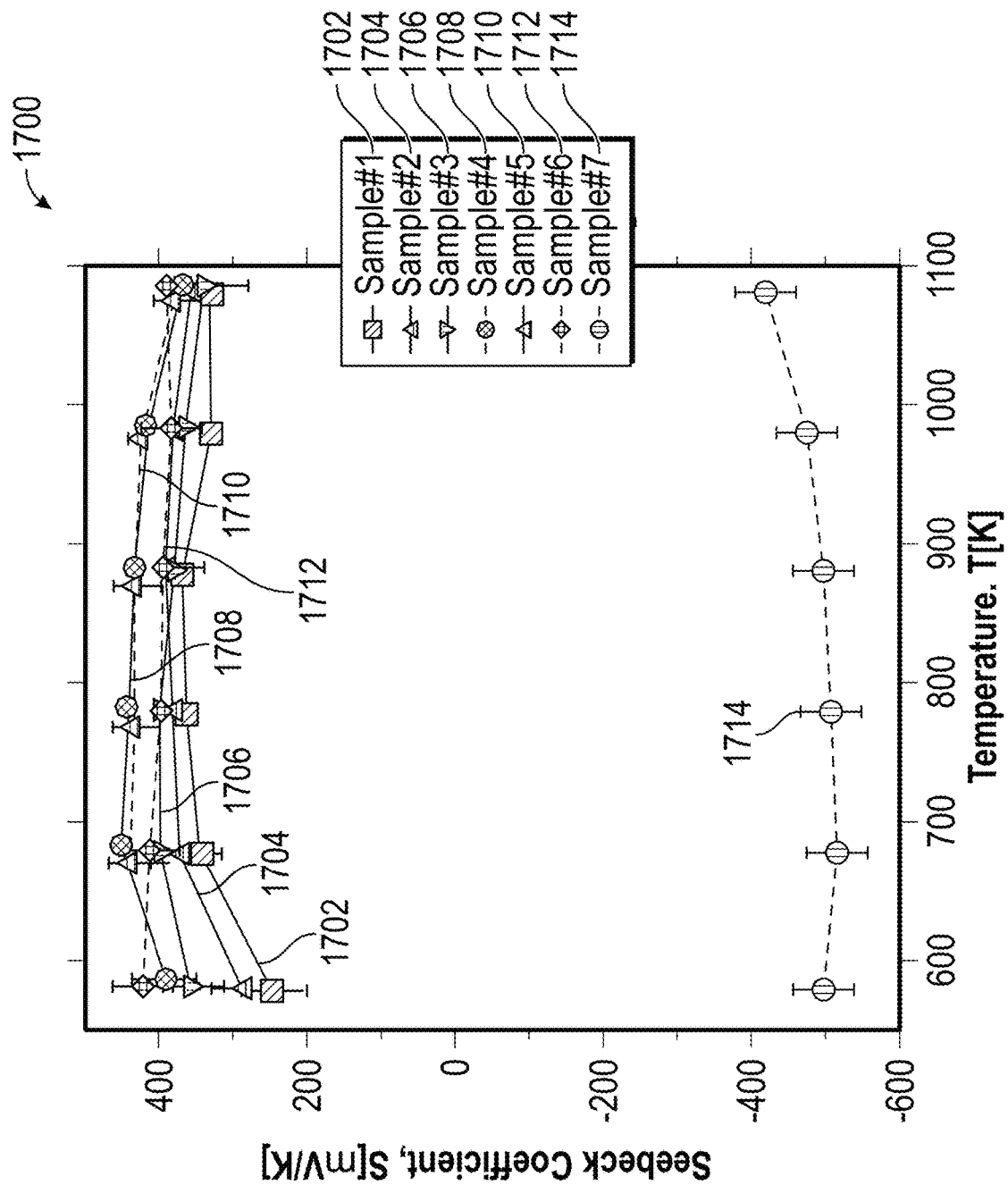
FIG. 17 illustrates a chart showing Seebeck coefficient of boron based thermoelectric materials.
Figure 18:
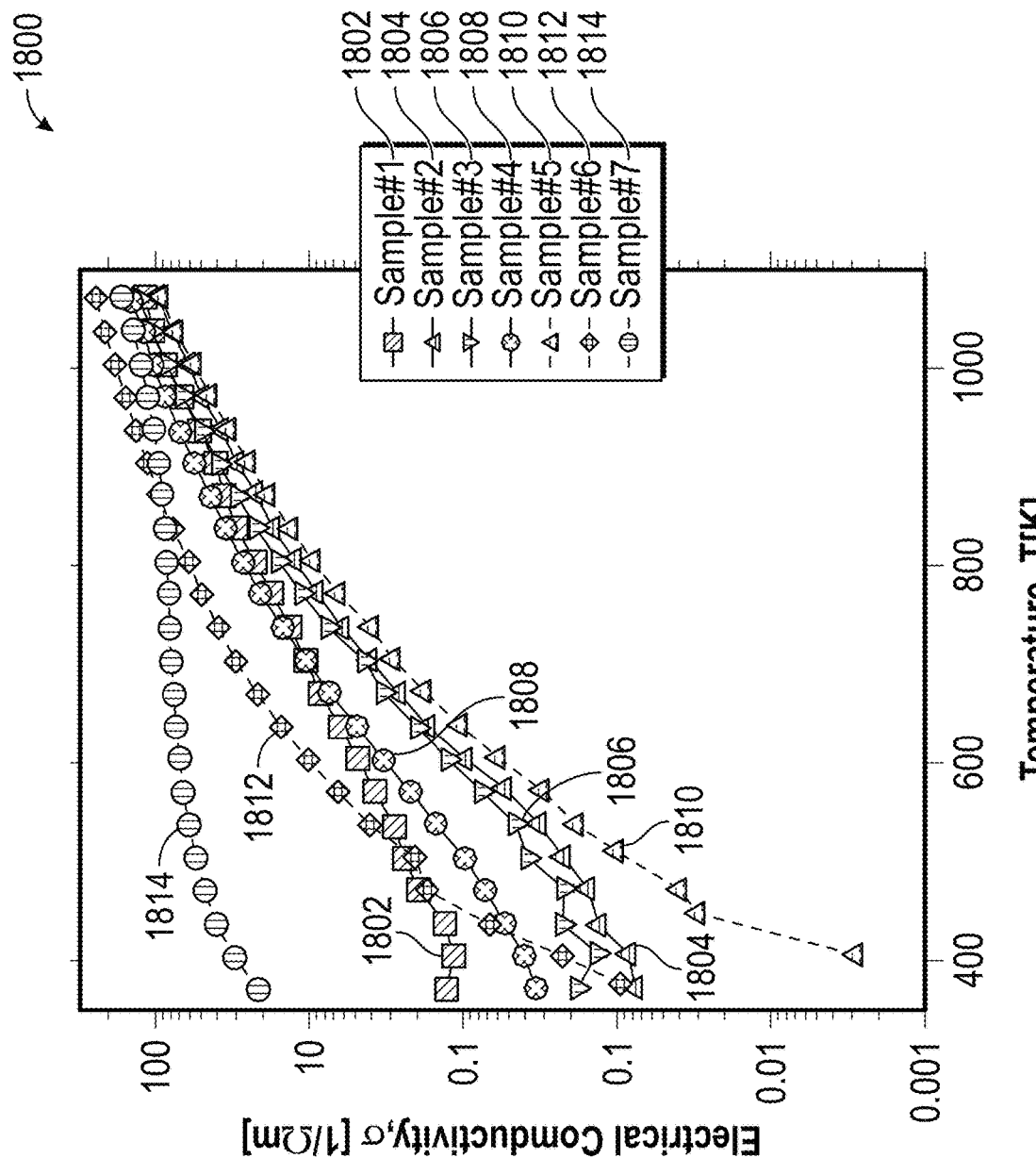
FIG. 18 illustrates a chart showing response of electrical conductivity of showing boron based thermoelectric materials.

FIG. 17 illustrates chart 1700 showing Seebeck coefficient of boron based thermoelectric materials shown as sample numbers 1702, 1704, 1706, 1708, 1710 1712, 1714. These materials are predicted to behave exemplary when augmented with RIC. FIG. 18 illustrates chart 1800 showing response of electrical conductivity of showing boron based thermoelectric materials shown as sample number 1802, 1804, 1806, 1808, 1810, 1812, 1814. AZT of 2.5 is possible with graphene/h-BN (hexagonal BN) superlattice monolayers. If the changes in conductivity observed from the KSU experiment hold true for BN to this superlattice, a ZT potential of greater than 100 is theoretically possible which corresponds to an efficiency of 35% with SPEAR's temperature gradient. This would far exceed any thermoelectric technologies currently available. In another study conducted by Algharagholy et al. involving graphene-boron nitride hetero-structures of various widths a ZT value of 0.9 was theoretically possible. Again, if the same change in conductivity is observed as the BN experiment, this would result in a ZT value of >40 corresponding to a 32% efficiency. It would appear that despite BN's poor bulk thermoelectric properties, their use inside the technologies above can increase ZT values to usable levels, and potential RIC behavior cross over to these materials can accelerate these values beyond what was previously thought possible. The current record ZT value of 7.4 was measured in hybrid MoS2/MoSe2 nanoribbons at 800 K by Ouyang et al. The disclosed ATEG technologies and projections with BN alone would significantly pass this record.

Other materials containing boron have been extensively studied for their potential use in thermoelectric generators. Many of them are on the cusp of high ZT values, most being held back by lower than average electrical conductivities for thermoelectric materials. One such material, AlMgB14 has been shown to have high Seebeck coefficients and moderate electrical conductivities based on its mixture ratios. Miura et al. has shown that AlMgB14 can reach Seebeck coefficients in upwards of 250-450 μV/K which is competitive with most thermoelectric materials. Through slight changes in material composition during the SPS process, Miura et al. was able to create an AlMgB14 sample with a −500 μV/K Seebeck coefficient—meaning that an ATEG could be created with virtually the same material, limiting issues with thermal expansion coefficients and other stresses that the ATEG might endure with varying ATEG feet. The varying Seebeck Coefficient and electrical conductivity is visible in FIGS. 17-18 (for additional information, see S. Miura, H. Sasaki, K.-i. Takagi and T. Fujima, "Effect of varying mixture ratio of raw material powders on the thermoelectric properties of AlMgB14-based materials prepared by spark plasma sintering," Journal of Physics and Chemistry in Solids, vol. 75, no. 8, 2014). The Seebeck coefficients are very high for alumina, however, the electrical conductivity is much lower compared to traditional thermoelectric materials such as PbTe and SiGe. While the electrical conductivity restricts the efficiency of alumina, it has been shown that slight changes in its composition can have drastic changes in these levels. Combined with RIC enhancing effects, this could result in a much higher efficiency and ZT value. AlMgB14 is also advantageous in that the materials are not considered rare earth borides (REB) making production cheaper and more sustainable on a larger scale.

While AlMgB14 has a great potential for thermoelectrics at a sustainable and economical price point, there are several other REBs that sit on the cusp of advancing thermoelectric technologies. Materials identified with the greatest potential for ATEG feet include ErB44Si2, YB66, YB44Si2, SmB60, SmB62, TbB44Si2, and ErB66. The thermoelectric properties of these materials can be found in TABLE 2. While these materials are not currently considered high performing TEGs, with modification to their electrical properties via RIC they can reach high ZT values making them promising candidates for ATEGs. Embodiments further contemplate lithium- or sulfur-containing materials which absorb neutrons and emit ionizing radiation. Fission products or other elements which emit alpha, beta, gamma, neutron, or other ionizing radiation may also be used to induce the RIC.

TABLE 2

| Material | Seebeck Coefficient | Thermal Conductivity | Electrical Resistance |
|---|---|---|---|
| $ErB_{44}Si_2$ | 50-220 [37] | 1.6-2.7 [37] | 0.0087-135 [38] |
| $YB_{66}$ | 205-752 [39] | 2.49-3.74 [39] | 0.0035-157 [39] |
| $YB_{44}Si_2$ | 80-200 [38] | ~2.7 [38] | 9e−4-0.02 [38] |
| $SmB_{60}$ | 197-567 [39] | 2.53-3.17 [39] | 1.33e−4-0.332 [39] |
| $SmB_{62}$ | 207-557 [39] | 2.06-2.76 [39] | 1.54e−4-0.625 [39] |
| $TbB_{44}Si_2$ | 70-140 [38] | ~2.7 [38] | 9e−4-0.0045 [38] |
| $ErB_{66}$ | 200-700 [38] | ~2.7 [38] | 0.0085-207 [38] |

TABLE 2 shows material properties for various rare earth borides that can potentially be used as advanced thermoelectric generators, with Seebeck coefficient in V/k, Thermal conductivity in w/m*k, electrical resistance in Ohm*m. These materials are mostly held back due to their higher electrical resistivity compared to traditional TEG materials. It is predicted that they may behave more like an insulator than traditional TEG materials so changes in conductivity should be more noticeable. Small changes in conductivity are enough to achieve noticeably large increases in efficiency. As shown in TABLE 2, bracketed reference is T. Mori, "High Temperature Boron-based Thermoelectric Materials," Material Matters, vol. 4, no. 2, 2011, bracketed reference is T. Mori, "High temperature thermoelectric properties of B12 icosahedral cluster-containing rare earth boride crystals," Journal of Applied Physics, 2005, and bracketed reference is A. Sussardi et. al, "Enhanced thermoelectric properties of samarium boride," Journal of Materiomics, vol. 1, pp. 196-204, 2015.

Figure 19A:
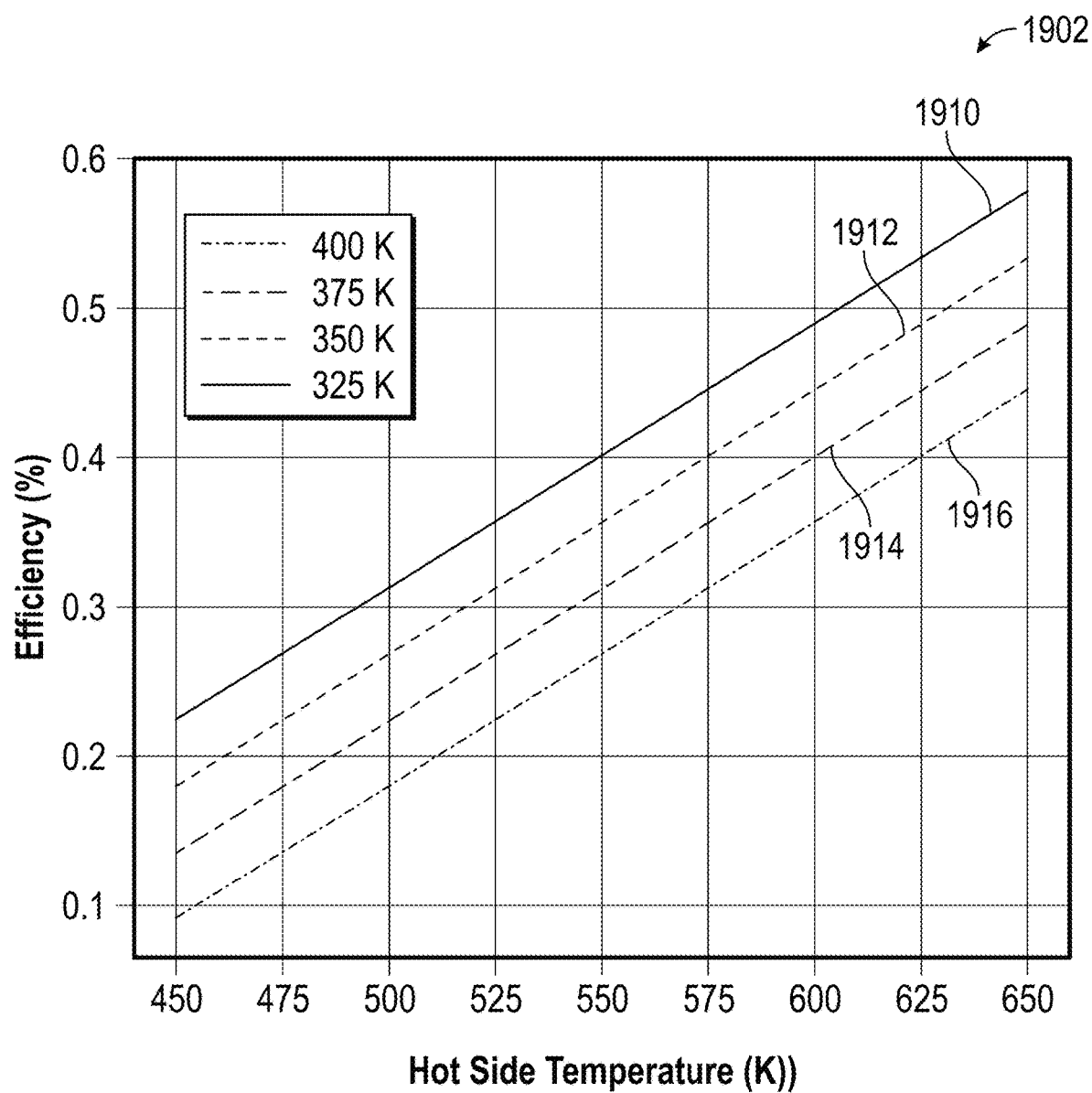
FIGS. 19A through 19C illustrate charts showing computational modeling results for a rare earth boron based ATEGs at different levels of RIC.
Figure 19B:
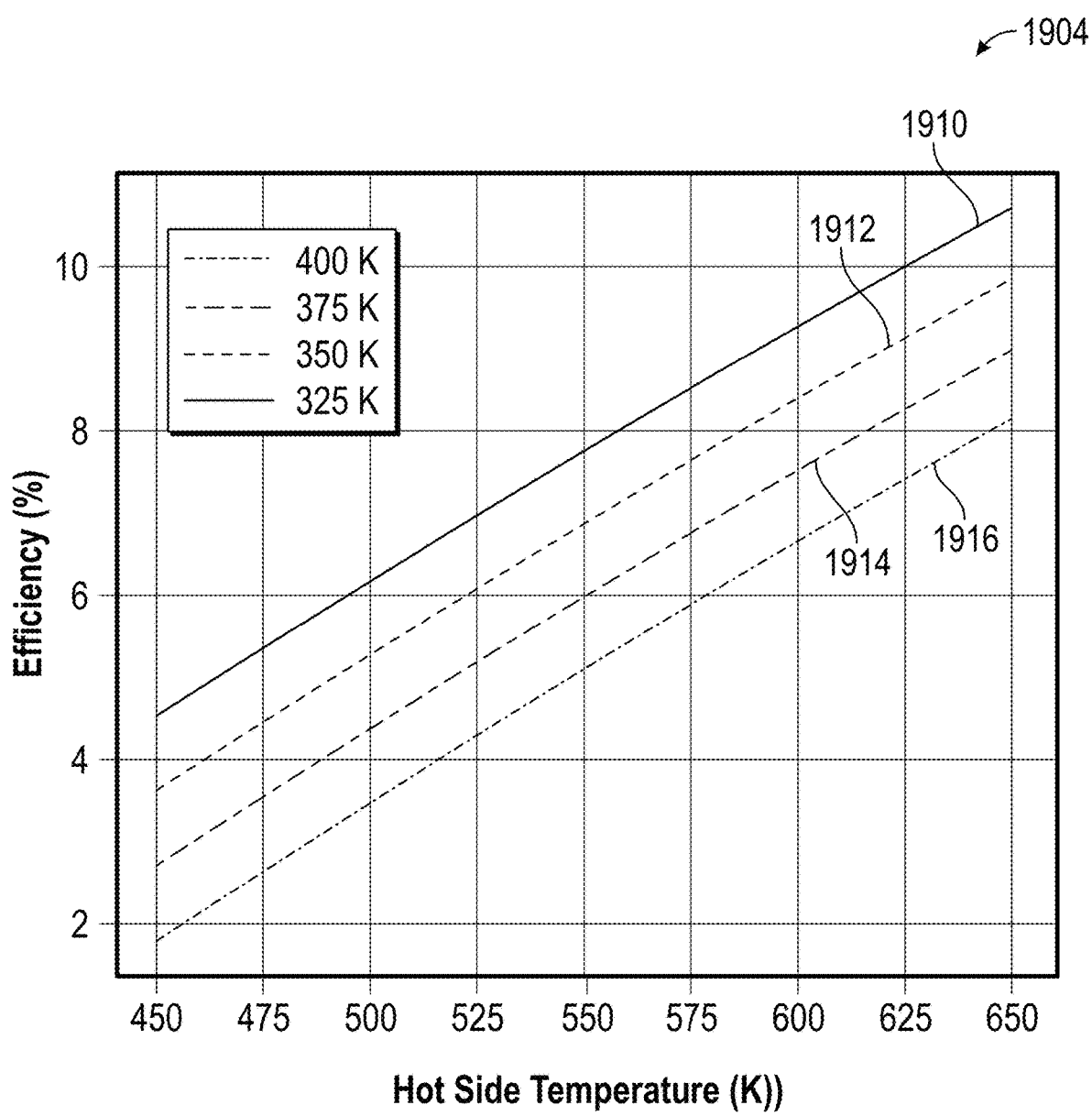
Figure 19C:
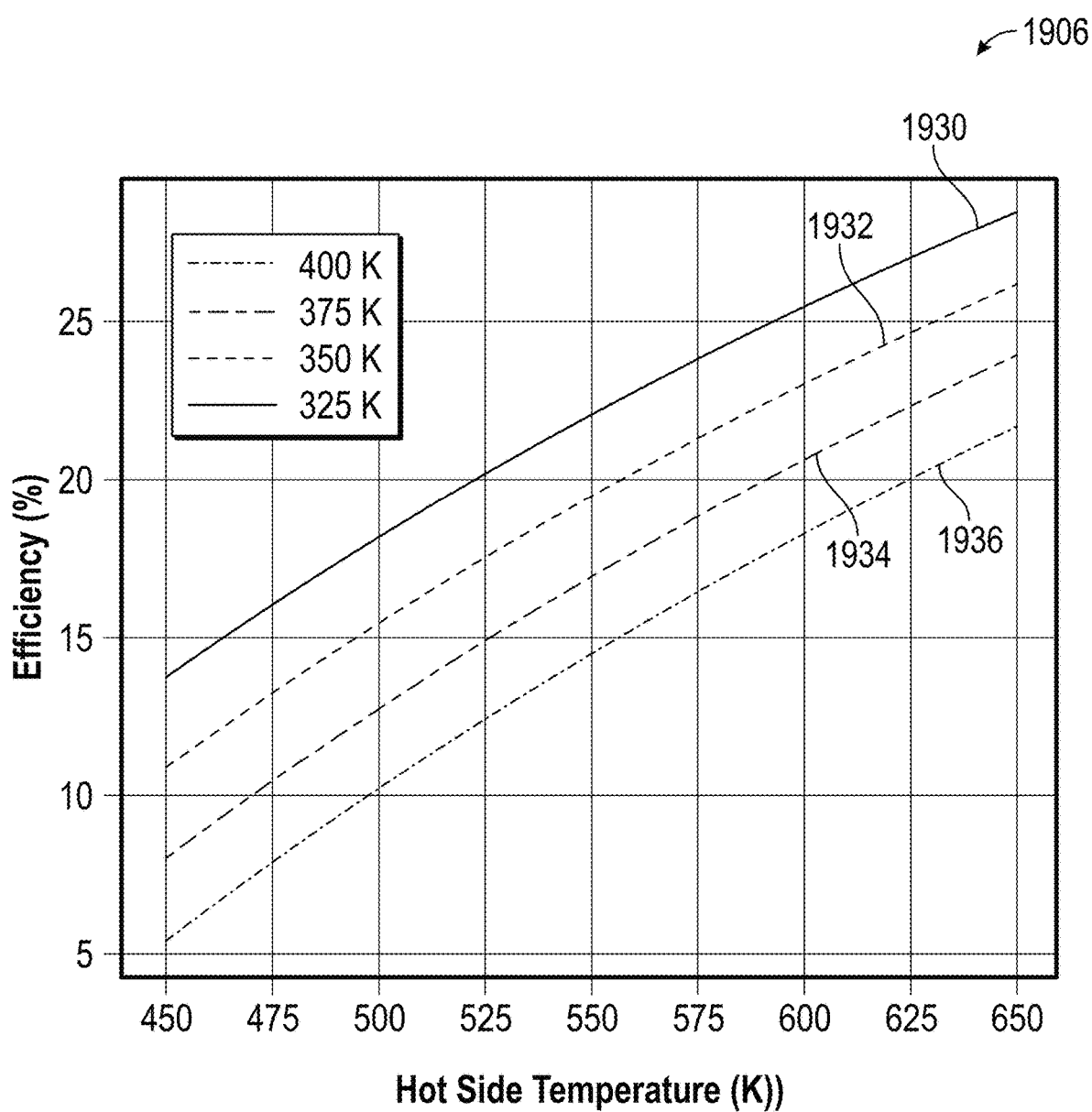

FIGS. 19A-C illustrate charts 1902, 1904, 1906 showing computational modeling results for a rare earth boron based ATEGs at different levels of RIC. Chart 1902 shows conversion efficiency of an unmodified SmB60 ATEG as a function of hot side temperature with a cold side temperature of 325 K at 1910, of 350 K at 1912, of 375 K at 1914, of 400 K at 1916. Chart 1904 shows conversion efficiency of a lightly doped SmB60 ATEG as a function of hot side temperature with a cold side temperature of 325 K at 1920, of 350 K at 1922, of 375 K at 1924, of 400 K at 1926. Chart 1906 shows conversion efficiency of a heavily doped SmB60 ATEG as a function of hot side temperature with a cold side temperature of 325 K at 1930, of 350 K at 1932, of 375 K at 1934, of 400 K at 1936. Chart 1906 shows RIC multiplier equivalent to 400 times applied to the material. Efficiencies far exceed traditional TEGs. These materials, if shown that they cannot reach the required conductivity levels to increase the ZT to the required levels for SPEAR, can still demonstrate the RICs ability to increase ZT substantially with the change in conductivity observed by the BN. If the conductivity change matches closer to the alumina samples, the conductivity should reach into efficiencies greater than 20%. As shown in FIGS. 19A-C, a simulation conducted with SmB60 with various levels of conductivity applied. As shown, the efficiency without RIC effects applied is lower than current TEG technologies. With the same change in conductivity applied to the ATEG as was observed in the KSU experiment, the efficiency increases to levels matching current technology capabilities. SmB60, from Table 2 above, as well as other REB, excel at high temperatures, which, as a result of larger temperature gradients, would increase the expected conductivity even further. The higher electrical resistance of these materials brings them closer to being insulators than the traditional thermoelectric materials. This fact may lead them to behave in a similar fashion to the alumina and BN, where RIC was observed in these insulators.

The technology behind ATEGs shows great promise in expanding upon the efficiency of current TEG technologies. This enables the SPEAR mission to maintain its very low mass and propel itself with NEP to Europa. Improving the amount of power extracted via solid state energy methods has untold scientific benefits for deep space missions.

ATEG Conversion System Conclusions

The effects of radiation induced conductivity were shown experimentally in a neutron field at KSU, and the electrical conductivity of the boron nitride did indeed change by up to 50×. Embodiments contemplate BN thin film thermoelectrics as viable ATEGs. Other boron based TEGs are likely to be greatly enhanced as well, as their electrical conductivity is often their weakness and the RIC may improve this.

SPEAR faces very unique radiation environments from its own power source as well as the different environments it may encounter. The reactor has been designed in such a way to maintain criticality at moderate temperatures. These temperatures are comparable to RTGs and contribute to its successful design as a lightweight reactor that can produce a significant amount of power due to the ATEG power conversion system.

SPEAR utilizes its geometry and radiation shield to protect the valuable payload from the reactor during operation. This was modeled to determine the expected dose rate for the CubeSats. SPEAR may also be subject to various radiation environments throughout its journey to Europa. The most prominent being the Van Allen Radiation belts as well as the powerful Jovian radiation fields. These radiation environments were studied to determine how they may affect the spacecraft as well as the CubeSats once they are deployed in Europa orbit.

Reactor Design

The SPEAR nano-reactor produces 15 kW of thermal power and utilizing the ATEG power conversion system is estimated to produce 3 kW of electrical power with a minimum conversion efficiency of 20%. This is a conservative estimate and our studies have shown the potential for up to 30% efficiency for 4500 kW of electrical power. The unique choice of materials and geometry of the reactor make it uniquely suited to produce this power in a relatively small form factor with low enriched uranium.

The underlying concept behind the reactor design is to decrease the mass by using the high efficiency ATEGs, new materials, and a custom design. With the increased efficiency of the ATEGs, the SPEAR reactor does not require extremely high operating temperatures that often accompany dynamic cycles. The conversion system was designed to be on the same temperature scale as an MMRTG, which also uses TEG conversion, and the hot and cold sides are 600 K and 350 K, respectively. This allows for lithium hydride to be used as a moderator material instead of zirconium carbide. LiH is a very effective moderator due to its low Z number constituents but is usually not considered for nuclear applications due to the low melting temperature. The SPEAR is also able to use uranium metal instead of a carbide or oxide form, which keeps design simple and reduces unnecessary mass. By taking these steps to shrink the reactor mass down as far as possible, the entire ship, propellant, and payload masses can be reduced to create small and affordable spacecraft.

Geometry Selection

The scale of reactor components was determined through trials in Monte Carlo Neutral Particle code, version six (MCNP6). The design goal was to create the smallest possible reactor to reach a criticality greater than one. Other considerations include heat pipe spacing, mass efficiency, and manufacturability. Trials in MCNP6 were most successful the closer the overall dimensions were to equal. This is to say the ratio of reactor criticality per unit volume tended to be higher when the base, width, and height were similar. The final iteration of the geometry produced the following results in MCNP6.

TABLE 3

| Control Rod State | Steady State Criticality | Standard Deviation | Total Number of Cycles | Number of Initial Cycles Discarded |
|---|---|---|---|---|
| No Insertion | 1.01437 | 0.00012 | 500 | 100 |
| Fully Inserted | 0.98793 | 0.00011 | 500 | 100 |

TABLE 3 shows MCNP6 Results for final geometry sizing.

Figure 20A:
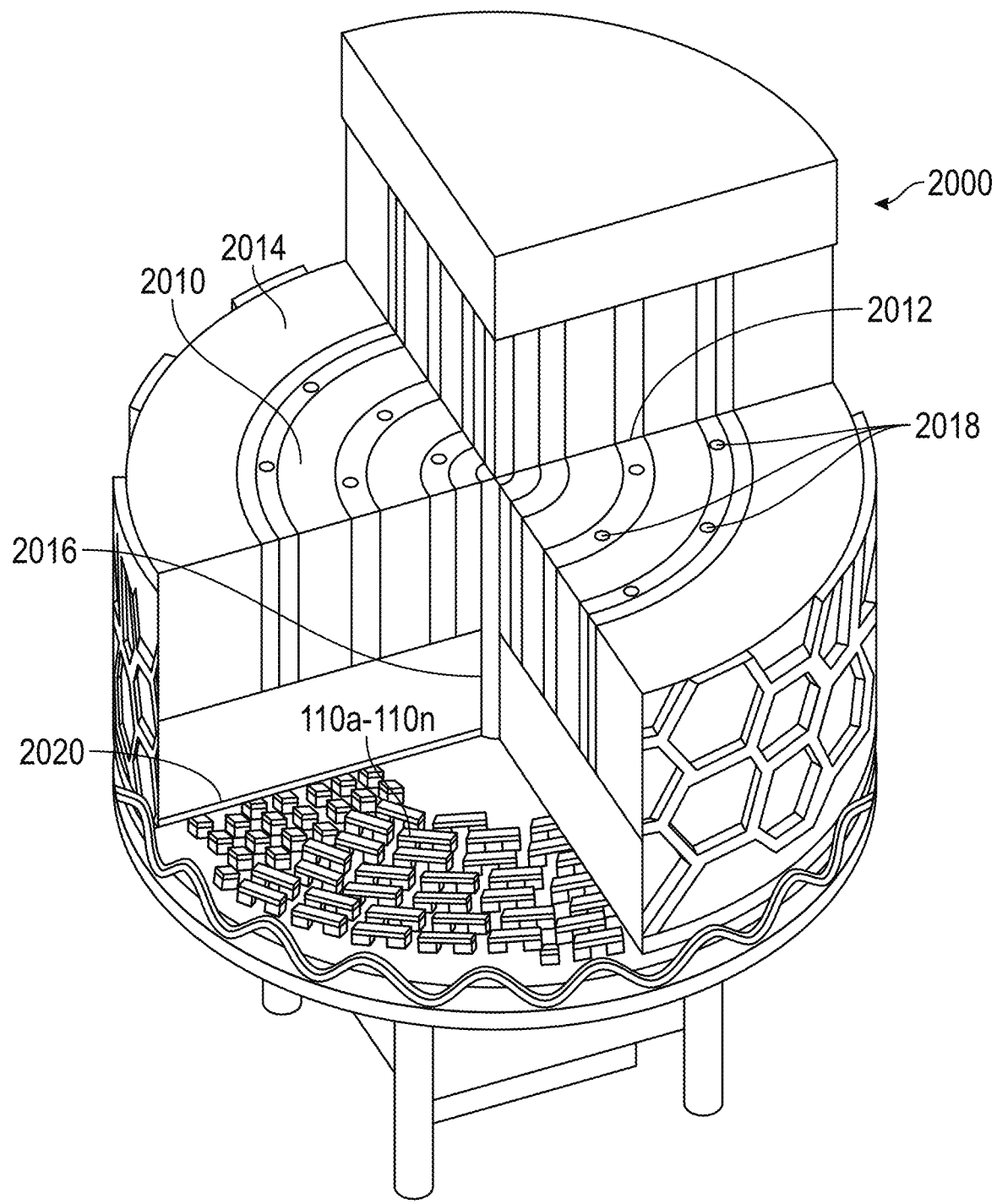
FIG. 20A illustrates a SPEAR reactor with heat pipes, moderators, reflectors, control rod, and low enriched uranium fuel.

FIG. 20A illustrates SPEAR reactor 2000, according to an exemplary embodiment. SPEAR reactor comprises heat pipes, moderators, reflectors, control rod, and low enriched uranium fuel. The hot side of the ATEGs are connected to the mercury heat plate while the cold side are connected to the heat rejection system connected to the radiators along the side of the spacecraft. FIG. 20A also shows vacuum 2000, LiH moderator 2010, uranium fuel 2012, beryllium reflector 2014, boron carbide control rod 2016, and heat pipes 2018. Note that these elements correspond to the reactor cutaway shown in FIG. 1.

FIG. 20B illustrates layout of SPEAR reactor, according to an exemplary embodiment. MCNP (Monte Carlo Neutral Particle transport code) model was used to model SPEAR reactor. LEU (Low Enriched Uranium) and LiH (Lithium Hydride) moderator are organized into concentric rings with equally spaced heat pipes embedded into the LEU. Boron control rod is located at center. Beryllium reflector encases LiH and LEU layers. The reactor core may be composed of reactor materials, such as low-enriched uranium, lithium hydride, beryllium, and boron. Everything may be contained using aluminum for its high strength to weight and resistance to neutron damage. The heat pipes may use mercury as the working fluid, matched to the planned operational temperature of the reactor of 600 K.

The reactor was organized cylindrically to promote radial symmetry of the layers of moderator, fissionable material, and heat pipes shown in FIGS. 20A-20B. This geometry of fuel/heat pipes helps reduce the presence of heat concentrations throughout the reactor. This also permits a single control rod to bring the system criticality below one when placed in the very center, the point of maximum neutron flux. A single control rod recues complexities involved with controlling the reactor and reduces failure modes that a multi-control rod system may see. This reduction of failure modes is paramount in such a mission with a relatively long operating period. Prior to activation of the reactor in LEO, the control rod may be fully inserted to prevent fission from occurring.

The limiting factor in this design is the maximum temperature reached by the uranium fuel during operation. If the fuel reaches high enough temperatures, the hot fuel in contact with the LiH moderator will cause the moderator to dissociate and may dissociate the LiH moderator and negatively affect performance. Uranium metal has a rather poor thermal conductivity, and heat pipes were required to be placed close together to avoid going over the maximum allowable temperature. Doping the fuel rings with a small amount of alloying material may allow for increased thermal conductivity, and thus fewer heat pipes. Geometric optimization of the core could also assist in this aspect, as rings are neutronically functional but potentially not ideal for heat transport.

A mass budget estimate was generated according to the material requirements and sizing of the MCNP model and is visible in TABLE 4. Assumptions disregard the negligible mass contribution of the internal thin walls for the physical separation of the reactor component materials. The mercury heat pipes contain a mixture of vapor and liquid, but for simplification were approximated to be full density. The heat pipe walls, and internal structure were also approximated to be mercury. As mercury is very dense compared to structural metals, these approximations are both overestimations.

Uranium (HEU) contains more 235U which allows for a greater fraction of neutrons to cause fission allowing for a smaller volume/mass of uranium to reach criticality. While using HEU may produce a smaller reactor, the proliferation of HEU is a primary concern for the US government and other national governments making the use of HEU a significantly more difficult for private companies to work with. There are greater security, transportation, and launch requirements with HEU reactors and material which increases program costs by millions of dollars.

Although HEU reactors may reduce launch costs because of lowered reactor mass, it is likely that a specialized and larger standby force would be needed for an HEU launch for recovery efforts to prevent HEU from falling into the wrong hands in case of an accident. While the government may have the ability to launch HEU reactors at lower costs, commercial entities may most likely by restricted to only LEU as it may be much cheaper. By some estimates, the cost reduction of commercial space companies developing a reactor would be 10% to 50% that of one developed by the government. The uranium within the SPEAR nano-reactor may be enriched to 19.75% to remain classified as LEU avoiding security and regulation issues. Producing only 15 kWt of power also reduces the size of the reactor as most NEP reactors are designed in the MWt power range which would increase launch costs and reactor complexity.

Advantages of LiH

When combined with an appropriate moderator and encased in a reflector, LEU is perfectly suitable for energy

TABLE 4

| Component | Quantity | Outer Diameter (cm) | Inner Diameter (cm) | Length (cm) | Volume (cm$^3$) | Density (g/cm$^3$) | Mass (kg) |
|---|---|---|---|---|---|---|---|
| Beryllium | 1 | 40 | 28 | 20 | 12817.70 | 1.85 | 23.71 |
| Lithium Hydride Ring 1 | 1 | 5 | 1 | 20 | 376.99 | 0.82 | 0.31 |
| Lithium Hydride Ring 2 | 1 | 14 | 8 | 20 | 2073.45 | 0.82 | 1.70 |
| Lithium Hydride Ring 3 | 1 | 23.25 | 17 | 20 | 3951.53 | 0.82 | 3.24 |
| Lithium Hydride Ring 4 | 1 | 28 | 25.75 | 20 | 1899.68 | 0.82 | 1.56 |
| Uranium Ring 1 | 1 | 8 | 5 | 20 | 612.61 | 19.1 | 11.70 |
| Uranium Ring 2 | 1 | 17 | 14 | 20 | 1460.84 | 19.1 | 27.90 |
| Uranium Ring 3 | 1 | 25.75 | 23.25 | 20 | 1924.23 | 19.1 | 36.75 |
| Mercury Heat Pipes | 22 | 1 | 0 | 32 | 25.13 | 13.56 | 7.50 |
| Beryllium Caps | 2 | 40 | 0 | 6 | 7539.82 | 1.85 | 27.90 |
| Boron Control Rod | 1 | 2 | 0 | 20 | 62.83 | 2.37 | 0.15 |
| | | | | | | Total Mass (kg) | 142.42 |
| | | | | | | Total LEU Mass (kg) | 76.36 |

TABLE 4 shows the mass budget estimate broken down by component.

Advantages of LEU

Low-Enriched Uranium (LEU) comprises of <20% U-235, with the remainder being U-238. Highly Enriched generation on scale suitable for a spacecraft the size of SPEAR with limited mass penalties. Moderators slow down neutrons emitted by the uranium, promoting additional fission. Reflector material helps keep more of the neutron material travelling through fissionable material. These two in combination allow a reactor built with LEU to reach criticality well below LEU's critical mass.

LiH was selected as the moderator due to its high hydrogen density. Hydrogen atoms are the most efficient particles for slowing down fast neutrons since both have the same mass. Other materials, such as methane, offer similar performance but are not solid at the system operating temperatures, making them harder to implement and handle. Graphite, typically used as a moderator for its high operating temperature, lacks large amounts of hydrogen. Utilizing LiH increases the amount of hydrogen but reduces the operating temperature from 4000 K for graphite down to 961 K for LiH. This reduction in operating temperature is compensated for the large increases in efficiency seen with the ATEG conversion system. LiH also has the added benefit of reducing the mass of the core as LiH is less dense than graphite.

Heat pipes may be located directly inside of the uranium fuel as that is where the heat is generated and may have the highest temperatures. Removing the heat at the source may assist in reducing temperature peaking and limit the effects of the poor thermal conductivity of the moderator.

ATEG Location

The ATEGs are located at the base of the reactor assembly. The vertical orientation of the heat pipes allows for a single heat diffuser to accept input from all the heat pipes to the top of the ATEGs. The cold side of the ATEGs may connect to another heat diffuser plate with a working fluid that transfers heat to the radiators to dissipate the heat. This radiator working fluid in conjunction with the radiators may maintain the cold side temperature of the ATEGs at 350 K.

As discussed in the previous sections, ATEGs utilizing $(n,\alpha)$ interactions require a thermal neutron source to achieve their expected efficiencies. Therefore, the ATEGs have been placed as close as possible to the reactor to maximize their exposure to the neutrons coming from the reactor. Increasing the efficiencies of these ATEGs would require increasing the flux rate from the reactor as this would increase both the ionizations observed in the ATEGs as well as increase the temperature of the reactor. ATEGs with radioisotope sources would not necessarily require close proximity to the reactor, but the reduction in heat pipe mass is an important factor in maintaining a lightweight spacecraft.

Neutron Flux from Reactor

Analyzing the neutron flux is important both for determining the efficiency of the ATEGs and for shielding design. The neutron and photon flux were determined using MCNP6. Measurements were taken at 25 cm and 350 cm from the center of the reactor. An averaged surface flux tally measured the average neutron flux through a sphere with 25 cm radius, placing the location where the surface flux tally was measured just outside the reactor surface. This value of the neutron flux is important as ATEG performance is directly dependent on the neutron flux when using a $(n,\alpha)$ ATEG. Another F2 averaged surface flux tally was taken using two circular surfaces whose area was equal to the planned shielding geometry.

Shield Design

SPEAR's shadow shield has been designed to protect the vital areas of the spacecraft from the harmful radiation that the reactor produces. The shield takes the shape of a cross to match the orientation of the CubeSat bays. This geometric configuration of the shield conforms to how the CubeSats are currently orientated for deployment at Europa. The neutron shield itself is made from tetramethylammonium borohydride (TMAB $C_4H_{16}NB$), which is a relatively light weight material that is useful as a shielding material in nuclear system. The hydrogen density within TMAB allows it to thermalize neutrons and the boron, with a naturally large neutron capture cross section, absorbs neutrons coming from the reactor. As disclosed herein, the neutron flux is reduced by four orders of magnitude.

Figure 21:
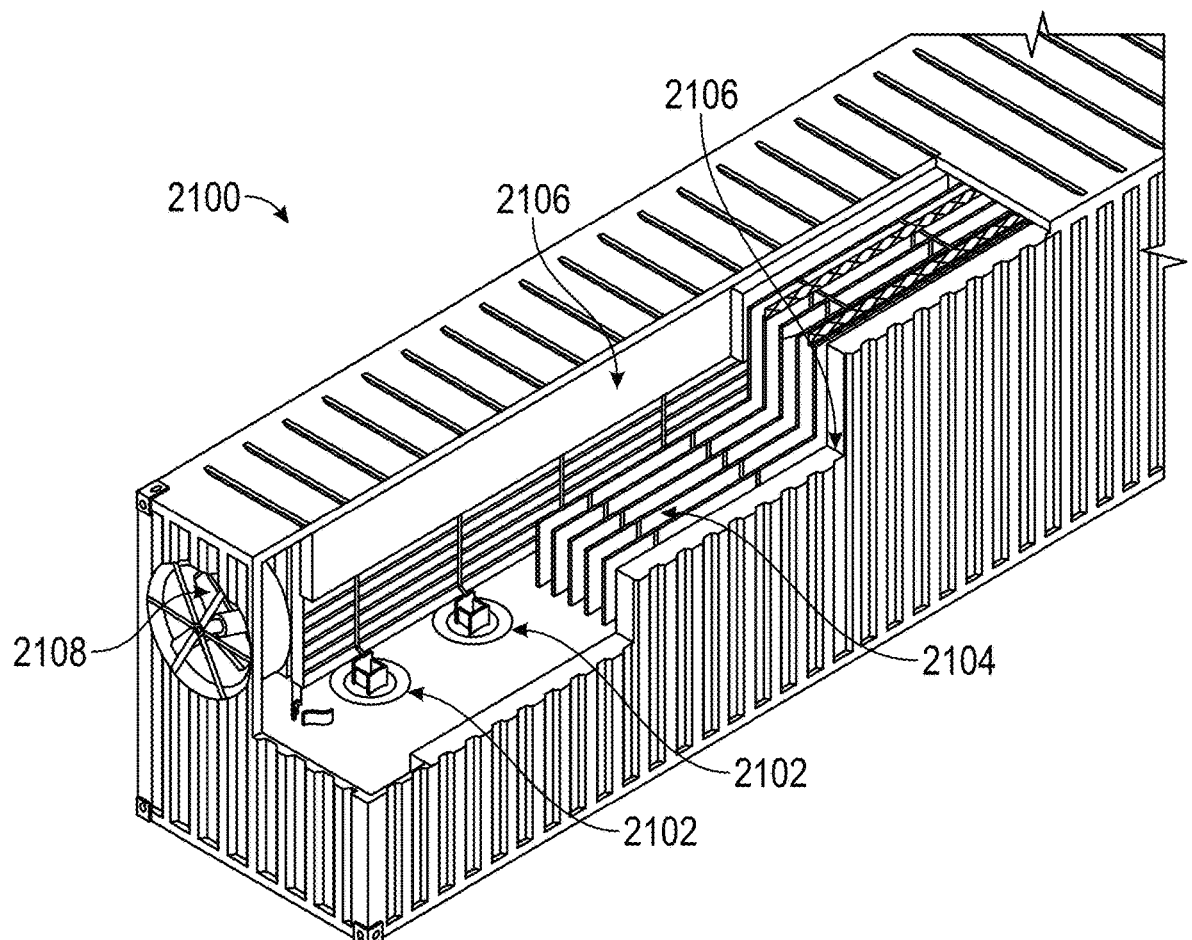
FIGS. 21-23 illustrate portable SPEAR power source.
Figure 22:
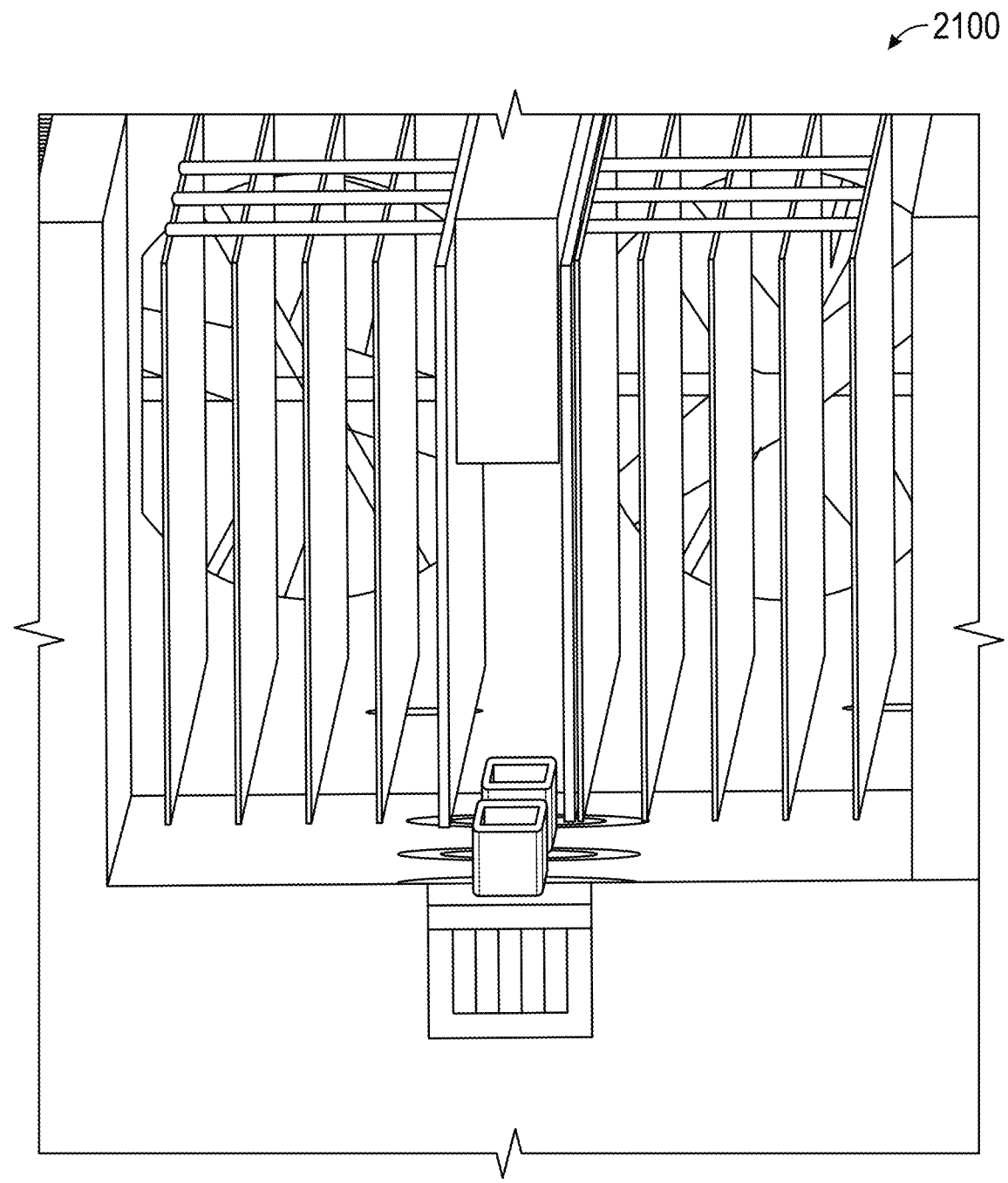
Figure 23:
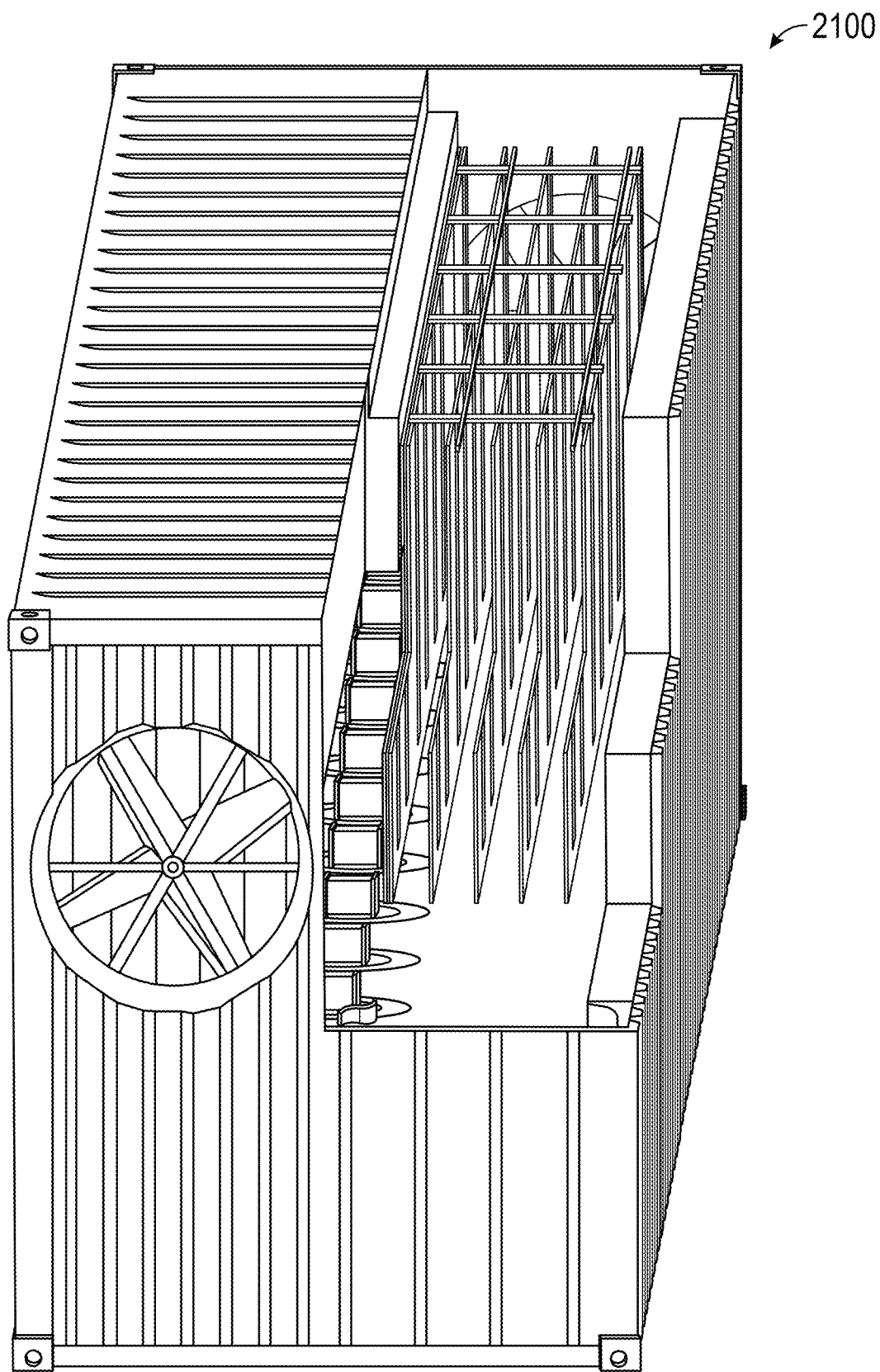
Figure 24:
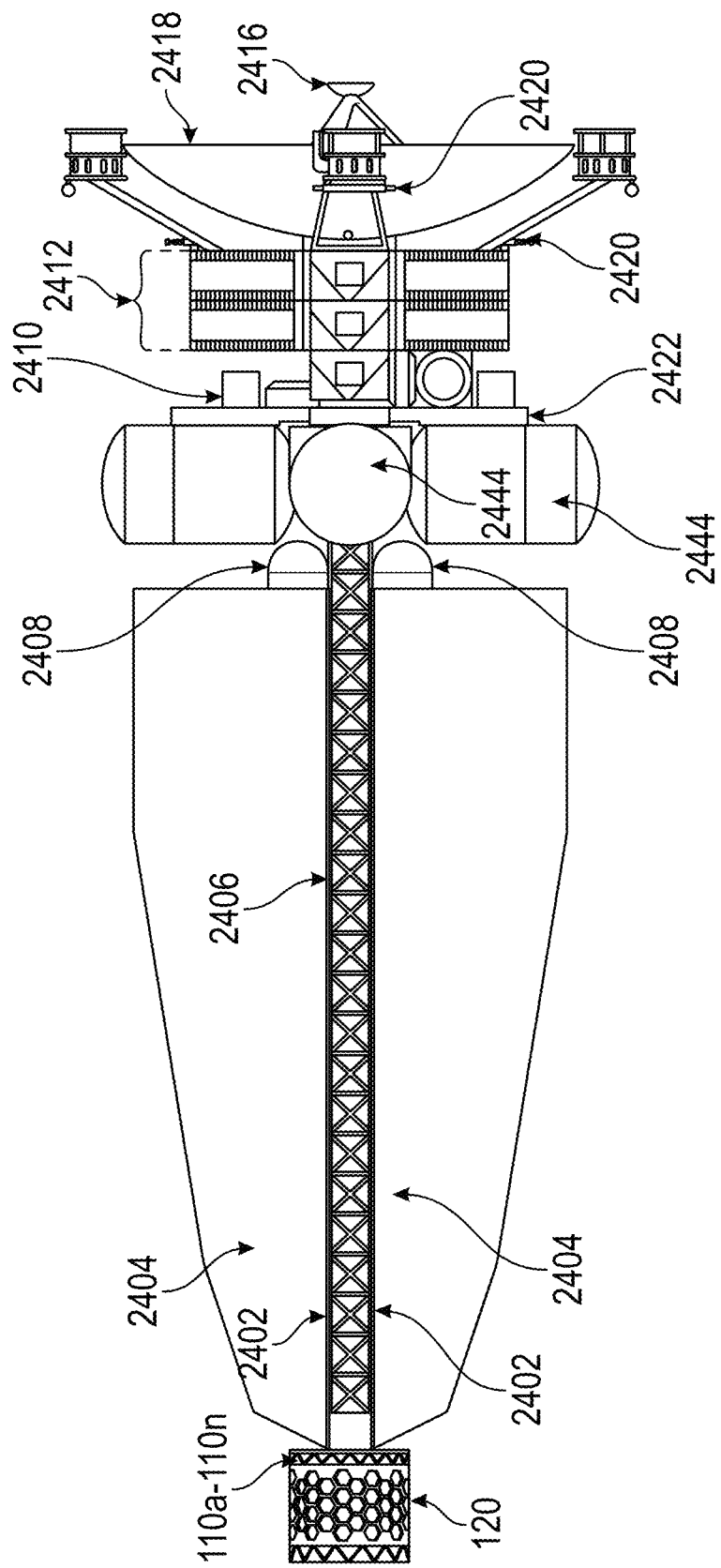
FIG. 24 illustrates SPEAR spacecraft with CubeSat swarm payload.

FIGS. 21-23 illustrate portable SPEAR power source, according to an exemplary embodiment, with 2100 indicating external housing, 2102 indicating SPEAR reactor cores, 2104 indicating radiator fins for waste heat rejection, 2106 indicating radiation shielding, and 2108 indicating fans for cooling radiator fins. FIG. 24 illustrates SPEAR spacecraft with CubeSat swarm payload. The advanced thermoelectric generators enable massive efficiency increases over traditional thermoelectric generators reaching efficiencies matching or exceeding current sterling or dynamic power systems. A lightweight and compact form factor enable SPEAR to be launched on small/medium launch vehicles allowing for much lower launch costs. SPEAR has the potential to revolutionize the accessibility to deep space for both government use and private industries in the near future.

SPEAR has been designed for extreme simplicity to reduce the number of fatal errors the system may experience on its voyage to Europa. There are no large deployable mechanisms in the design, which reduces the potential for failure within orbit significantly. The reactor is safe in nature and only produces radiation via activation of control rods to begin the nuclear fission process. This design reflects a simplistic payload of CubeSats which may be deployed at Europa. SPEAR could be modified to deliver a similarly sized payload to other locations within the solar system. Again, a system of CubeSats is preferred because of its high technology readiness level (TRL) and industry familiarity with the CubeSat form factor.

Electrical Power System

SPEAR PROBE 2400 comprises reactor and ATEGs 110a-110n. In one embodiment, reactor comprises 15 kWt reactor coupled with ATEGs 110a-110n to deliver 3 kW of electrical power. Electrical power may be applied, at least in part, to Nuclear Electric Propulsion (NEP) system. By way of example only and not by way of limitation, SPEAR is described below in connection with a mission to Europa. The following elements are labeled in FIG. 24:

110a-n: reactor
120: reflector
2402: heat pipes to radiators
2404: radiators
2406: structural truss
2408: Auxiliary propellant tanks
2444: Primary propellant tanks
2410: shielding
2422: mounting platform
2412: CubeSat deployment bays
2414: electric thrusters
2418: communications RF dish
2416: secondary RF dish
2420: mounting hardware The Swarm Probe Enabling ATEG Reactor (SPEAR) system may venture to make deep space exploration open to private industries. Several novel designs, including a nano-sized nuclear reactor and advanced thermoelectric generators (ATEGs), combine to produce one of the highest performing deep space platforms in existence. The ATEGs used to harvest power from the nano-reactor offer solid state energy production efficiencies well above current technologies. This advancement, which can be applied to a multitude of space technologies, is what drives SPEAR's potential for success. With a conservative 3 kW of electrical power, SPEAR outperforms any previous deep space power system including RTGs and solar panels (beyond Earth orbit) and contends with future nuclear systems in development. SPEAR can explore vast stretches of the solar system at fractions of the cost of traditional missions. Its compact form factor and low mass allows it to be launched on inexpensive launch vehicles, and its nuclear electric propulsion system can propel it to the far reaches of the solar system. SPEAR has been designed to include a swarm of 10 CubeSats in a 6U form factor which can be deployed at its final destination or throughout its mission. The gradual miniaturization of spacecraft into CubeSats has shown that an immense amount of high impact science can be placed in a small package. The CubeSat design is familiar to universities, private industry, and government organizations looking to test technologies and perform high impact scientific studies. Instead of being limited to Earth orbit, SPEAR can transport CubeSats millions of kilometers away allowing many new participants to explore deep space at a fraction of the cost of traditional missions. SPEAR has the capability to bring new scientific research from deep space back to Earth, pushing humanity's exploration frontier further than ever before.

One particularly exciting application for the SPEAR probe is the exploration of Jupiter's moon Europa. NASA has put a mission to explore Europa and investigate its habitability as the second highest-priority mission for the decade after the Mars 2020 mission. Its expected mission costs at the time of the survey was estimated at $4.7 billion. This mission is expected to launch sometime in the 2020's with an unknown launch date and launch vehicle. While this mission contains many science instruments, its costs and uncertainty in launch date make its future uncertain. SPEAR could transport a swarm of CubeSats to Europa for a fraction of the cost to accomplish more focused science goals. Each CubeSat may explore the Europa environment with high resolution cameras, detectors, and communications devices. With evidence of plumes erupting from Europa's surface, the primary goal of the CubeSats may be to fly through these plumes and analyze the material for evidence of extraterrestrial life. This swarm has a higher probability of intercepting plumes, maximizing the potential to discover organic molecules. The high-resolution maps generated by onboard cameras may be paramount for future missions that intend to land on the surface of Europa. At Europa, the SPEAR probe may have more power available than any other deep space probe allowing for large quantities of data to be transmitted to Earth for analysis. SPEAR has the capabilities to unravel the mysteries that Europa contains and answer some of the greatest scientific questions.

The SPEAR spacecraft is an interplanetary nuclear electric propulsion (NEP) probe designed to study the Europa environment in search of life. This ultra-lightweight probe is meant to significantly reduce mission costs for interplanetary space missions and open deep space exploration to private industries by using a majority of commercial off the shelf (COTS) components as well as a low enriched uranium (LEU) reactor. With a total mass of 1517 kg, SPEAR can be launched at a relatively cheap price compared to most interplanetary missions. With a comparatively small form factor, it may be able to ride share with another primary payload or launch on board a small dedicated rocket. SPEAR's current design utilizes limited moving parts to reduce failure modes when being deployed in space and has been designed to fit inside the Minotaur IV launch vehicle. Modifications including extendable booms and radiators can be used to further decrease the size of SPEAR to fit within even smaller launch vehicles or be compact enough for a ride share mission.

Earth Orbit and Spiral Transfer

After launching into orbit around Earth at 700 km, SPEAR may engage the reactor control rods to begin the fission process. The reactor may not produce radiation until this process begins, reducing radiation contamination concerns on Earth. Once activated, the SPEAR may produce 15 kW of thermal power and is estimated to produce 3 kW of electrical power from the ATEG system. SPEAR may then utilize its NEP system to conduct a spiral transfer maneuver to escape Earth.

Orbiting around Earth and conducting the spiral transfer maneuver presents the maximum thermal load SPEAR may see due to the Earth's albedo, infrared signature, and proximity to the sun. To reduce the thermal load on the spacecraft, SPEAR may be slowly rotated around its long axis to ensure even heating of the spacecraft. During the initial phases with such close proximity to Earth, ground controllers are able to use this time to study the performance of the reactor and collect any important science data transmitted by SPEAR before interplanetary transit begins.

After leaving Earth's influence, SPEAR may continue on its interplanetary cruise phase to Jupiter. Cost models include staff to monitor navigation to make minor course corrections on its journey to the Jovian system, but subsequent efforts may be made to introduce an artificial intelligence-based guidance system. This may limit the need for a full staff to be present during the somewhat long transit times, and human intervention may only be necessary in the rare event that something unexpected happens to the craft while flying through space.

Interplanetary Cruise Phase

During this time, the reactor may continue to operate at full power for the NEP system while its other systems enter a hibernation mode. Vital components of the spacecraft are protected from radiation coming from the reactor via a radiation shadow shield near the propellant tanks at the rear section of the craft. This shadow shield is designed to protect the most sensitive components of the spacecraft including electronics and the CubeSat payloads. To minimize mass, the shield does not protect some structural components and is positioned far away from the reactor with substantial Xe propellant in the tanks also blocking some of radiation. By not fully encapsulating the reactor with shielding, hundreds of kilograms of dead mass can be saved, and the radiation harmlessly dispersed into space. SPEAR may still be subjected to galactic cosmic rays (GCRs) and any solar particle events (SPE) that may occur, but the included shield and radiation hardened electronics may assist with longevity during transit.

Europa/Jovian System Operations

Upon arrival at Europa, SPEAR may begin studying the Europa environment. SPEAR may contain only a few scientific instruments on the main craft, as most of the payload mass has been allocated to the CubeSats. Nonetheless, SPEAR may monitor the surface of Europa for several Europa days (approximately 3.5 Earth Days) to investigate changes to the surface and gather preliminary data.

Each CubeSat can apply a small amount of delta-v to change its orbital inclination and cover the maximum amount of area about the main orbit of the SPEAR craft. CubeSats may be launched two at a time from opposite sides of the SPEAR probe to minimize attitude changes imparted on SPEAR. Each CubeSat may be equipped with several science instruments to monitor the Europa environment and include a mechanism to capture and analyze plume particles. The purpose of these 10 CubeSats is to maximize the probability of intercepting a plume particle. With all the CubeSats deployed, a wide swathe of the moon is covered due to the CubeSats weaving up and down relative to the main craft. After deployment of all the CubeSats, SPEAR transitions into a "mother-ship" mode for transmitting, receiving, and processing data. Sections below detail the RF and laser options for beaming power to the CubeSats to keep them operating for the duration of the mission. The SPEAR craft processes the information gathered from the CubeSats and may intermittently transmit data back to Earth with its high gain antenna. Each CubeSat is expected to operate for roughly 30 days before reaching its maximum dose of ionizing radiation. After the 30 day CubeSat operation is complete and all scientific data has been transmitted to Earth, SPEAR's health and systems may be assessed to determine any additional missions that can be completed before succumbing to radiation. So long as systems remain functional, the swarm can gather visual data on the surface, scan for life, or monitor the local area.

The design for the nano-reactor involves lightweight moderator materials and low enriched uranium (LEU) to minimize launch costs and allow for private ownership of the nanoreactor. A small array of batteries may be used to operate SPEAR may its nano-reactor is not operating. This should only occur during initial operations around Earth and any situations where the reactor needs to be powered down.

Figure 25:
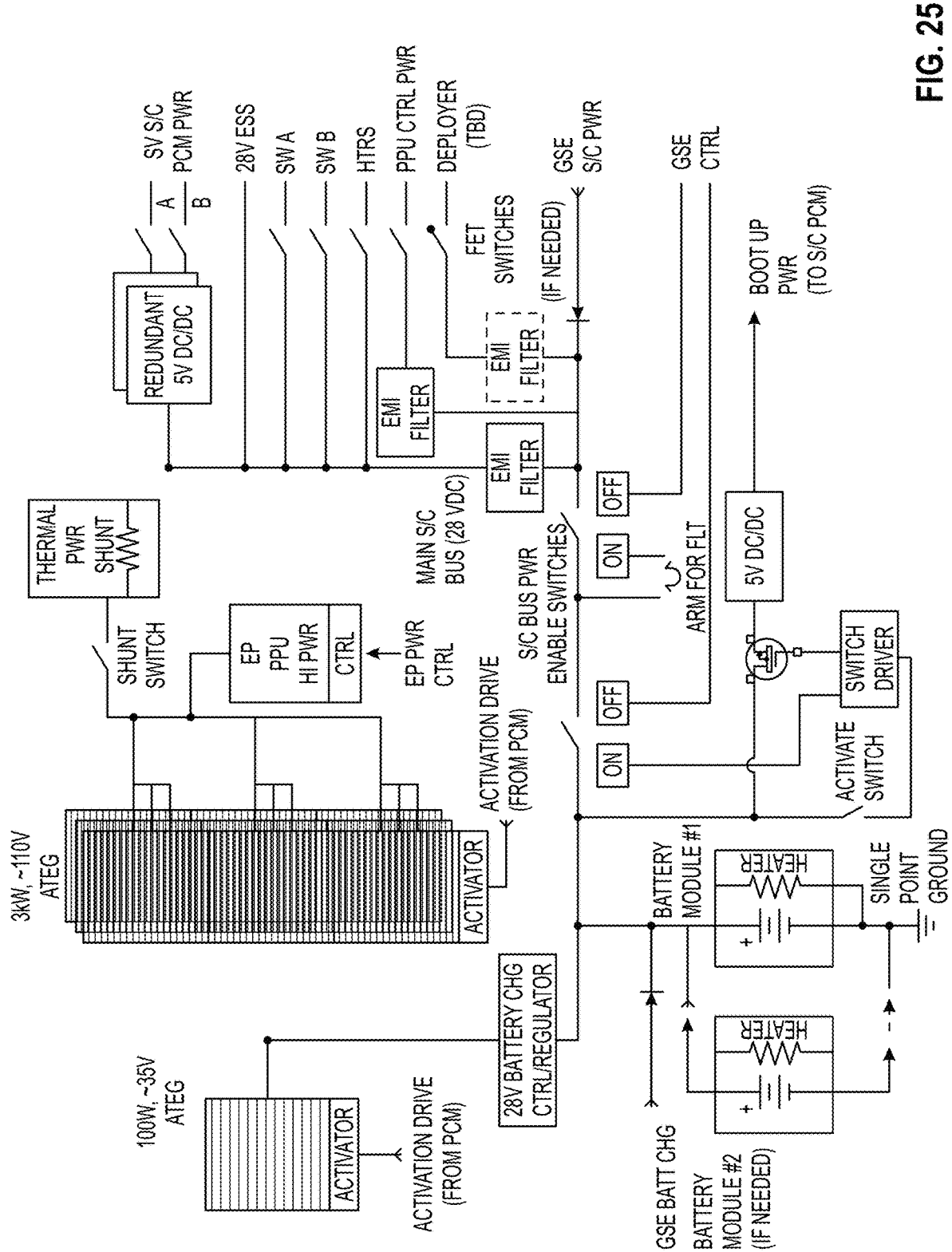
FIG. 25 illustrates electrical subsystem of SPEAR.

FIG. 25 illustrates electrical subsystem of SPEAR, according to an exemplary embodiment showing an electrical diagram of an example ATEG power production circuit capable of providing power and charging batteries. Batteries allow for reactor start up and contain enough power for 24 hours of emergency operation for ground crews. The SPEAR Electrical Power System (EPS) utilizes the available energy from an ATEG capable of being configured to supply two individual and unique loads. The EPS has two buses; a 3 kWe source of relatively-high DC voltage to serve as the energy source for the NASA developed NEXT-C electric propulsion (EP) system; and a separate ~100 We source of power at a voltage suitable as input to a battery charge controller and regulator supplying power to the 28 VDC SPEAR spacecraft bus. Although SPEAR is shown and described as comprising two ATEG units, embodiments contemplate SPEAR having two independent ATEG sources. Embodiments further contemplate (and desirable from mass, volume and thermal management perspectives) to provide both high power and low power taps from a single ATEG unit.

Acronyms for SPEAR EPS Functional Architecture Diagram

Acronym Definition

ATEG Advanced Thermoelectric Generator Batt Battery
CHG Charge
Ctrl Control
EMI Electromagnetic Interference
EP Electric Propulsion
Ess Essential (Bus)
FET Field Effect Transistor
FLT Flight
GSE Ground Support Equipment
Htrs Heaters
kW Kilowatt
PCM Power (Subsystem) Control Module
PPU Power Processing Unit (for EP)
PWR Power
S/C Spacecraft
Sw Switched (Power Bus)
TBD To Be Determined
W Watt

TABLE 5

|  | 100 $W_e$ | 3 $kW_e$ |
| --- | --- | --- |
| Current (A) | 2.856 | 27.094 |
| Voltage (V) | 35.017 | 110.722 |
| Efficiency (%) | ~30% | ~35.5% |
| Number of ATEG couples (#) | 859 | 2,715 |
| ATBG mass (kg) | 0.235 | 1.696 |
| Configuration | All in series | All in series |

TABLE 5 illustrates 100 $W_e$ and 3 $kW_e$ ATEG units not accounting for thermal shielding and other heat conversion hardware, raw thermoelectric material only.

The EPS is designed to start up upon SPEAR deployment from the launch vehicle. An Activate Switch may close upon deployment, which would switch on main spacecraft bus power and energize a field effect transistor (FET) switch to also connect 28V main bus power to a "startup" 5 VDC converter. The 5V output of that startup converter may supply system boot up power to the Power Controller Module (PCM), a microprocessor (for simplicity not explicitly shown in the figure) that then would execute the software instructions necessary to turn on the rest of the power system and to configure additional switched 28V buses to supply power to the rest of the spacecraft in a planned, controlled manner. Some of those switched buses may need to be electromagnetic interference (EMI) filtered to ensure that electromagnetic noise originating from a component on one bus would not propagate to devices on other spacecraft buses.

Upon successful startup and self-checkout of the rest of the systems on the spacecraft, all initially performed with power supplied by Lithium-Ion battery modules, the ATEG may be activated. In at least one exemplary embodiment, the batteries have been sized to operate for a total of 48 hours, with a storage capacity of 108 Ah.

The activation may be via a motor driver signal from the PCM. Once active, the ATEG may source power to maintain the 28V main bus indefinitely, to charge the battery (to be available as a future contingency power source), as well as to source high power for the EP power programming unit (PPU), and thus the Hall Effect Thruster. Once activated, the ATEG may operate continuously. During those times when the EP is not consuming power, the 3 kWe ATEG may need to have its power dissipated via a shunt resistor to prevent the ATEG from overheating. Connections to that shunt, as well as control of the EP PPU, may also be managed by the PCM.

Prior to launch, control of the spacecraft and charge management of the battery may be possible via Ground Support Equipment (GSE). The GSE may have the ability to set main bus switches in a "safe for launch" OFF state. Additional protection from inadvertent startup is provided by an "Arm for Flight" cable jumper that prevents any power from the battery being applied to the spacecraft 28V bus until the jumper is installed. Operationally, installation of that jumper would take place as one of the last activities during close-out operations just prior to launch. The GSE may also have the ability to source 28V spacecraft power via an independent connection, which would only be used to check out spacecraft components prior to launch. The PCM is inhibited from initiating its post-deployment activation sequence by A-B lockout switches on the 5V power that are intended to be used to operate the PCM only post-deployment.

At Europa, SPEAR may have an unparalleled quantity of power for numerous applications including science operations, powering of CubeSats, and communications with Earth. Each CubeSat may be powered via radio frequency (RF) charging from the SPEAR Probe. This may minimize the complexity of the CubeSats and their systems to ensure mission success. The RF charging as attractive to charge the CubeSats due to the fact that a high power RF system is already installed and used for communications. Additionally, changing the reactor power levels can be complicated due to fission product buildup and the presence of neutron poisons in the reactor, so it is recommended that the power production stay as constant as possible during the entire mission. As it may already be generating 3 kW of continuous electric power and has an RF system on board, using the RF communications system for charging seems a viable method for keeping masses low.

Another feature of the ATEG system is to provide the desired voltage and current to different systems without changing the production profile of the power system. Various voltages and currents can be achieved by simply changing which TEG feet are in series or parallel when the units are installed. Utilizing this unique feature, the power processing can be more efficient as the need to convert between high voltage, high current, and other sources can be reduced significantly. In the diagram of FIG. 25, a 100 W subsystem power source is wired separately from the main ATEG array and operates at 35V. The main array has more units connected in series, which brings the total power up to 3 kW and 110V.

Communications

A prominent feature of SPEAR is its high gain antenna situated on the bottom of the spacecraft. This antenna may be used to communicate with Earth throughout its mission. Instead of powering down the reactor at Europa to minimize thermal requirements, SPEAR may utilize the power from the reactor to beam power to the CubeSats and send science data back to Earth. The 1.5 meter diameter dish is comparatively smaller than other spacecraft such as Juno or Cassini with 2.5 meter and 4 meter diameter dishes respectively. The high gain antenna size is restricted by the fairing size of the launch vehicle, so a 1.5 meter dish was chosen to offer high performance with minimal form factor. Assuming SPEAR broadcasts at similar frequencies to Juno on the fifth and sixth channel of the deep space network, the respective gains from SPEAR should be 33 dB and 32.5 dB. When Jupiter is at its farthest location from Earth, the received power should be −136.41 dBm and at its closest location the received power should be −133.02 dBm. These values appear to be between that of the Juno probe and Cassini with received powers of −129 dB m and −137.87 dBm. The large amount of power available for communications makes it possible to reduce the size of the antenna dish, allowing SPEAR to fit within smaller payload fairings compared to other deep space missions.

SPEAR may not only need to communicate with Earth, but also relay information to and from the 10 deployed CubeSats. S-band receivers, transmitters, and patch antennas may be utilized to communicate with SPEAR. Most communications should occur between SPEAR and individual CubeSats, but the s-band communications architecture allows for high data rate communication between satellites. This could prove useful if SPEAR needs to send information to CubeSats that are not reachable for direct communication.

Propulsion

Interplanetary NEP systems have no flight heritage, but many systems have been proposed for missions to the outer solar system. Most of these systems involve dynamic power generation systems for their high conversion efficiency. The Jupiter Icy Moons Orbiter (JIMO) was a 100 kW NEP spacecraft slated to explore three of Jupiter's moons including Europa with a Brayton power conversion system. This massive spacecraft was eventually cancelled, and the concept never fully tested. The SPEAR probe leverages similar concepts from the JIMO mission, including the use of a high specific impulse ion thruster. SPEAR may utilize the NASA Evolutionary Xenon Thruster (NEXT), or a system like it, for its primary propulsion. A NEXT thruster is capable of 4,190 s of specific impulse with projected total throughput of over 730 kg of propellant. These parameters make the NEXT thruster more than ideal for the 10 year mission lifetime.

Thermal Control

Positioned on the long axis of the SPEAR probe are four large radiators. These radiators are used to dissipate the 12 kW of waste heat from the reactor. Heat pipes are used to transfer heat from the back of the ATEGs out to these radiators. The use of four radiators results in a less effective design due to the radiators shining on each other, but due to the truncated space of the launcher fairing it was necessary to achieve the required surface area. The possibility remains to deploy radiators or extend a telescoping boom for the main shaft, but this concept of extending the boom would introduce moving parts and potential modes of failure. For the current design, the extra radiator mass was acceptable but other missions may be willing or able to use a more optimized system.

A detailed analysis of the radiator system was conducted to determine the maximum heat rejection while maintaining a low mass system. With a complex trajectory, SPEAR's radiators need to reject heat as SPEAR orbits Earth, on its journey to the Jovian system, and while SPEAR is at Europa. A carbon-based material with heat pipes containing water as the working fluid were chosen. Analysis was performed on the trajectory SPEAR would take to the Jovian system to determine the optimal size of the radiators to maintain a steady 350 K cold side for the ATEGs.

Attitude Determination and Control System

As SPEAR travels through space, it may utilize its electric propulsion system to perform various attitude control maneuvers as well as a suite of attitude control thrusters. Four reaction control wheels may be used to control SPEAR's attitude in orbit as well. These systems were chosen as they primarily rely on power generated by the spacecraft instead of additional propellant systems to minimize mass and complexity, and the SPEAR craft has a surplus of electrical power. With the excess power available at Europa, the reaction wheels may be used to the fullest extent when attitude changes are required by the SPEAR Probe. The reaction wheels are better suited for use around Europa as this is when the system may be at its lightest. Around Earth orbit, the spacecraft may rely more on its thrusters to provide gradual attitude changes in addition to the reaction control wheels. Several sun sensors, star trackers, and magnetometers may be used to determine the attitude of the spacecraft. The star trackers may be especially useful while navigating to Europa and other deep space locations. Several of these components are already commercially available and rated to moderate radiation levels, which may minimize the amount of shielding required in the Europa environment.

Reaction wheels and attitude control thrusters may be used around Earth and at the Jovian system to desaturate reaction wheels as well as perform attitude correction maneuvers. In deep space, a majority of the attitude control may be accomplished through the use of the primary electric propulsion system. This system may make gradual changes to the spacecraft's attitude for any corrections in its trajectory.

The monopropellant control system in at least one exemplary embodiment comprises 22 kg of monopropellant and 12 thrusters to provide agile maneuvering of the spacecraft and in deep space. This may be used for ADCS corrections or maneuvers that are too quick for the reaction wheels and passive system to support.

Command and Data Handling

SPEAR may use the previously demonstrated and highly reliable RAD750 computer to process information and handle data. This computer has fantastic heritage with numerous deep space missions. Included in the numerous probes that use the RAD750 computer is Juno, which is currently orbiting Jupiter. The RAD750 is capable of withstanding up to 1 Mrad total ionizing dose (TID), which is ideal for surviving the radiation from the reactor and the radiation environment from Europa. While the RAD750 comes in 3 U and 6 U form factors, it was not considered for the CubeSat computers because of its mass and power consumption.

Payload

The primary payload aboard SPEAR is the array of 10 CubeSats that may be delivered to Europa and form a swarm around the moon. Contrary to a satellite constellation in which all pieces remain in a constant position relative to each other, the CubeSats may be deployed at different times to create a dynamic weaving pattern for maximum surface coverage. Thus, the cluster of satellites may more resemble a swarm of insects than a constellation of stars. In at least one embodiment, each CubeSat has a mass of 7 kg for a total payload mass of 70 kg. More specifically, each CubeSat may contain a multispectral camera, Raman spectrometer, lab-on-a-chip for chirality detection and imaging via a microscope. The latter two may be used to detect the composition of Europa's plumes and detect for any extraterrestrial life. CubeSat scientific payload and other systems may be described in more detail in another section.

The secondary payload for Europa mission may comprise several observational instruments to observe Europa's surface. With the primary payload looking for signs of life, SPEAR may assume a primarily observational role of Europa. Reuse of several systems from other deep space probes is considered advantageous to reduce development costs. The JunoCam produced by Malin Space Science Systems may be used onboard the SPEAR probe to image the moon's surface. This technology has already proven itself onboard the Juno spacecraft and is capable of withstanding the extreme Jovian environment. Infrared cameras may also be included on the SPEAR probe monitor the temperature levels of Europa's vast ice sheet. SPEAR may also closely monitor the perturbations experienced by the CubeSats during its mission and relay any useful science data about anomalies around Jupiter. The SPEAR probe may also contain two sets of the same life detection instruments as the CubeSats contain for mission redundancy. After the primary CubeSat mission is over, mission extensions may be investigated based on the health of the spacecraft and propellant remaining.

Mass Model

A detailed mass model of the SPEAR system was created to estimate the initial wet mass of the system. SPEAR's original mass estimate was 1100 kg, but, after in-depth analysis the total mass increased to just over 1,500 kg. A major factor in this increase was due to the size of the radiator system and the fact that 4 radiators were required to fit in the launch fairing. A cold side temperature of 350 K was originally chosen to provide a comparison to the MMRTG systems available now. However, increasing this temperature would decrease the radiator area but decrease ATEG efficiencies. Additionally, expandable booms or a larger fairing would allow for more efficient radiator operation and reduced total mass.

TABLE 6

| Section | Quantity | Mass/Unit (kg) | Mass (kg) |
|---|---|---|---|
| Reactor system | | | 134.9 |
| Core | 1 | 58.4* | 58.4 |
| Fuel | 1 | 76.3* | 76.3 |
| Control rods and actuators | 1 | 0.2* | 0.2 |
| Shield | | | 32.0 |
| Main power conversion | | | 11.9 |
| Heat exchanger (hot) | 1 | 7.5* | 7.5 |
| ATEGs | 1 | 4.4* | 4.4 |
| Thermal control system | | | 200 |
| Radiators | 4 | 50.0* | 200.0 |
| Primary propulsion system and Electrical Bus | | | 59.5 |
| Thruster cluster | 1 | 13.5 [14] | 13.5 |
| PPU | 1 | 40.0 [14] | 40.0 |
| Mount | 1 | 6.0 [14] | 6.0 |
| Secondary propulsion system | | | 35.1 |
| Thruster Clusters | 1 | 17.5 [15] | 17.5 |
| Reaction wheels | 4 | 4.4 [16] | 17.6 |
| Auxiliary power system | | | 22 |
| Batteries, Drivers | 1 | 12.0* | 12.0 |
| Cables | 1 | 10.0* | 10.0 |
| Structures | | | 24.8 |
| Main truss | 1 | 20.8* | 20.8 |
| Tank and payload dispenser support | 4 | 0.8* | 3.1 |
| Secondary Structures | 1 | 0.9* | 0.9 |
| Avionics | | | 25.7 |
| Star trackers | 2 | 0.35 [17] | 0.7 |
| High-gain antenna | 1 | 15.0* | 15.0 |
| Structures and shield | 1 | 10.0* | 10.0 |
| Tankage | | | 41.4 |
| Mission propellant tanks | 4 | 6.4* | 26.4 |
| Feed lines and valves | 1 | 10.0* | 10.0 |
| Insulation | 1 | 5.0* | 5.0 |

TABLE 6-continued

| Section | Quantity | Mass/Unit (kg) | Mass (kg) |
|---|---|---|---|
| Payload and provisions | | | 103.09 |
| Board computer | 2 | 0.15 [12] | 0.29 |
| Telecommunication system | 1 | 16.8* | 16.8 |
| Payload dispenser | 10 | 1.6 [18] [19] | 16 |
| Cubesats | 10 | 7.0* | 70.0 |
| Mission propellant mass | | | 804.3 |
| Reaction control propellant | | | 22.0 |

TABLE 6 shows a mass budget of the SPEAR probe, according to an exemplary embodiment. Another significant contributor to the overall mass is the amount of Xe propellant onboard the system. With improvements to the trajectory, the total mass of the system can be significantly decreased. As the ATEG system is further investigated and the possible efficiency for this system more refined there could be vast improvements upon the mass. A 20% ATEG efficiency was used as conservative estimate, and improvements to this decrease the amount of heat that needs to be rejected and increases the power available to the propulsion system, which would translate to a higher specific impulse. This higher specific impulse would correspond to a drop in the total propellant required for the mission.

Reference in the foregoing specification to "one embodiment", "an embodiment", or "some embodiments" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments have been shown and described, it may be understood that various changes and modifications to the foregoing embodiments may become apparent to those skilled in the art without departing from the spirit and scope of the present invention.

What is claimed is:

1. A thermoelectric converter comprising:
   a thermoelectric generator;
   a radiation source;
   wherein the thermoelectric generator includes a hot source, a cold source, n-type material, and p-type material;
   wherein the n-type material and the p-type material are each a thermoelectric material chosen from: materials containing boron, rare earth borides, boron carbide, or nickel oxide;
   wherein, a figure of merit of the thermoelectric material is between 0.5 and 2.5 and,
   wherein the radiation source captures neutrons for producing ionizing emission using stable isotopes or fissile atoms and emits ionizing radiation that changes electrical conductivity, thermal conductivity, or Seebeck coefficient of the n-type material or the p-type material.

2. The thermoelectric converter of claim 1 wherein the radiation source is a reactor.

3. The thermoelectric converter of claim 1 wherein the n-type material and the p-type material are not metal.

4. The thermoelectric converter of claim 1 wherein the changes to electrical conductivity, thermal conductivity or Seebeck coefficient of the n-type material or the p-type material take place over a specific range of temperatures.

5. The thermoelectric converter of claim 1 wherein the radiation source uses alpha, beta, gamma, x-ray, or neutronic radiation.

6. The thermoelectric converter of claim 1 wherein the stable isotopes are boron or lithium.

* * * * *